(12) United States Patent
Moorthy et al.

(10) Patent No.: US 12,360,626 B2
(45) Date of Patent: Jul. 15, 2025

(54) LOAD CONTROL DEVICE HAVING A CAPACITIVE TOUCH SURFACE

(71) Applicant: Lutron Technology Company LLC, Coopersburg, PA (US)

(72) Inventors: Dinesh Sundara Moorthy, Allentown, PA (US); Christoph Porwol, Boynton Beach, FL (US); James P. Steiner, Royersford, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 18/641,946

(22) Filed: Apr. 22, 2024

(65) Prior Publication Data

US 2024/0272739 A1     Aug. 15, 2024

Related U.S. Application Data

(63) Continuation of application No. 18/210,191, filed on Jun. 15, 2023, now Pat. No. 11,983,356, which is a
(Continued)

(51) Int. Cl.
*G06F 3/041* (2006.01)
*G06F 3/044* (2006.01)

(52) U.S. Cl.
CPC ............ *G06F 3/0416* (2013.01); *G06F 3/044* (2013.01)

(58) Field of Classification Search
CPC ...... G06F 3/0416; G06F 3/044; G06F 3/0443; H05B 39/041; H05B 45/10; H05B 45/20;
(Continued)

(56) References Cited

U.S. PATENT DOCUMENTS 6,169,377 B1   1/2001   Bryde et al.
6,380,696 B1   4/2002   Sembhi et al.
(Continued)

FOREIGN PATENT DOCUMENTS

CN   101185055 A   5/2008
CN   101536611 A   9/2009
(Continued)

OTHER PUBLICATIONS

Gao Shenyong et al., "Design of a Capacitive Touch Input Module", Journal of Hangzhou University of Electronic Science and Technology, Issue 02,, Apr. 15, 2009.
(Continued)

*Primary Examiner* — Ryan A Lubit
(74) *Attorney, Agent, or Firm* — Flaster Greenberg P.C

(57) ABSTRACT

A control device configured for use in a load control system to control one or more electrical loads may comprise an actuation member having a front surface defining a touch sensitive surface configured to detect a point actuation along at least a portion of the front surface, a touch sensitive circuit, and a control circuit. The touch sensitive device may comprise one or more receiving capacitive touch pads located behind the actuation member and arranged in a linear array adjacent to the touch sensitive surface. The control circuit may be configured to operate using different filtering techniques based on the state/mode of the control device and/or based on whether the positions of point actuations by a user along the touch sensitive surface indicate a fine tune or gross adjustment by the user. For example, the control circuit may generate an output signal using light/no filtering or using heavy filtering.

26 Claims, 23 Drawing Sheets

Related U.S. Application Data continuation of application No. 17/557,435, filed on Dec. 21, 2021, now Pat. No. 11,703,974, which is a continuation of application No. 17/005,209, filed on Aug. 27, 2020, now Pat. No. 11,237,665.

(60) Provisional application No. 63/028,968, filed on May 22, 2020, provisional application No. 62/892,469, filed on Aug. 27, 2019.

(58) Field of Classification Search
CPC .... H05B 47/10; H05B 47/175; H05B 47/196; H05B 47/1965; H05B 47/1985; H05K 1/162; H05K 2201/10151; H03K 17/9622; H03K 2217/960755; G08C 17/00; Y02B 20/00
See application file for complete search history.

(56) References Cited

U.S. PATENT DOCUMENTS

| | | | |
|---|---|---|---|
| 7,190,125 B2 | 3/2007 | McDonough et al. | |
| 7,566,995 B2 | 7/2009 | Altonen et al. | |
| 7,608,948 B2 | 10/2009 | Nearhoof et al. | |
| 7,791,595 B2 | 9/2010 | Altonen et al. | |
| 7,834,856 B2 | 11/2010 | Grinshpoon et al. | |
| 7,855,543 B2 | 12/2010 | Newman et al. | |
| 8,330,638 B2 | 12/2012 | Altonen et al. | |
| 8,664,881 B2 | 3/2014 | Salvestrini et al. | |
| 8,803,432 B2 | 8/2014 | Hausman | |
| 9,524,633 B2 | 12/2016 | McDonald et al. | |
| 10,109,181 B2 | 10/2018 | Dimberg et al. | |
| 2006/0055679 A1* | 3/2006 | Grinshpoon | H05B 39/085 345/173 |
| 2006/0267953 A1 | 11/2006 | Peterson et al. | |
| 2007/0289860 A1 | 12/2007 | Newman et al. | |
| 2007/0291010 A1* | 12/2007 | Altonen | H05B 39/085 345/173 |
| 2010/0182270 A1* | 7/2010 | Caliskan | G06F 3/0416 345/173 |
| 2011/0018611 A1 | 1/2011 | Newman et al. | |
| 2011/0050647 A1 | 3/2011 | Lee et al. | |
| 2011/0121752 A1* | 5/2011 | Newman, Jr. | H05B 39/048 315/291 |
| 2013/0027331 A1 | 1/2013 | Chang et al. | |
| 2013/0257315 A1* | 10/2013 | Restrepo | H05B 47/10 307/112 |
| 2014/0184536 A1 | 7/2014 | Huang | |
| 2014/0239844 A1* | 8/2014 | Bruwer | H05B 45/20 315/292 |
| 2014/0267129 A1 | 9/2014 | Rebeschi et al. | |
| 2014/0268628 A1 | 9/2014 | Mann et al. | |
| 2015/0022224 A1 | 1/2015 | Ruusunen et al. | |
| 2015/0062074 A1 | 3/2015 | Wang et al. | |
| 2015/0301646 A1 | 10/2015 | Caldwell et al. | |
| 2015/0349567 A1* | 12/2015 | Weightman | G11C 7/04 307/52 |
| 2015/0381617 A1 | 12/2015 | Jung et al. | |
| 2016/0004347 A1 | 1/2016 | Lin et al. | |
| 2016/0217108 A1* | 7/2016 | Parker | G06F 3/1423 |
| 2017/0075490 A1 | 3/2017 | Liu et al. | |
| 2017/0105176 A1* | 4/2017 | Finnegan | H04W 4/80 |
| 2017/0278383 A1 | 9/2017 | Dimberg et al. | |
| 2017/0280533 A1 | 9/2017 | Dimberg et al. | |
| 2017/0280534 A1* | 9/2017 | Dimberg | H05B 47/175 |
| 2017/0371485 A1 | 12/2017 | Ohi | |
| 2018/0088733 A1* | 3/2018 | Syed | G06F 3/04166 |
| 2019/0079632 A1 | 3/2019 | He et al. | |
| 2019/0212846 A1 | 7/2019 | Nathan et al. | |
| 2019/0235684 A1* | 8/2019 | Zhang | H05K 1/18 |
| 2019/0286321 A1 | 9/2019 | Kim et al. | |
| 2020/0285342 A1 | 9/2020 | Hungerford et al. | |
| 2020/0382120 A1 | 12/2020 | Brogan et al. | |
| 2021/0064178 A1 | 3/2021 | Steiner et al. | |
| 2022/0007476 A1 | 1/2022 | Casey et al. | |

FOREIGN PATENT DOCUMENTS

| | | |
|---|---|---|
| CN | 103327679 A | 9/2013 |
| CN | 104049789 A | 9/2014 |
| CN | 104169851 A | 11/2014 |
| CN | 109076687 A | 12/2018 |

OTHER PUBLICATIONS

Journal of Hangzhou University of Electronic Science and Technology, Issue 02.

* cited by examiner

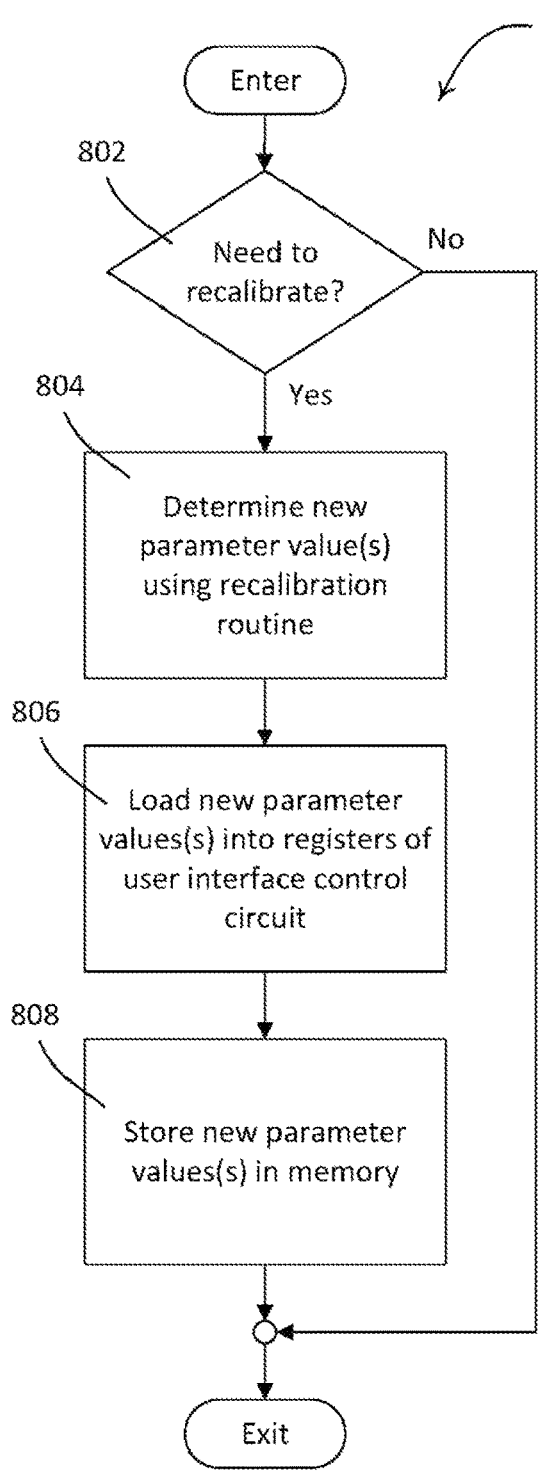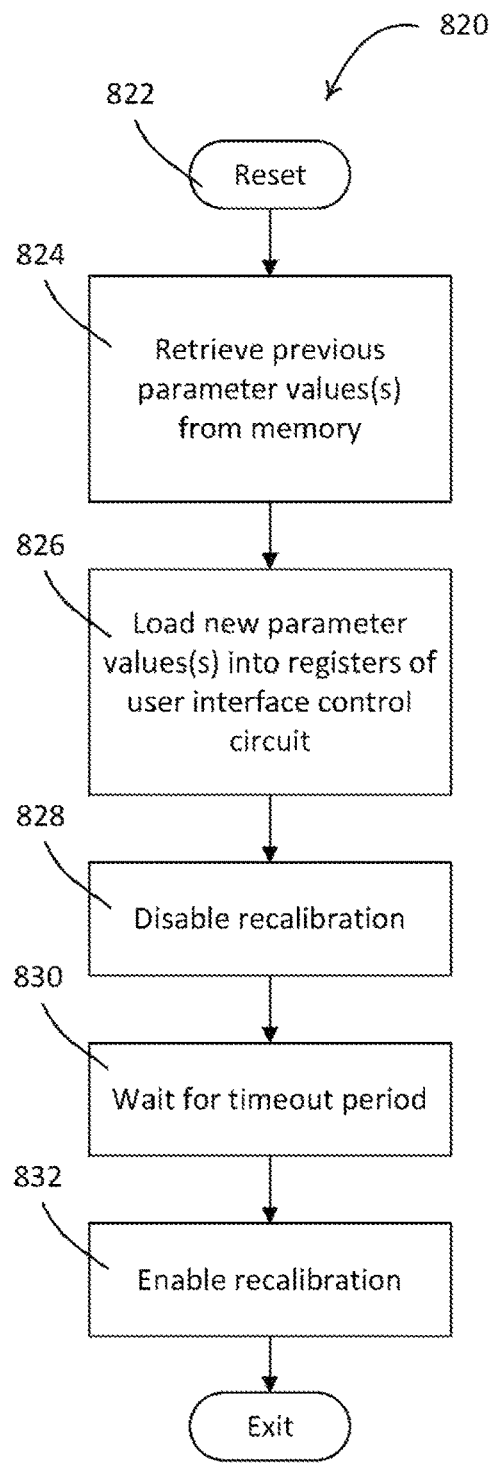
FIG. 18A
FIG. 18B

LOAD CONTROL DEVICE HAVING A CAPACITIVE TOUCH SURFACE

CROSS-REFERENCE TO RELATED APPLICATIONS

This application is a continuation of U.S. Non-Provisional patent application Ser. No. 18/210,191, filed Jun. 15, 2023, which is a continuation of U.S. Non-Provisional patent application Ser. No. 17/557,435, filed Dec. 21, 2021, which is a continuation of U.S. Non-Provisional patent application Ser. No. 17/005,209, filed Aug. 27, 2020, which claims the benefit of U.S. Provisional Patent Application No. 63/028,968, filed May 22, 2020, and U.S. Provisional Patent Application No. 62/892,469, filed Aug. 27, 2019, the contents of which are incorporated herein by reference in their entirety.

BACKGROUND

A load control system may include one or more electrical loads that a user may wish to control via a single load control device. These electrical loads may include, for example, lighting loads, heating, ventilation, and air conditioning (HVAC) units, motorized window treatment or projection screens, humidity control units, audio systems or amplifiers, Internet of Things (IoT) devices, and/or the like. The electrical loads may have advanced features. For example, a lighting load may be controlled to emit light of varying intensities and/or colors in response to a user command. The amount of power delivered to the electrical loads may be adjusted to an absolute level or by a relative amount. Multiple electrical loads may be manipulated such that one or more presets or scenes (e.g., combinations of particular lighting conditions, temperature settings, speaker volume, and/or the like) may be created, and a user may desire the ability to browse through the presets or scenes, and activate one that fits a particular occasion. With a traditional load control device such as a mechanical toggle switch, a user will not able to perform any of the aforementioned functions, let alone performing multiple of them through one device.

The insufficiencies of traditional load control devices arise at least in part from the actuation mechanism utilized in those devices. More specifically, traditional load control devices are typically only capable of responding to simple user actions such as moving a lever or pushing a button. As such, the number and/or types of control that may be applied through a load control device is limited. To meet the demand of advanced electrical loads, there is a need to employ alternative user interface technologies such as those capable of detecting human gestures and translating the gestures into control data (e.g., control signals) for controlling the electrical loads. These technologies may expand the capacity of a load control device, while at the same time enhancing its usability and aesthetic appeal, for example.

A traditional load control device may also lack the capacity to provide visual feedback to a user about the operation of the load control device and/or the electrical loads controlled by the load control devices. Such capacity is an important aspect of user experience in an advanced load control system where a user may be able to manipulate multiple operating parameters of an electrical load or to control multiple electrical loads via a single control device. Provision of feedback in those environments can keep the user informed about the state and/or mode of the control device and electrical loads, and may help the user navigate through the various functionalities of the control device.

SUMMARY

A control device configured for use in a load control system to control one or more electrical loads external to the control device may comprise an actuation member having a front surface defining a touch sensitive surface (e.g., a capacitive touch surface) configured to detect a point actuation along at least a portion of the front surface, a touch sensitive circuit, and a control circuit. The touch sensitive device may comprise one or more receiving capacitive touch pads located behind the actuation member and arranged in a linear array adjacent to the touch sensitive surface. The control circuit may be configured to determine a position of the point actuation along the touch sensitive surface in response to the linear array of receiving capacitive touch pads. The control circuit may be configured to operate using different filtering techniques based on the state of the control device (e.g., whether the device is in an active touch mode or an inactive touch mode) and/or based on whether the positions of the point actuations along the touch sensitive surface indicate a fine tune or gross adjustment by the user. For example, the control circuit may generate an output signal using a first filtering technique (e.g., light or no filtering) or using a second filtering technique (e.g., heavy filtering). In some examples, the first filtering technique includes a debouncing algorithm having a first variable, and the second filtering technique includes the debouncing algorithm having the first variable.

The control circuit may be configured to determine not to use the first filtering technique to generate the output signal when the change in positions of touch actuations is equal to or less than a threshold (e.g., a signal-change threshold). For example, the control device may determine that the change in position of point actuations along the touch sensitive surface is less than or equal to the threshold, and generate the output signal using the second filtering technique based on the determination that the change in positions of point actuations falls is less than or equal to the threshold. Further, the control device may be configured to generate the output signal using the second filtering technique in response to a lack of detections of touch actuations by the touch sensitive device.

The output signal may indicate the position of a touch actuation along the touch sensitive surface and may be used to control an amount of power delivered to the one or more electrical loads based on the position of the touch actuation. For example, the control device may include a load control circuit that is configured to control the amount of power delivered to the one or more electrical loads based on the output signal. Alternatively or additionally, the control device may include a communication circuit that is configured to transmit (e.g., wirelessly transmit) a message including a command for controlling the one or more electrical loads based on the output signal.

The control circuit may be configured to place a receiving capacitive touch pad into an active state, for example, when the location of a touch actuation along the touch sensitive surface is adjacent the receiving capacitive touch pad. The control circuit may be configured to place the receiving capacitive touch pad into an inactive state, for example, when there is an absence of a touch actuation at the location of the touch sensitive surface that is adjacent the receiving capacitive touch pad. The control circuit may be configured to use the filtering technique with a first variable when at least one of the receiving capacitive touch pads are in the active state, and be configured to use the filtering technique with a second variable when none of the receiving capacitive touch pads are in the active state.

The control circuit may be configured to operate in an active touch mode when at least one of the receiving capacitive touch pads are in the active state, and operate in an inactive touch mode when all of the receiving capacitive touch pads are in the inactive state.

The control circuit may be configured to perform a recalibration routine for the touch sensitive device. In some examples, during the recalibration routine, the control circuit may be configured to determine one or more parameter values for the touch sensitive device, configured the touch sensitive device with the new parameter values, and store the new parameters value into memory. The control circuit may be configured to perform the recalibration routine in response to detecting a change in the internal temperature of the control device when in an inactive mode. The control circuit may be configured to disable a recalibration routine when the control circuit is in the active touch mode. After resetting, the control circuit may be configured to retrieve the stored parameter values from the memory and configure the touch sensitive device with the stored parameter values, for example, instead of performing the recalibration routine.

The control circuit may be configured to disable a recalibration routine when the control circuit is in the active touch mode, and enable the recalibration routine when the control circuit is in the inactive touch mode. In some examples, when the control circuit is in active touch mode, the control circuit may be configured to measure an internal temperature of the control device, determine one or more new parameter values for the touch sensitive device based on the internal temperature, and configure the touch sensitive device using the one or more new parameter values. Further, in examples, when the control circuit is in active touch mode, the control circuit may be configured to perform the recalibration routine in response to detecting a change in the internal temperature of the control device.

The touch sensitive device of the control device may be configured to detect the touch actuation along the touch sensitive surface by detecting a change in capacitance of one or more of the receiving capacitive touch pads. The control circuit may be configured to detect a change in the capacitances of a number of the receiving capacitive touch pads. The control circuit may be configured to ignore the touch actuation when the number of receiving capacitive touch pads having a change in their respective capacitance exceeds a threshold.

In some examples, the control circuit is configured to determine a position of the touch actuation along the touch sensitive surface using the output signal when an indication of a capacitance of at least one of the receiving capacitive touch pads exceeds a lower threshold and when the indication of the capacitance of all of the receiving capacitive touch pads does not exceed an upper threshold. The indication of the capacitance of a capacitive touch pad may be a receive signal received from the capacitive touch pad or a change in the count of the capacitive touch pad. The control may be is configured to ignore touch actuations along the touch sensitive surface when the indication of the capacitance of one or more receiving capacitive touch pads exceeds the upper threshold.

BRIEF DESCRIPTION OF THE DRAWINGS

FIG. 18A is a flowchart of an example procedure that may be executed by a control circuit of the load control device to recalibrate the parameter values of a touch sensitive device.

FIG. 18B is a flowchart of an example procedure that may be executed by a control circuit of the load control device to retrieve the parameter values of a touch sensitive device.

DETAILED DESCRIPTION

Figure 1:
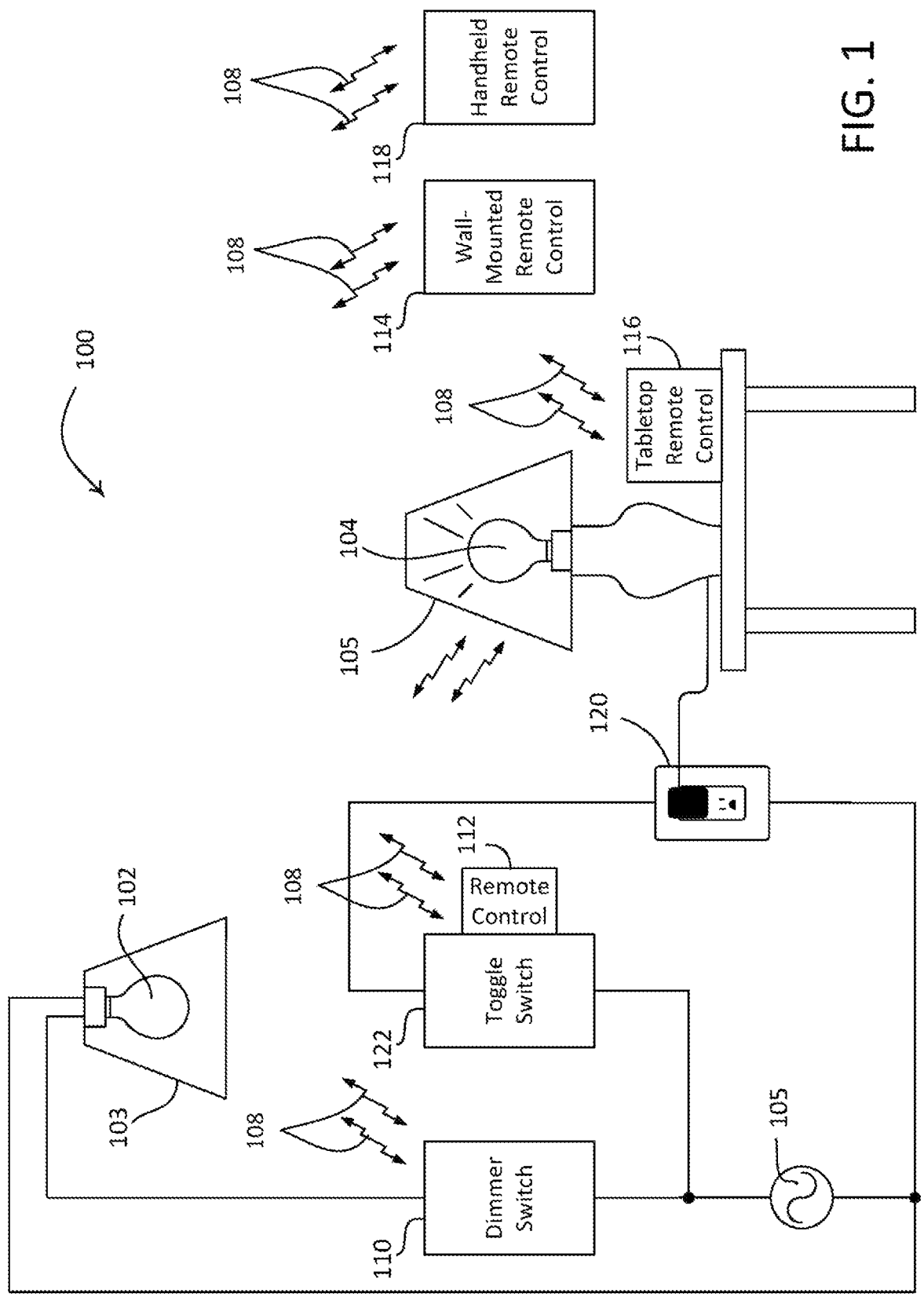
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads (e.g., and/or other electrical loads) according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads (e.g., so as to control an intensity level of the lighting loads 102, 104 between a low-end intensity level $L_{LE}$ and a high-end intensity level $L_{HE}$). The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104 (e.g., a preset may be associated with one or more predetermined settings of the lighting loads such as an intensity level of the lighting loads and/or a color of the lighting loads). The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a winter treatment device control mode (e.g., for controlling one or more shades), and/or the like.

One or more characteristics of the control device and/or the lighting load 102, 104 described herein may be customized via an advanced programming mode (APM). Such characteristics may include, for example, an intensity level associated with a preset, a fade-on/fade-off time, enablement/disablement of visual indicators, a low-end trim (e.g., a minimum intensity level to which the lighting load 102, 104 may be set by the control device), a high-end trim (e.g., a maximum intensity level to which the lighting load 102, 104 may be set by the control device), and/or the like. Examples of an advanced programming mode for a wall-mounted load control device can be found in U.S. Pat. No. 7,190,125, issued Mar. 13, 2007, entitled PROGRAMMABLE WALLBOX DIMMER, the entire disclosure of which is hereby incorporated by reference. The control device may be manipulated to enter the advanced programming mode in various ways. For instance, the control device may be moved into the advanced programming mode via a press-and-hold or a double-tap applied to a front area of the control device. Ways to activate the advanced programming mode for a control device will be described in greater detail below.

The control device described herein may be, for example, a dimmer switch 110, a retrofit remote control device 112, a wall-mounted control device 114, a tabletop remote control device 116, and/or a handheld remote control device 118, as shown in FIG. 1. The dimmer switch 110 may be configured to be mounted to a standard electrical wallbox (e.g., via a yoke) and be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail with reference to FIG. 13, and in commonly-assigned U.S. Pat. No. 8,664,881, issued Mar. 4, 2014, entitled TWO-WIRE DIMMER SWITCH FOR LOW-POWER LOADS, the entire disclosure of which is hereby incorporated by reference.

The retrofit remote control device 112 may be configured to be mounted to a mechanical switch (e.g., a toggle switch 122) that may be pre-existing in the lighting control system 100. Such a retrofit solution may provide energy savings and/or advanced control features, for example without requiring significant electrical re-wiring and/or without requiring the replacement of existing mechanical switches.

As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternatively, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, the entire disclosure of which is hereby incorporated by reference.

It should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity level of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a setpoint temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
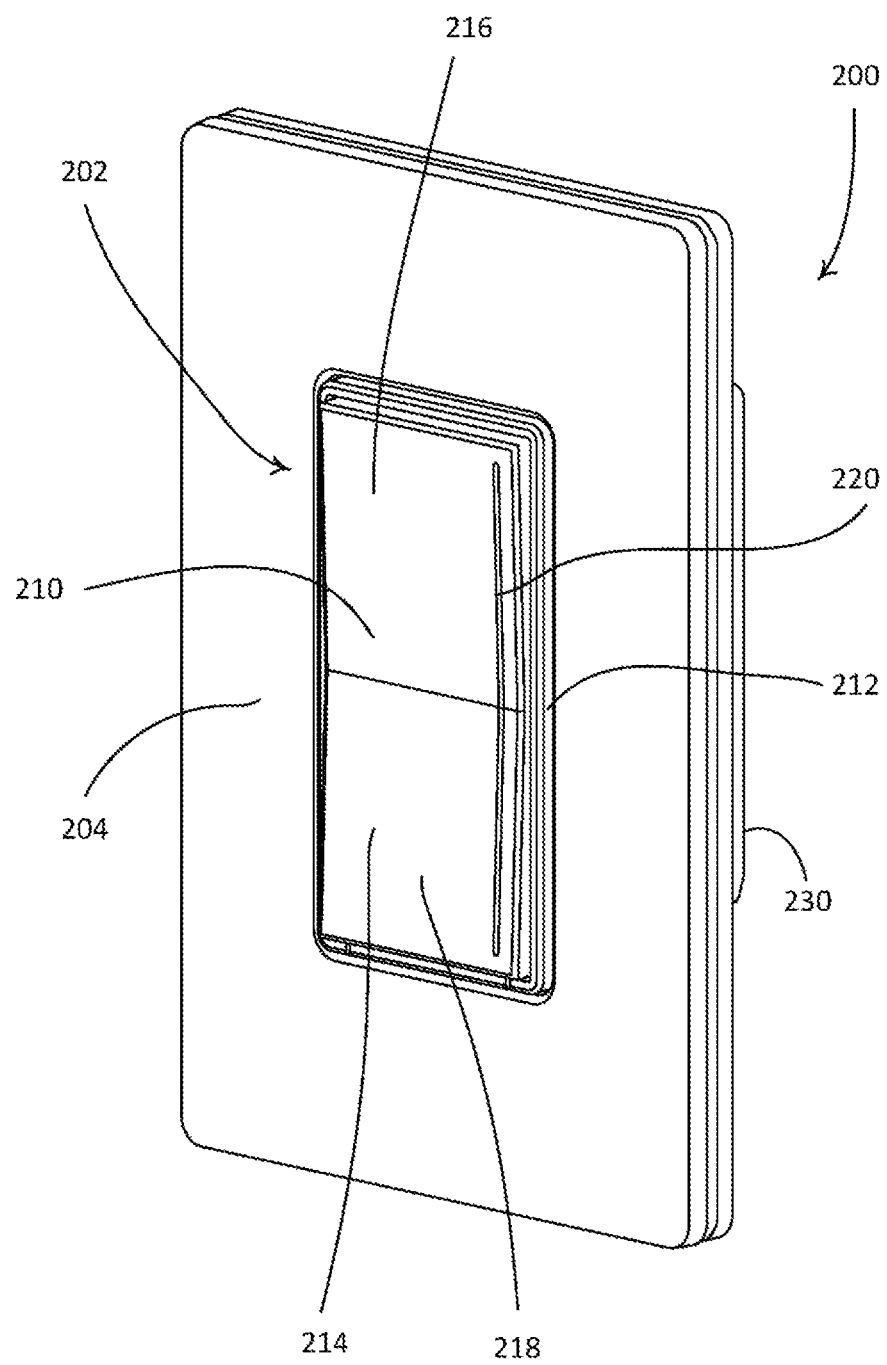
FIG. 2 is a perspective view of an example control device that may be deployed as a dimmer switch and/or a remote control device of the load control system illustrated in FIG. 1.
Figure 3:
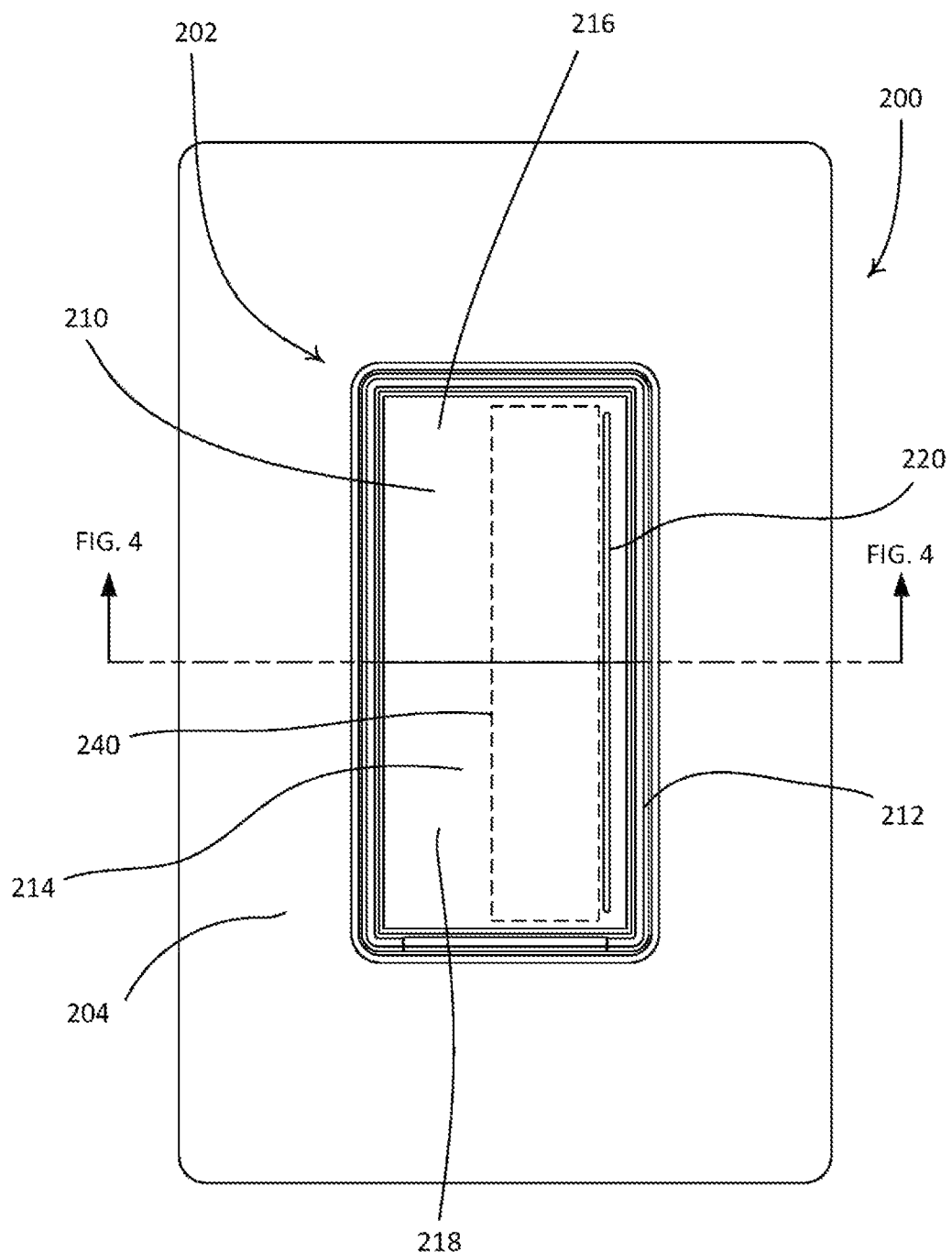
FIG. 3 is a front view of the control device of FIG. 2.

FIG. 2 is a perspective view and FIG. 3 is a front view of an example control device 200 that may be deployed as the dimmer switch 110 and/or the retrofit remote control device 112 in the lighting control system 100. The control device 200 may comprise a user interface 202 and a faceplate 204. The user interface 202 of the control device 200 may include an actuation member 210 that is configured to be mounted to a base portion 212 (e.g., a bezel). The actuation member 210 may comprise a front surface 214 having an upper portion 216 and a lower portion 218. The actuation member 210 may be configured to pivot (e.g., about a central axis) in response to an actuation of the upper portion 216 and the lower portion 218. The control device 200 may be configured to control a lighting load of the lighting control system 100 to turn the load on in response to an actuation (e.g., a tactile actuation) of the upper portion 216 and to turn the load off in response to an actuation (e.g., a tactile actuation) of the lower portion 218. At least a portion of the front surface 214 of the actuation member 210 may also be configured as a touch sensitive surface (e.g., a capacitive touch surface) that is configured to receive (e.g., detect) inputs (e.g., touch actuations), such as point actuations or gestures, from a user of the control device 200. The user interface 202 may also include a light bar 220 configured to be illuminated by one or more light sources (e.g., one or more LEDs) to visibly display information. The control device 200 may be configured to adjust the amount of power delivered to the lighting load in response to a position of an actuation (e.g., a touch actuation) of the front surface 214 of the actuation member 210 may be actuated along the light bar 220. When the control device 200 is a wall-mounted dimmer switch, the control device 200 may comprise a rear enclosure 230 for housing load control circuitry of the dimmer switch. Examples of control devices having capacitive touch surfaces are described in greater detail in commonly-assigned U.S. Pat. No. 10,109,181, issued Oct. 23, 2018, entitled GESTURE-BASED CONTROL DEVICE FOR CONTROLLING AN ELECTRICAL LOAD, the entire disclosure of which is hereby incorporated by reference. Although described primarily in context of a capacitive touch surface, it should be appreciated that the control device 200 is not so limited, and in some examples, at least a portion of the front surface 214 of the actuation member 210 may be configured as a different type of touch sensitive surface, such as a resistive touch surface, an inductive touch surface, a surface acoustic wave (SAW) touch surface, an infrared touch surface, acoustic pulse touch surface, or the like.

Figure 4:
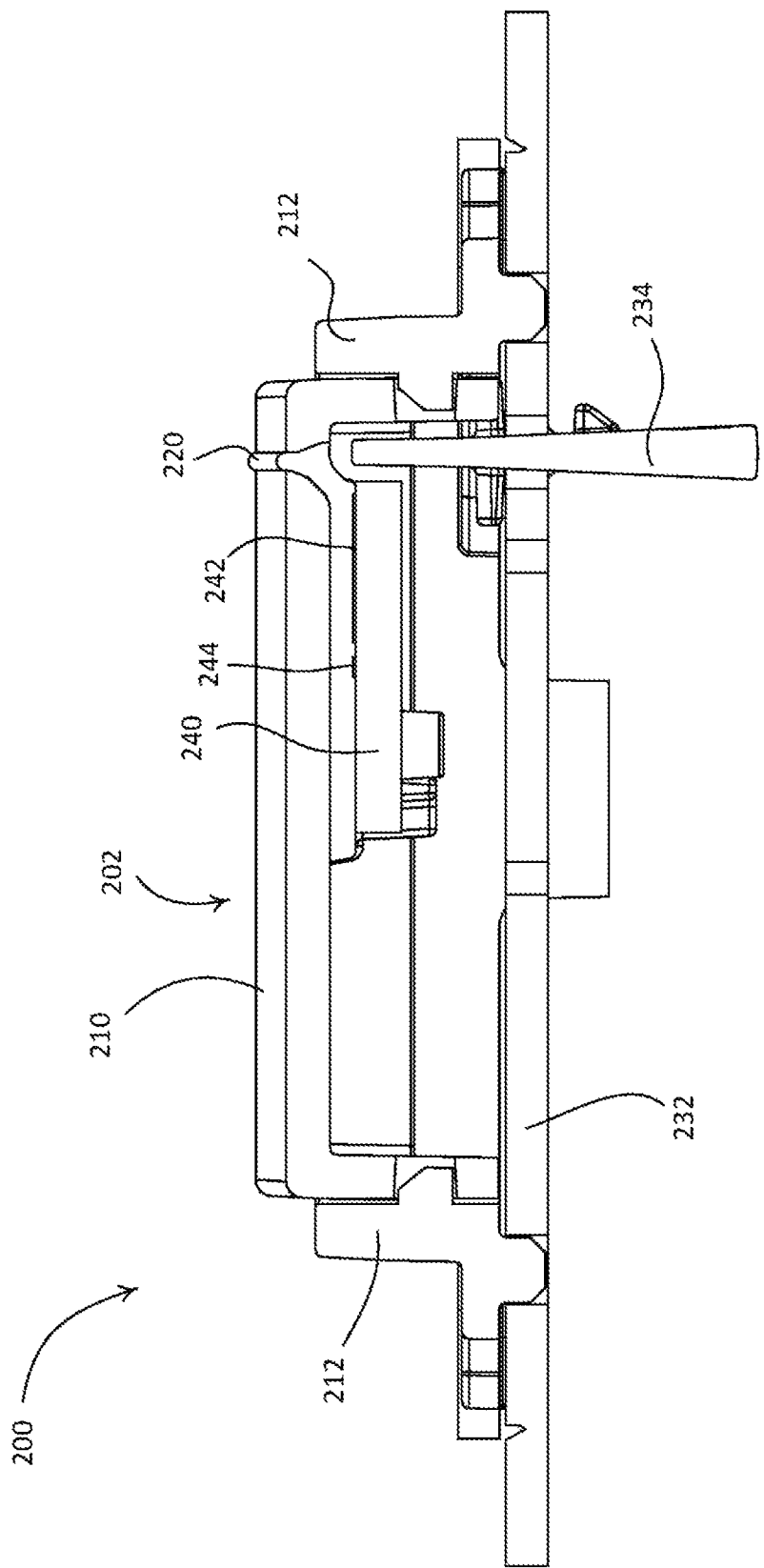
FIG. 4 is a bottom cross-sectional view of the control device of FIG. 2.

FIG. 4 is a bottom cross-sectional view of the control device 200 taken through the center of the control device (e.g., through the line shown in FIG. 3). When the control device 200 is a wall-mounted dimmer switch, the control device 200 may comprise a yoke 232 that may be connected to the rear enclosure (not shown in FIG. 4) and may be configured to mount the control device to an electrical wallbox. The control device 200 may also comprise a light pipe 234 that may be configured to conduct light from one or more light sources located inside of the rear enclosure to the light bar 220. For example, the light sources may comprise one or more light-emitting diodes (LEDs) mounted to a main printed circuit board (not shown) housed in the rear enclosure.

The control device 200 may also comprise a capacitive touch printed circuit board (PCB) 240. The capacitive touch PCB 240 may be located behind the actuation member 210 for detecting touch actuations of the front surface 214 of the actuation member 210. The capacitive touch PCB 240 may be located adjacent to (e.g., but not immediately behind) the light bar 220 for detecting actuations of the light bar 220 (e.g., and/or actuations of the front surface 214 of the actuation member 210 adjacent to the light bar 220) as shown by the dashed line in FIG. 3. The capacitive touch PCB 240 may not be located immediately behind the light bar 220 since the light pipe 234 extends from the LEDs in the rear enclosure to the light bar 220 as shown in FIG. 4. The capacitive touch PCB 240 may comprise one or more receiving capacitive touch pads 242 (e.g., electrodes) for detecting the touch actuations on or adjacent to the light bar 220. The control device 200 may be configured to detect the position of the touch actuation along the length of the light bar 220 in response to respective signals received from the one or more receiving capacitive touch pads 242 and to control the electrical loads according to the determined position.

Figure 5:
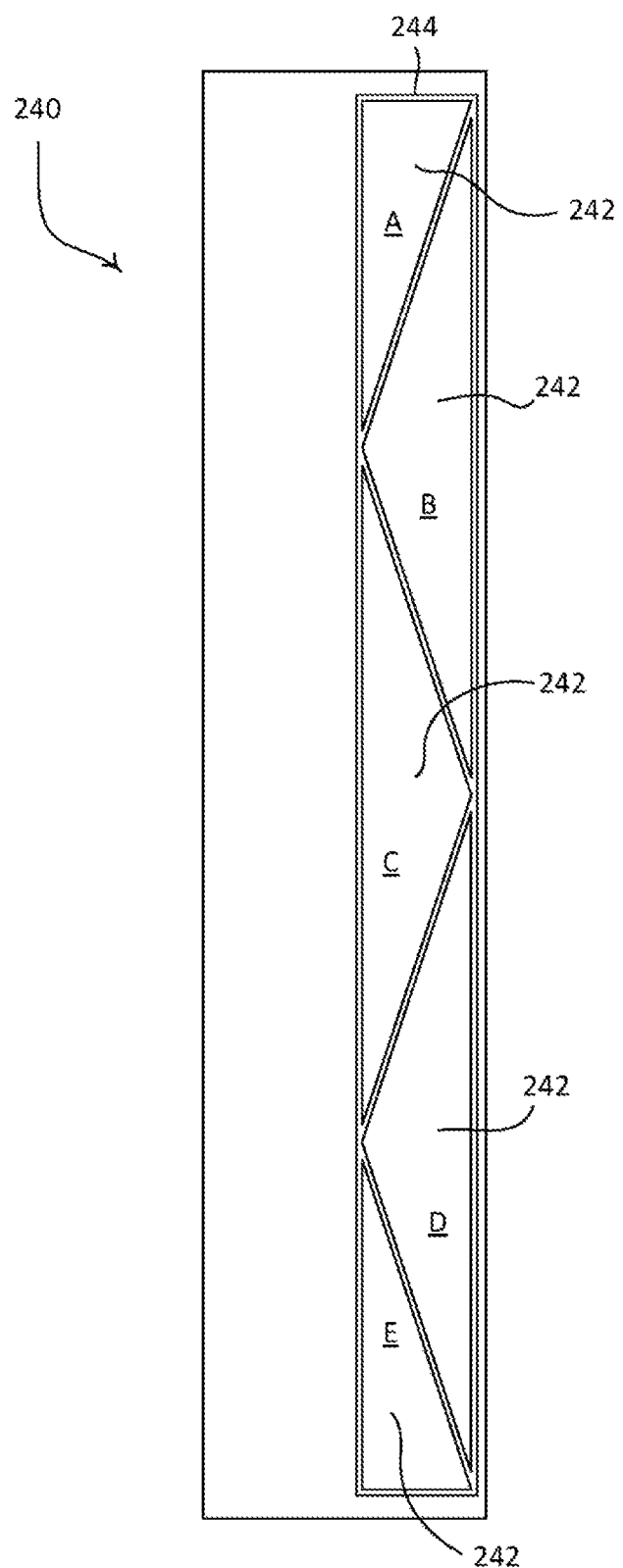
FIG. 5 is a front view of a capacitive touch printed circuit board of the control device of FIG. 2
Figure 6:
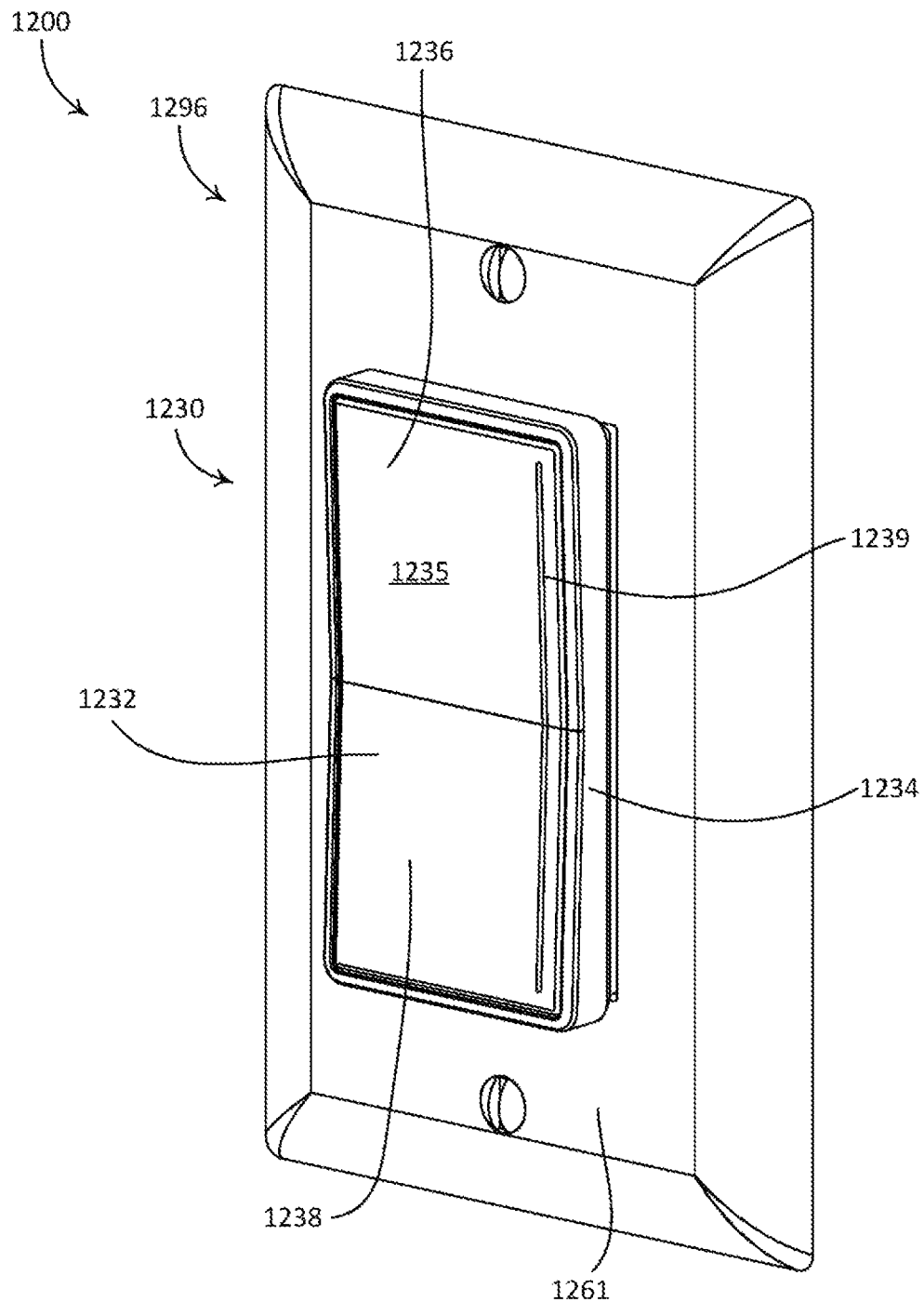
FIGS. 6-11 depict an example of a remote control device that may be installed in a load control system, such as a lighting control system.
Figure 8:
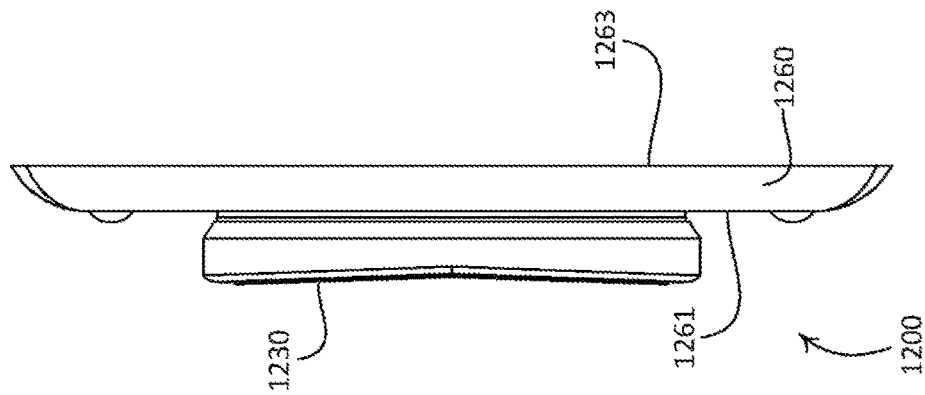

FIG. 5 is a front view of the capacitive touch PCB 240. The capacitive touch PCB 240 may comprise five receiving capacitive touch pads 242 (e.g., capacitive touch regions A-E) as shown in FIG. 5. The receiving capacitive touch pads 242 may each be triangular in shape and may be arranged in a linear array that extends from the top to the bottom of the capacitive touch PCB 240 (e.g., on the right side of the capacitive touch PCB 240). For example, regions A and E of the receiving capacitive touch pads 242 may be electrically coupled together. The linear array of the receiving capacitive touch pads 242 may extend along a longitudinal axis of the control device 200. Although illustrated as including five triangularly shaped capacitive touch pads 242, in other examples the capacitive touch PCB 240 may include any number and/or the shape of the capacitive touch pads 242. The receiving capacitive touch pads 242 may be configured according to a mutual capacitance sensing technique. The receiving capacitive touch pads 242 may be surrounded by a transmission trace 244. The control device 200 may be configured to energize the transmission trace 244 to charge the receiving capacitive touch pads 242, which may reduce the influence of other objects in the environment of the control device 200 from affecting the capacitive touch sensing.

In some examples, the capacitive touch PCB 240 may include four electrodes. For example, a first electrode may reside under region B, a second electrode may reside under region C, a third electrode may reside under region D, and a fourth electrode may wrap around from region A to region E, residing partially under each region (e.g., region A may be electrically connected to region E). In these examples, a control circuit (e.g., a control circuit of the capacitive touch PCB 240) may detect a change in capacitance of the fourth electrode residing under regions A and E, and also detect a chance in capacitance of the first electrode residing under region B or the third electrode residing under region D. If the control circuit detects a change in capacitance of both the first and fourth electrodes, then the control circuit may determine that a user actuation occurred around regions A and B. Similarly, if the control circuit detects a change in capacitance of both the third and fourth electrodes, then the control circuit may determine that a user actuation occurred around regions D and E. For instance, in some examples the control circuit may detect a position of a touch actuation along the front surface 214 of the control device 200 based on a ratio of the change $\Delta_{CAP}$ in the count for one electrode to the change $\Delta_{CAP}$ in the count for another electrode. For example, based on a ratio of the change $\Delta_{CAP}$ in the count for the fourth electrode (e.g., regions A and E) as compared to the change $\Delta_{CAP}$ in the count for the first electrode (e.g., the region B), the control circuit may determine that the position of a touch actuation is between the regions A and B. Finally, although described with reference to five regions and four electrodes, the capacitive touch PCB 240 may include any number of regions and/or electrodes, where the number of electrodes may be one less than the number of regions, or in some examples, equal to the number of regions.

FIGS. 6-11 depict another example of a remote control device 1200 that may be installed in a load control system, such as a lighting control system. For example, the remote control device 1200 may be installed in the lighting control system 100 of FIG. 1. The load control system may include a mechanical switch 1290 that may be in place prior to installation of the remote control device 1200, for example pre-existing in the load control system. As shown, the mechanical switch 1290 may be a standard decorator paddle switch. The load control system may further include one or more electrical loads, such as lighting loads. The mechanical switch 1290 may be coupled in series electrical connection between an alternating current (AC) power source and the one or more electrical loads.

The mechanical switch 1290 may include a paddle actuator 1292 that may be actuated to turn on and/or turn off, the one or more electrical loads. The mechanical switch 1290 may include a bezel 1293 that surrounds the paddle actuator 1292. An upper portion of the paddle actuator 1292 may protrude from the bezel 1293 (e.g., in a first orientation) when the electrical load is off, and a lower portion of the paddle actuator 1292 may protrude from the bezel 1293 when the electrical load is on, or vice versa. The mechanical switch 1290 may include a yoke (not shown) that enables mounting of the mechanical switch 1290 to a structure. For example, the yoke may be fastened to a single-gang wallbox that is installed in an opening of a structure (e.g., such as a wall, ceiling, etc.). As shown, a faceplate 1296 may be secured to the mechanical switch 1290, for instance to the yoke. The faceplate 1296 may define a front surface 1261 and an opposed rear surface 1263. The front surface 1261 may alternatively be referred to as an outer surface of the faceplate 1296, and the rear surface 1263 may alternatively be referred to as an inner surface of the faceplate 1296. The faceplate 1296 may be made of any suitable material, such as plastic. The remote control device 1200 may be configured to be installed over the paddle actuator 1292 of the mechanical switch 1290 (e.g., mounted to the paddle actuator 1292, the bezel 1293, and/or the faceplate 1296).

The remote control device 1200 may include a base 1220 and a control unit 1230 (e.g., a control module). The control unit 1230 may be mounted to the base 1220. For example, the base 1220 may be configured to attach the remote control device 1200 to the mechanical switch 1290. The remote control device 1200 may also include a spacer 1210, which may be a shim and may be configured to compensate for mechanical switches having paddle actuators 1292 that protrude at greater lengths from the bezel 1293. The control unit 1230 may be mounted to the base 1220 with or without the spacer 1210. When the spacer 1210 is used, the spacer 1210 may be attached to the base 1220 and the control unit 1230 may be attached to the spacer 1210.

The base 1220 may alternatively be referred to as a base portion, a mounting frame, or a mounting assembly. The control unit 1230 and the base 1220 may be configured such that the control unit 1230 may be removably attached to the base 1220. The base 1220 may be mounted over (e.g., attached to) the paddle actuator 1292 of the mechanical switch 1290 without removing the faceplate 1296. In this regard, the remote control device 1200 may be mounted over an installed mechanical switch, such as the mechanical switch 1290, without the need to remove the faceplate 1296 and/or perform any electrical re-wiring of the mechanical switch 1290. For example, the base 1220 may be attached to the bezel 1293 of the mechanical switch 1290 using an adhesive 1205. The adhesive 1205 may be configured to secure the base 1220 to the bezel 1293.

As shown, the base 1220 may define a frame 1221. The frame 1221 may define primary attachment tabs 1222. The primary attachment tabs 1222 may be configured to releasably secure the control unit 1230 to the base 1220. The primary attachment tabs 1222 may be configured to engage the control unit 1230 (e.g., a complementary structure of the control unit 1230). The frame 1221 may further define apertures 1224. The apertures 1224 may be configured to engage the spacer 1210 (e.g., a complementary structure of the spacer 1210).

The spacer 1210 may define auxiliary attachment tabs 1212. The auxiliary attachment tabs 1212 may be configured to engage the control unit 1230 (e.g., complementary structure of the control unit 1230). The spacer 1210 may define primary snaps 1214. The primary snaps 1214 may be configured to engage the primary attachment tabs 1222 of the base 1220. For example, the primary snaps 1214 may releasably secure with the primary attachment tabs 1222 of the base 1220 such that the spacer 1210 is releasably attached to the base 1220. The spacer 1210 may define clips 1216. The clips 1216 may be configured to engage the base 1220 when the spacer 1210 is attached to the base 1220. For example, the clips 1216 may be configured to secure the spacer 1210 to the base 1220. The spacer 1210 may define pins 1218. The pins 1218 may be configured to align and/or maintain alignment between the spacer 1210 and the base 1220. The pins 1218 may extend from a perimeter of the spacer 1210. The pins 1218 may be configured to be received by the base 1220 (e.g., complementary structure of the base 1220). For example, the pins 1218 may be received by the apertures 1224 when the spacer 1210 is attached to the base 1220.

The control unit 1230 may include a user interface comprising an actuation member 1232, a housing 1234, and a battery holder 1270. For example, the actuation member 1232 may be attached to the housing 1234. The housing 1234 may define an upper wall 1241, a lower wall 1242, and opposed side walls 1243. The upper wall 1241, the lower wall 1242, and the side walls 1243 of the housing 1234 may extend from respective edges of the actuation member 1232 (e.g., from a perimeter defined by the actuation member 1232). The housing 1234 may define primary snaps 1252 and/or auxiliary snaps 1254. For example, the upper wall 1241 and the lower wall 1242 may define primary snaps 1252 and/or auxiliary snaps 1254. The control unit 1230 may be attached to the base 1220 using the primary snaps 1252 and/or to the spacer 1210 using the auxiliary snaps 1254. The primary snaps 1252 may be configured to engage the primary attachment tabs 1222 of the base 1220. For example, the primary snaps 1252 may engage the primary attachment tabs 1222 of the base 1220 when the spacer 1210 is not used. The auxiliary snaps 1254 may be configured to engage the auxiliary attachment tabs 1212 of the spacer 1210. For example, the auxiliary snaps 1254 may engage the auxiliary attachment tabs 1212 of the spacer 1210 when the spacer 1210 is used.

The housing 1234 of the control unit 230 may include a pivot bar 1250. The pivot bar 1250 may extend between the opposed side walls 1243 of the housing 1234. The pivot bar 1250 may be configured to receive the battery holder 1270. For example, the battery holder 1270 may pivotally mount to the pivot bar 1250. The battery holder 1270 may pivot about the pivot bar 1250 between a first position and a second position. The first position may correspond to the battery holder being proximate to the lower wall 1242 of the housing 1234, while the second position may correspond to the battery holder 1270 being proximate to the upper wall 1241 of the housing 1234.

The control unit 1230 may include a printed circuit board (PCB) 1244 (e.g., a flexible or rigid printed circuit board). The PCB 1244 may include a processor or controller and a touch sensitive device (e.g., which itself may include a separate processor). As such, in some examples, the PCB 1244 may act as both a main PCB and a capacitive touch PCB (e.g., may operate similarly as the main PCB 240 and the capacitive touch PCB 260 of the control device 200). The control unit 1230 may also include a light bar 1239 configured to be illuminated by one or more light sources 1237 (e.g., one or more LEDs). The light bar 1239 may be illuminated via a light guide film 1246 on the printed circuit board 1244. For example, the light sources 1237 on the printed circuit board 1244 may illuminate the light bar 1239 through the light guide film 1246. The light bar 1239 may be illuminated to visibly display information to a user of the control unit 1230. The front surface 1235 of the actuation member 1232 may be actuated along the light bar 1239 to adjust the amount of power delivered to the lighting load according to the position of the actuation.

Figure 10:
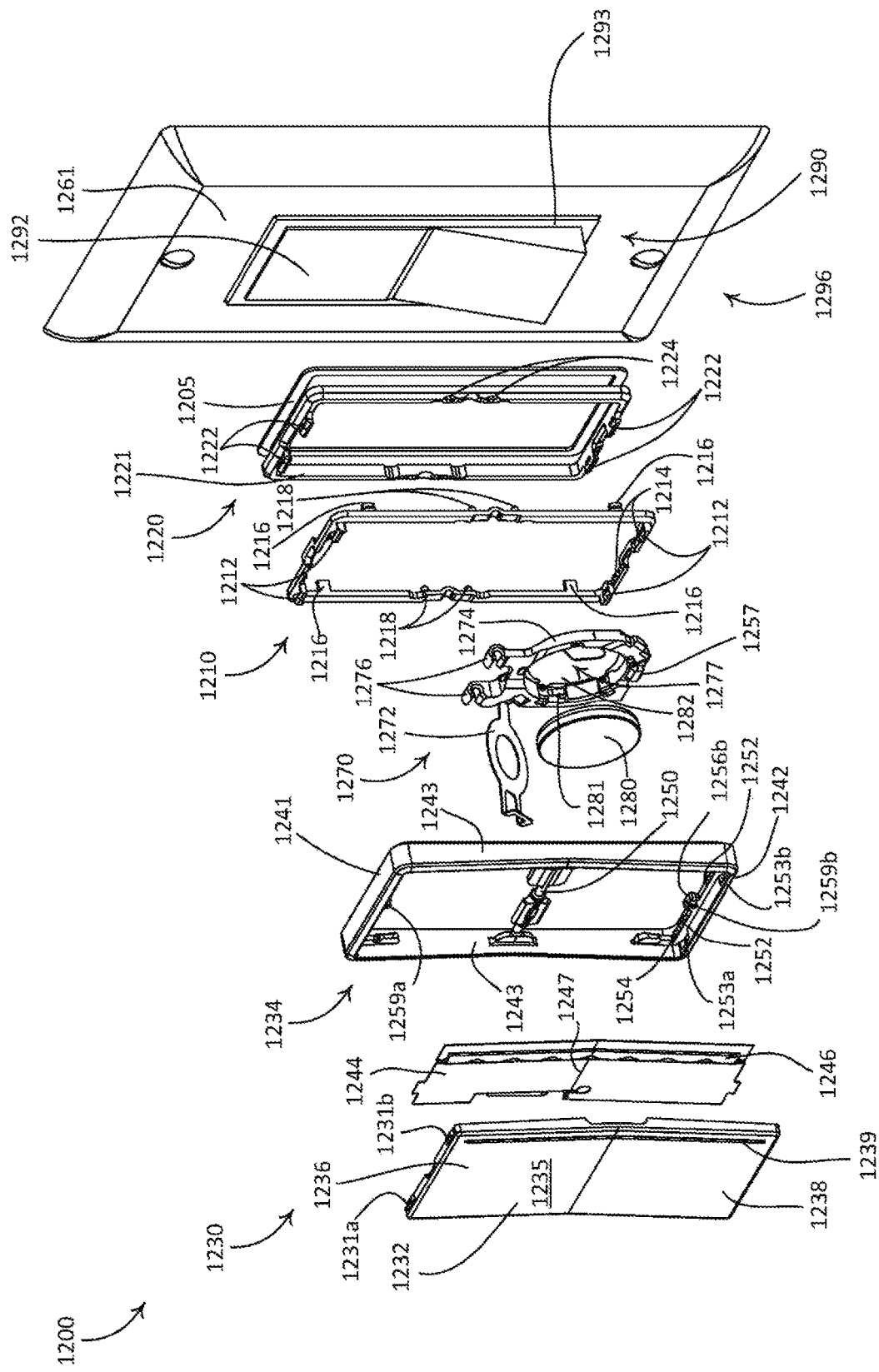
Figure 11:
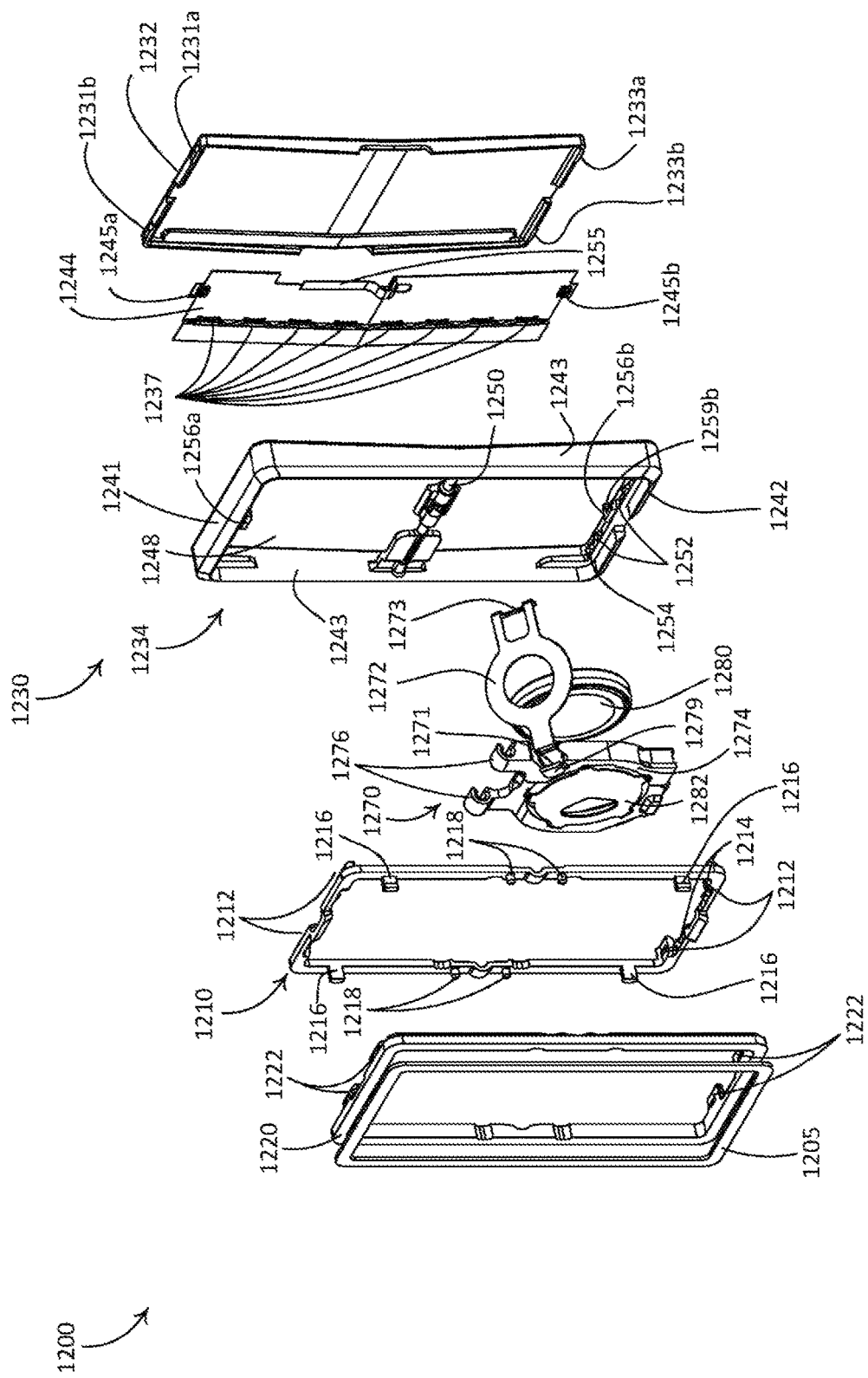

As shown in FIGS. 6-11, the control unit 1230 may be rectangular in shape and elongate between the upper wall 1241 and the lower wall 1242. It should be appreciated that the control unit 1230 is not limited to the illustrated rectangular geometry, and that control unit may alternatively be configured with other suitable geometries. In accordance with the illustrated orientation of the control unit 1230, the upper wall 1241 may be referred to as an upper end of the control unit 1230 and the lower wall 1242 may be referred to as a lower end of the control unit 1230. The upper and lower walls 1241, 1242 of the control unit 1230 may also be referred to as first and second ends of the housing 1234, respectively. The control unit 1230 (e.g., the housing 1234) may define a void 1248 (FIG. 11). The void 1248 may be configured to receive the printed circuit board 1244 in an attached position. The void 1248 may be defined by the upper wall 1241, the lower wall 1242, and the opposing side walls 1243. The void 248 may include an upper portion that is defined between the pivot bar 1250 and the upper wall 1241, and a lower portion that is defined between the pivot bar 1250 and the lower wall 1242. The housing 1234 may be made of any suitable material, such as plastic or metal.

The control unit 1230 may operate in a similar manner as the control device 200. However, the control unit 1230 may not comprise an internal load control device, but may be configured to transmit (e.g., wirelessly transmit) message (e.g., digital messages) for controlling one or more electrical loads in response to actuations of the actuation member 1232. For example, the actuation member 1232 may include a front surface 1235 having an upper portion 1236 and a lower portion 1238, and the control unit 1230 may be configured to control an electrical load in response to actuation of the upper or lower portions 1236, 1238 of the actuation member 1232. The actuation member 1232 may also receive user inputs that do not cause the actuation member 1232 to pivot. For example, the control unit 1230 may be configured to control an electrical load in response to touch actuations along the front surface 1235 of the actuation member 1232.

The control unit 1230 (e.g., the PCB 1244) may include mechanical switches, such as first and second tactile switches 1245a, 1245b, that are configured to be actuated in response to actuations (e.g., tactile actuations) of the upper portion 1236 and the lower portion 1238 of the actuation member 1232, respectively (e.g., to control turning the load on and off). For example, the control unit 1230 may be configured to control a lighting load of the lighting control system 100 to turn the load on in response to an actuation of the first tactile switch 1245a and to turn the load off in response to an actuation of the second tactile switch 1245b (or vice versa). For example, the control device 1200 may be configured to turn the lighting load on to a previous intensity level (e.g., before the lighting load was previously turned off) or to a preset intensity level (e.g., a predetermined or locked preset intensity level) in response to a tactile actuation of the upper portion 1236 of the actuation member 1232. The tactile actuation of the actuation member 1232 may cause one of the first and second tactile switches 1245a, 1245b of the PCB 1244 to be actuated. For example, the control unit 1230 (e.g., the housing 1234) may define a first nub 1259a and a second nub 1259b. When the upper portion 1236 of the actuation member 1232 is actuated, the first tactile switch 1244a may be moved toward the first nub 1259a. As such, the actuation of the upper portion 1236 the actuation member 1232 may cause the first tactile switch 12441 to move toward and contact the first nub 1259a. Similarly, when the lower portion 1238 of the actuation member 1232 is actuated, the second tactile switch 1244b may be moved toward the second nub 1259b. As such, the actuation of the lower portion 1238 the actuation member 1232 may cause the second tactile switch 1244b to move toward and contact the second nub 1259b.

The actuation member 1232 may be configured to pivot in response to a tactile actuation of the upper portion 1236 and the lower portion 1238. The actuation member 1232 may pivot about a lower axis in response to a tactile actuation of the upper portion 1236 of the actuation member and pivot about an upper axis in response to a tactile actuation of the lower portion 1238 of the actuation member 1232 (e.g., as opposed to pivoting about a midpoint of the actuation member). For example, the upper wall 1241 of the housing 1234 may include first and second recesses (not shown), and the lower wall 1242 of the housing 1234 may include first and second recesses 1253a, 1253b, respectively. Further, the actuation portion 1232 may include first and second top notches 1231a, 1231b, respectively, and first and second bottom notches 1233a, 1233b, respectively. As such, when the upper portion 1236 of the actuation member 1232 is actuated, the first and second bottom notches 1233a, 1233b of the actuation member 1232 may pivot about the first and second recesses 1253a, 1253b of the lower wall 1242, and the first tactile switch 1244a may be moved toward and contact the first nub 1259a. Similarly, when the lower portion 1238 of the actuation member 1232 is actuated, the first and second top notches 1231a, 1231b of the actuation member 1232 may pivot about the first and second recesses (not shown) of the upper wall 1241, and the second tactile switch 1244b may be moved toward and contact the second nub 1259b.

The actuation member 1232 may also receive user inputs that do not cause the actuation member 1232 to pivot. The control unit 1230 may be configured to control an electrical load in response to touch actuations along the front surface 1235 of the actuation member 1232. For example, at least a portion of the front surface 1235 of the actuation member 1232 may be configured as a touch sensitive surface (e.g., a capacitive touch surface) that is configured to receive (e.g., detect) inputs (e.g., touch actuations/inputs), such as point actuations or gestures, from a user of the control device 1200. The touch sensitive surface of the actuation member 1232 may be located adjacent to and/or overlap with the light bar 1239. For example, during a normal operating mode of the control device 1200, the front surface 1232 of the actuation member 1232 may be actuated along the light bar 1239 (e.g., along the touch sensitive surface) to adjust the amount of power delivered to, and thus the intensity level of, the lighting load according to the position of the touch actuation, for example, between a low-end intensity level $L_{LE}$ and a high-end intensity level $L_{HE}$. Although described primarily in context of a capacitive touch surface, it should be appreciated that the control device 1200 is not so limited, and in some examples, at least a portion of the front surface 1235 of the actuation member 1232 may be configured as a different type of touch sensitive surface, such as a resistive touch surface, an inductive touch surface, a surface acoustic wave (SAW) touch surface, an infrared touch surface, acoustic pulse touch surface, or the like.

The control device 1200 may control the magnitude of a load current conducted through the lighting load based on a single discrete input along the touch sensitive surface and/or based on a plurality of consecutive inputs along the touch sensitive surface. For example, the user may tap their finger at a position along the touch sensitive surface, and in response, the control device 1200 may turn the lighting load on to an intensity level based on the position. As an example, if the lighting load is off, the control device 1200 may turn the lighting load on to an intensity level based on the position of a touch actuation along the touch sensitive surface of the actuation member 1232. While the lighting load is on, the user may move (e.g., slide) their finger along the touch sensitive surface, and in response, the control device 1200 may adjust (e.g., continuously control) the magnitude of the load current conducted through the lighting load based on the positions of a plurality of inputs along the touch sensitive surface.

Further, in a color control mode, the control device 1200 may control a color of the lighting load based on the position of a touch actuation along the touch sensitive surface of the actuation member 1232 (e.g., by controlling a color temperature of the lighting load or by applying full color control over the lighting load). For example, the light bar 1239 may be configured to illuminate a spectrum of colors through the length of the light bar 1239 (e.g., across the full visible color spectrum, a subset of the visual color spectrum, and/or the light spectrum associated with the color temperatures of a black body radiator). Accordingly, the control device 1200 may control the color of the lighting load based on the position of a touch actuation along the touch sensitive surface, and in turn, the corresponding color of that position on the light bar 1239.

The PCB 1244, which may include capacitive touch pads that creates a touch sensitive surface on the actuation member 1232, may be affixed to the actuation member 1232 and may be responsive to touch actuations. The front surface 1235 of the actuation member 1232 of the control unit 1230 may define a user interface that is configured to receive inputs, such as gestures, from a user of the remote control device 1200. The user interface may be configured as a touch sensitive surface (e.g., a capacitive touch surface) that is configured to receive (e.g., detect) inputs, such as gestures, from a user of the control unit 1230. For example, the printed circuit board 1244 may include one or more capacitive touch regions, or surfaces (e.g., similar to the receiving capacitive touch pads 244 mounted to the capacitive touch PCB 240 of the control device 200). The printed circuit board 1244 may include one or more linear capacitive touch regions that faces an inner surface of the actuation member 1232 when the printed circuit board 1244 is disposed in the void 1248. The front surface 1235 of the actuation member 1232 may be configured to detect touches along an x-axis, a y-axis, or both an x-axis and a y-axis. Accordingly, the actuation member 1232, when actuated, may pivot to actuate one of the first or second tactile switches 1244a, 1244b, such that tactile actuations of the actuation member 1232 may cause movement of the PCB 1244.

The control unit 1230 may further include a control circuit (e.g., a processor, not shown) and a wireless communication circuit (e.g., an RF transceiver, not shown). The control unit 1230 may be configured to translate one or more inputs (e.g., user inputs) from the user interface into respective control signals that may be used to control a load control device of a load control system. The one or more inputs may be applied via touches or presses of the upper portion 1236 and/or lower portion 1238 of the actuation member 1232. For example, the control circuit may be configured to receive input signals (e.g., that correspond to the user inputs) in response to actuations of the upper portion 1236 and/or lower portion 1238 by a user of the remote control device 1200. For example, the input signals received by the control circuit may be the respective control signals translated from the control interface inputs. The control circuit may be configured to generate commands that the user desires the control unit 1230 to execute in response to the input signals produced in response to actuations of the upper portion 1236 and/or lower portion 1238. The control unit 1230 may be configured to cause the wireless communication circuit to transmit one or more control signals including the commands generated by the control circuit.

The control circuit may be configured to cause the wireless communication circuit to transmit respective commands that correspond to inputs and/or gestures received by the upper portion 1236 and/or lower portion 1238. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

The control circuit may be configured to cause the wireless communication circuit to transmit respective commands that correspond to interpreted gestures received at the touch sensitive surface. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

Figure 7:
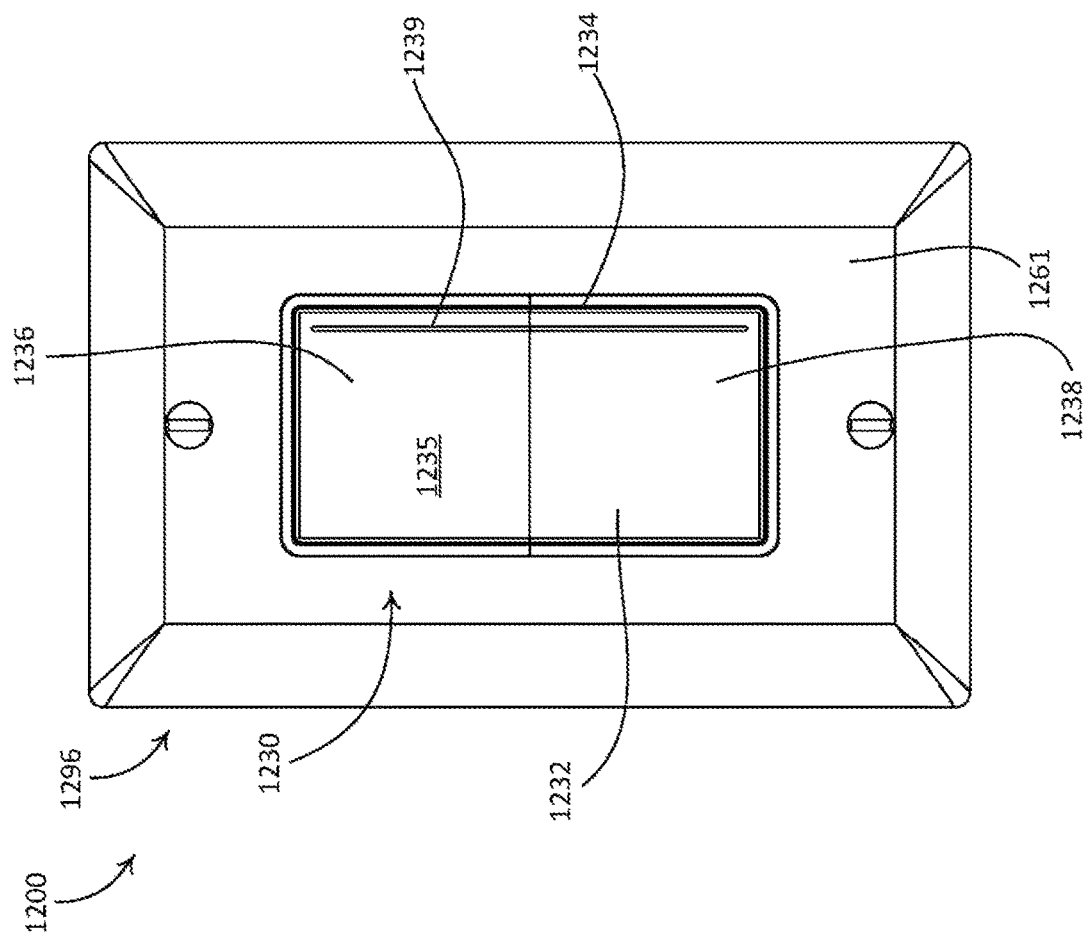
Figure 9:
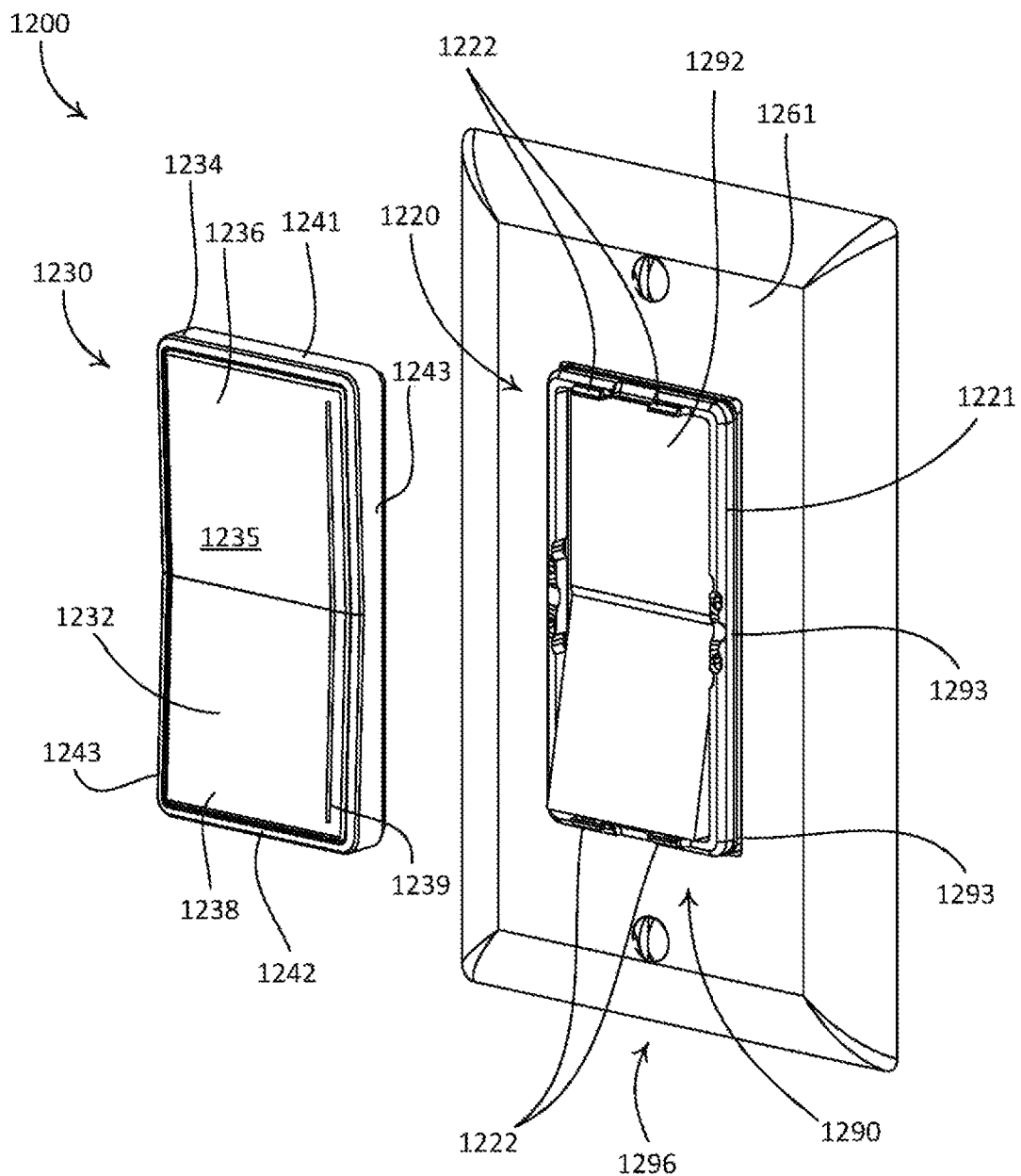

The light bar 1239 of the control unit 1230 may be configured to provide a visual indication of a command issued by the remote control device 1200. For example, the control circuit may be configured to, upon receiving a gesture indicative of a command to change an amount of power delivered to an electrical load, such as a command to dim a lighting load, indicate the amount of power delivered to the electrical load by temporarily illuminating a number of the LEDs that corresponds with the desired amount of power (e.g., the desired dimming level of the lighting load). In such an example, the control circuit may be configured to cause the LEDs to be illuminated simultaneously, to illuminate sequentially with some or little overlap before fading, or to otherwise illuminate as desired. The control unit 1230 may be configured to be attached to the base 1220 with the light bar 1239 located on a predetermined side of the control unit 1230 (e.g., the right side of the control unit as shown in FIG. 7), for example, such that the light bar 1239 may be illuminated to indicate the amount of power presently being delivered to the electrical load. The printed circuit board 1244 may define a fold 1247 such that the light sources 1237 mounted thereto illuminate through the printed circuit board 1244 and light guide film 1246 to the light bar 1239.

The illustrated control unit 1230 may be battery-powered. The battery 1280 (e.g., the illustrated coin cell battery) may be placed in electrical communication with the circuitry mounted to the printed circuit board 1244, for instance to power the capacitive touch regions, the control circuit, the wireless communication circuit, and/or other circuitry of the control unit 1230.

The control unit 1230 may be configured to receive the battery holder 1270. The battery holder 1270 may include a housing 1274, a retaining clip 1272, positive battery contact 1281, and a negative battery contact 1282 (e.g., a backplate). The positive battery contact 1281 may be a positive electrical contact and the negative battery contact 1282 may be a negative electrical contact. For example, the positive battery contact 1281 and the negative battery contact 1282 may be connected to the housing 1274. The battery holder 1270 may be configured to retain the battery 1280 therein. The battery holder 1270 may define a cavity 1277. For example, the housing 1274 and the negative battery contact 1282 may define the cavity 1277. The negative battery contact 1282 may be configured to attach to the housing 1274. The negative battery contact 1282 may be configured to define a rear surface of the cavity 1277. The cavity 1277 may be configured to receive the battery 1280. The retaining clip 1272 may be configured to secure the battery 1280 within the cavity 1277. The retaining clip 1272 may define a pivot clip 1271 and a locking clip 1273. The pivot clip 1271 may pivotally mount the retaining clip 1272 to the battery holder 1270. For example, the retaining clip 1272 may pivot using the pivot clip 1271. The locking clip 1273 may be configured to secure the retaining clip 1272 to the housing 1274 such that the battery 1280 is retained therein. The pivot clip 1271 may comprise a retention tab 1279 that may retain the pivot clip 1271 in the battery holder 1270 when the retaining clip 1272 is moved to the open position.

The battery holder 1270 may be configured to be installed within the void 1248 defined by the control unit 1230 (e.g., the housing 1234). For example, the void 1248 may be configured to receive the battery holder 1270. The battery holder 1270 may be configured to retain the battery 1280 therein. The battery holder 1270 may include attachment clips 1276. The attachment clips 1276 may be c-clips (e.g., such as right-angle c-clips). The attachment clips 1276 may be configured to rotatably attach to the pivot bar 1250. For example, the attachment clips 1276 may be configured to pivot about the pivot bar 1250, for example, as the battery holder is moved between the first position and the second position. The pivot bar 1250 may define a pivot axis. The battery holder 1270 may be configured to pivot about the pivot axis. The pivot axis may be located at a midpoint of the control unit 1230. Alternatively, the pivot bar 1250 may be a pin (e.g., a rod) and the battery holder 1270 may comprise fully closed loops rather than the attachment clips 1276. The pin may be slid into the closed loops of the battery holder and then the ends of the pin may be attached to the housing 1234.

The battery holder 1270 may be configured to electrically connect the battery 1280 to the control unit 1230 (e.g., the printed circuit board 1244) for powering the circuitry of the control unit 1230. The battery holder 1270 may be configured to maintain electrical contact between the battery 1280 and the printed circuit board 1244 when the battery holder 1270 is moved between the first position and the second position. For example, the positive battery contact 1281 and the negative battery contact 1282 of the battery holder 1270 may be configured to be electrically connected to a positive terminal and a negative terminal of the battery 1280, respectively, when the battery is received in the cavity 1277. The positive battery contact 1281 may operate as a spring that is biased towards the battery 1280 when the battery is received in the cavity 1277.

The control unit 1230 may include a flexible cable (not shown) that is attached (e.g., mechanically and electrically connected) to the printed circuit board 1244. The flexible cable may be attached (e.g., mechanically and electrically connected) to the battery holder 1270. The flexible cable may comprise at least two electrical conductors (not shown) for electrically connecting the circuitry of the control unit 1230 on the printed circuit board 1244 to the positive and negative terminals of the battery 1280. For example, a first one of the electrical conductors of the flexible cable may be electrically connected to positive battery contact 1281 and a second one of the electrical conductors of the flexible cable may be electrically connected to the negative battery contact 1282. Alternatively, the retaining clip 1272 may operate as a positive battery contact of the battery holder 1270.

It should be appreciated that electrical connection between the battery 1280 and the printed circuit board 1244 may be achieved in other ways. For example, the battery holder 1270 may abut a first post (not shown) on the control unit 1230 in the second position and may abut a second post (not shown) on the control unit 1230 in the first position. The first post and the second post may be configured to provide the electrical connection between the battery 1280 and the printed circuit board 1244. The first post may be proximate to the upper wall 1241 and the second post may be proximate to the lower wall 1242.

The battery holder 1270 may be configured to adjust the location of the battery 1280 within the control unit 1230. For example, the location of the battery 1280 may be adjusted based on the position of the paddle actuator 1292 when power is being delivered to the electrical load(s) associated with the mechanical switch 1290. The battery holder 1270 may be operable between a first position and a second position. For example, the battery holder 1270 may be configured to be pivoted between the first position and the second position. The first position may be defined as the battery holder 1270 proximate to the lower wall 1242 (e.g., a lower portion of the void 1248). For example, the battery holder 1270 may be in the lower portion of the void 1248 when the battery holder 1270 is in the first position. The second position may be defined as the battery holder 1270 proximate to the upper wall 1241 (e.g., an upper portion of the void 1248). For example, the battery holder 1270 may be in the upper portion of the void 1248 when the battery holder 1270 is in the second position.

The control unit 1230 (e.g., the housing 1234) may define stops 1256a, 1256b in the upper portion and the lower portion of the void 1248. The stops 1256a, 1256b may extend into the void 1248 from the upper wall 1241 and the lower wall 1242. The stops 1256a, 1256b may be configured to prevent the battery holder 1270 from pivoting beyond the first position and the second position, respectively. The stops 1256a, 1256b may be configured to prevent the battery holder 1270 from abutting the printed circuit board 1244. The stops 1256a, 1256b may be configured to snap into an outer edge 1257 of the housing 1274 of the battery holder 1270 when the battery holder 1270 is in the first position or the second position. The control unit 1230 may be configured to be attached to the base 1220 with the light bar 1239 located on a predetermined side of the control unit (e.g., the right side of the control unit as shown in FIG. 10), for example, such that the light bar 1239 may be illuminated to indicate the amount of power presently being delivered to the electrical load. The control unit 1230 may be configured to be attached to base 1220 with the light bar 1239 located on a predetermined side of the control unit independent of a position of the paddle actuator 1292 of the mechanical switch 1290 (e.g., whether the upper portion or the lower portion of the paddle actuator 1292 is protruding from the bezel 1293). For example, the control unit 1230 may be configured such that the battery 1280 can be pivoted between the first position and the second position based on whether the upper portion or the lower portion of the paddle actuator 1292 is protruding from the bezel 1293.

The void 1248 of the control unit 1230 may be configured to receive a portion of the paddle actuator 1292 of the mechanical switch 1290 when the control unit 1230 is attached to the base 1220. The control unit 1230 may define separate portions of the void 1248, for example, the upper portion and the lower portion. When the mechanical switch 1290 is in a first orientation (e.g., when the upper portion of the paddle actuator 1292 is protruding from the bezel 1293), the upper portion may receive the upper portion of the paddle actuator 1292 and the lower portion may receive the battery holder 1270. When the mechanical switch 1290 is in a second orientation (e.g., when the lower portion of the paddle actuator 1292 is protruding from the bezel 1293), the lower portion may receive the portion of the lower portion of the paddle actuator 1292 and the upper portion may receive the battery holder 1270.

In some installations, the control unit 1230 may not be offset from the paddle actuator 1292 of the mechanical switch 1290 by enough distance when control unit 1230 is mounted to the base 1220, and the control unit 1230 may even contact the paddle actuator 1292. In this scenario, the control unit 1230 may cause the paddle actuator 1292 of the mechanical switch 1290 to change from the on position to the off position when a user actuates the actuation member 1232. The control unit 1230 (e.g., the housing 1234) may define flanges in the upper portion and the lower portion of the void 1248. The flanges may extend into the void 1248 from the opposed side walls 1243. When the control unit 1230 is being mounted onto the base 1220 during installation of the remote control device 1200, the flanges 1268 may contact the paddle actuator 1292 to indicate to the installer that the control unit 1230 may not be offset from the paddle actuator 1292 by enough distance. The installer may then install the spacer 1210 (or multiple spacers) onto the base 1220 to provide additional distance between the control unit 1230 and the paddle actuator 1292.

Figure 12A:
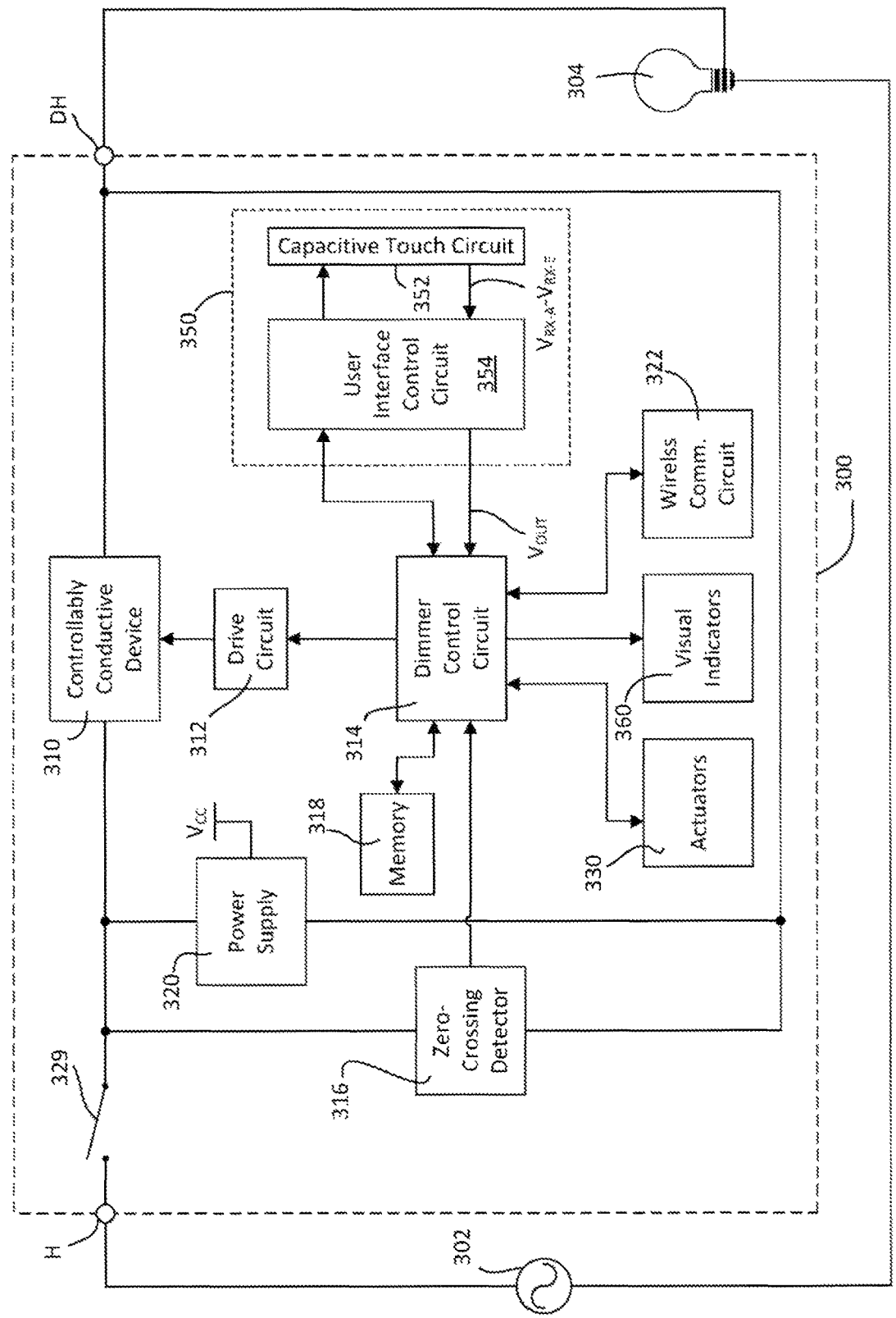
FIG. 12A shows a simplified equivalent schematic diagram of an example control device that may be deployed as a load control device (e.g., a dimmer switch) of the load control system illustrated in FIG. 1.

FIG. 12A is a simplified block diagram of an example control device 300 (e.g., a dimmer switch) that may be deployed as, for example, the dimmer switch 110 of the lighting control system 100 and/or the control device 200. The control device 300 may include a hot terminal H that may be adapted to be coupled to an AC power source 302. The control device 300 may include a dimmed hot terminal DH that may be adapted to be coupled to an electrical load, such as a lighting load 304.

The control device 300 may include a controllably conductive device 310 coupled in series electrical connection between the AC power source 302 and the lighting load 304. The controllably conductive device 310 may control the power delivered to the lighting load. The controllably conductive device 310 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs). An air-gap switch 329 may be coupled in series with the controllably conductive device 310. The air-gap switch 329 may be opened and closed in response to actuations of an air-gap actuator (not shown). When the air-gap switch 329 is closed, the controllably conductive device 310 is operable to conduct current to the load. When the air-gap switch 329 is open, the lighting load 304 is disconnected from the AC power source 302.

The control device 300 may include a dimmer control circuit 314. The dimmer control circuit 314 may include one or more of a processor (e.g., a microprocessor), a microcontroller, a programmable logic device (PLD), a field programmable gate array (FPGA), an application specific integrated circuit (ASIC), or any suitable controller or processing device. The dimmer control circuit 314 may be operatively coupled to a control input of the controllably conductive device 310, for example, via a gate drive circuit 312. The dimmer control circuit 314 may be used for rendering the controllably conductive device 310 conductive or non-conductive, for example, to control the amount of power delivered to the lighting load 304. The dimmer control circuit 314 may be configured to control the magnitude of a load current conducted through the lighting load(s) so as to control an intensity level of the lighting load 304 across a dimming range between a low-end intensity level $L_{LE}$ and a high-end intensity level $L_{HE}$. For example, the dimmer control circuit 314 may be configured to control the intensity level of the lighting load 304 to a number $N_{INT}$ (e.g., 255) of intensity levels between the low-end intensity level $L_{LE}$ and the high-end intensity level $L_{HE}$.

The control device 300 may comprise a wireless communication circuit 322. The wireless communication circuit 322 may include for example, a radio-frequency (RF) transceiver coupled to an antenna for transmitting and/or receiving RF signals. The wireless communication circuit 322 may also include an RF transmitter for transmitting RF signals, an RF receiver for receiving RF signals, or an infrared (IR) transmitter and/or receiver for transmitting and/or receiving IR signals. The wireless communication circuit 322 may be configured to transmit a control signal that includes the control data (e.g., a digital message) generated by the dimmer control circuit 314 to the lighting load 304. As described herein, the control data may be generated in response to touch actuations (e.g., point actuations or gestures) to adjust one or more operational aspects of the lighting load 304. The control data may include a command and/or identification information (e.g., such as a unique identifier) associated with the control device 300. In addition to or in lieu of transmitting the control signal to the lighting load 304, the wireless communication circuit 322 may be controlled to transmit the control signal to a central controller of the lighting control system.

Further, in some examples, the control device 300 may be an accessory control device. In such examples, the control device 300 may not include a controllably conductive device 310 or a drive circuit 312. As such, when the control device 300 does not include the controllably conductive device 310 and the drive circuit 312, the control device 300 may transmit a control signal that includes the control data (e.g., a digital message) generated by the dimmer control circuit 314 to an external device, such as a main dimmer, a system controller, or directly to the lighting load 304. For example, the control device 300 may transmit the digital message wirelessly or via wired communication. The control device 300 may generate the digital message in response to touch actuations (e.g., point actuations or gestures) to adjust one or more operational aspects of the lighting load 304.

The dimmer control circuit 314 may be configured to illuminate visual indicators 360 (e.g., LEDs) to provide feedback of a status of the lighting load 304, to indicate a status of the control device 300, and/or to assist with a control operation (e.g., to provide a color gradient for controlling the color of the lighting load 304, to present backlit virtual buttons for preset, zone, or operational mode selection, etc.). The visual indicators 360 may be configured to illuminate a light bar (e.g., the light bar 220) and/or to serve as indicators of various conditions.

The dimmer control circuit 314 may receive a control signal representative of the zero-crossing points of the AC main line voltage of the AC power source 302 from a zero-crossing detector 316. The dimmer control circuit 314 may be operable to render the controllably conductive device 310 conductive and/or non-conductive at predetermined times relative to the zero-crossing points of the AC waveform using a phase-control dimming technique.

The control device 300 may include a memory 318. The memory 318 may be communicatively coupled to the dimmer control circuit 314 for the storage and/or retrieval of, for example, operational settings, such as, lighting presets and associated preset light intensities. The memory 318 may be implemented as an external integrated circuit (IC) or as an internal circuit of the dimmer control circuit 314. The control device 300 may include a power supply 320. The power supply 320 may generate a direct-current (DC) supply voltage $V_{CC}$ for powering the dimmer control circuit 314 and the other low-voltage circuitry of the control device 300. The power supply 320 may be coupled in parallel with the controllably conductive device 310. The power supply 320 may be operable to conduct a charging current through the lighting load 304 to generate the DC supply voltage $V_{CC}$.

The dimmer control circuit 314 may be responsive to inputs received from actuators 330 and/or a touch sensitive device 350. The dimmer control circuit 314 may control the controllably conductive device 310 to adjust the intensity level of the lighting load 304 in response to the input received via the actuators 330 and/or the touch sensitive device 350. The dimmer control circuit 314 may receive respective input signals from the actuators 330 in response to tactile actuations of the actuators 330 (e.g., in response to movements of the actuators 330). For example, the actuators 330 may be actuated in response to tactile actuations of an upper portion the upper portion 216 and the lower portion 218 of the actuation member 210 of the control device 200. The touch sensitive device 350 may be configured to detect touch actuations (e.g., point actuations and/or gestures), and provide an output signal $V_{OUT}$ to the dimmer control circuit 314 indicating the detection. The dimmer control circuit 314 may be configured to translate the signals received from the actuators 330 and/or the touch sensitive device 350 into control data (e.g., one or more control signals), and cause the control data to be transmitted to the lighting load 304 or a central controller of the load control system.

The touch sensitive device 350 may include a capacitive touch circuit 352 and a user interface control circuit 354. The capacitive touch circuit 352 may comprise one or more capacitive touch elements. For example, the capacitive touch circuit 352 may comprise one or more capacitive touch pads, such as the receiving capacitive touch pads 242 mounted to the capacitive touch PCB 240 of the control device 200. In addition, the capacitive touch circuit 352 may comprise one or more capacitive transmission traces, such as the transmission trace 244, on the capacitive touch PCB 240 of the control device 200. The user interface control circuit 354 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 354 may include a memory and/or may use the memory 318.

The user interface control circuit 354 may be configured to determine or detect a change in the capacitances of the capacitive touch pads of the capacitive touch circuit 352 (e.g., due to a user's finger actuating the front surface 214 of the actuation member 210), and generate the output signal $V_{OUT}$ in accordance with the change in capacitance of the capacitive touch pads. For example, the user interface control circuit 354 may receive one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200), where each capacitive receive signal $V_{RX-A}$-$V_{RX-E}$ indicates the capacitance of a capacitive touch pad.

The user interface control circuit 354 may be configured to determine the position of the touch actuation along the front surface of the actuation member (e.g., along the light bar) in response to the receive signals $V_{RX-A}$-$V_{RX-E}$ generated by the receiving capacitive touch pads. In response, the user interface control circuit 354 may generate and provide the output signal $V_{OUT}$ to the dimmer control circuit 314. The output signal $V_{OUT}$ may indicate the position of the touch actuation along the front surface of the actuation member. The dimmer control circuit 314 may be configured to translate the output signal $V_{OUT}$ into control data (e.g., one or more control signals) for controlling one or more electrical loads. For example, the dimmer control circuit may cause the control data to be transmitted to the lighting load 304 or a central controller of the load control system.

The control device 300 and/or the touch sensitive device 350 (e.g., the user interface control circuit 354) may be configured to operate in an active touch mode and an inactive touch mode. The control device 300 and/or the touch sensitive device 350 may operate in the active touch mode when the actuation member is being actuated, and in an inactive touch mode when the actuation member is not being actuated. The control device 300 and/or the touch sensitive device 350 may be configured to be more resistant to transient noise causing inadvertent touch events when operating in the inactive mode, while also providing a quicker response time while the user is interacting with the touch sensitive surface on the actuation member when operating in the active touch mode (e.g., both in providing feedback to the user through illumination of the visual indicators 360 and in controlling the electrical loads in the load control system).

In some examples, the control device (e.g., the control device 300) may reduce the power used by the control device when in the inactive touch mode (e.g., when the control device is a retrofit remote control device). The dimmer control circuit 314 may reduce or power down internal components of the control device 300 when operating in the inactive touch mode. For example, the dimmer control circuit 314 may control the visual indicators 360 to be at a higher level of illumination during the active touch mode than in the inactive touch mode. Further, the dimmer control circuit 314 may cause the wireless communication circuit 322 of the control device 300 to use less power during the inactive touch mode (e.g., by reducing or eliminating the communication intervals of the wireless communication circuit).

The user interface control circuit 354 may be configured to charge capacitances of the capacitive touch pads of the capacitive touch circuit 352. For example, although not illustrated, the capacitive touch pads of the capacitive touch circuit 352 may be coupled to user interface control circuit 354 via a capacitive transmitting circuit (not shown) and/or a capacitive receiving circuit (not shown). The user interface control circuit 354 may be configured to control the capacitive transmitting circuit to charge capacitances of the capacitive touch pads (e.g., the capacitive touch pads 242) of the capacitive touch circuit 352. For example, the capacitive transmitting circuit may be configured to pull the transmission trace (e.g., the transmission trace 244) of the capacitive touch circuit 352 up towards the supply voltage $V_{CC}$ to charge the capacitances of the capacitive touch pads.

Figure 12B:
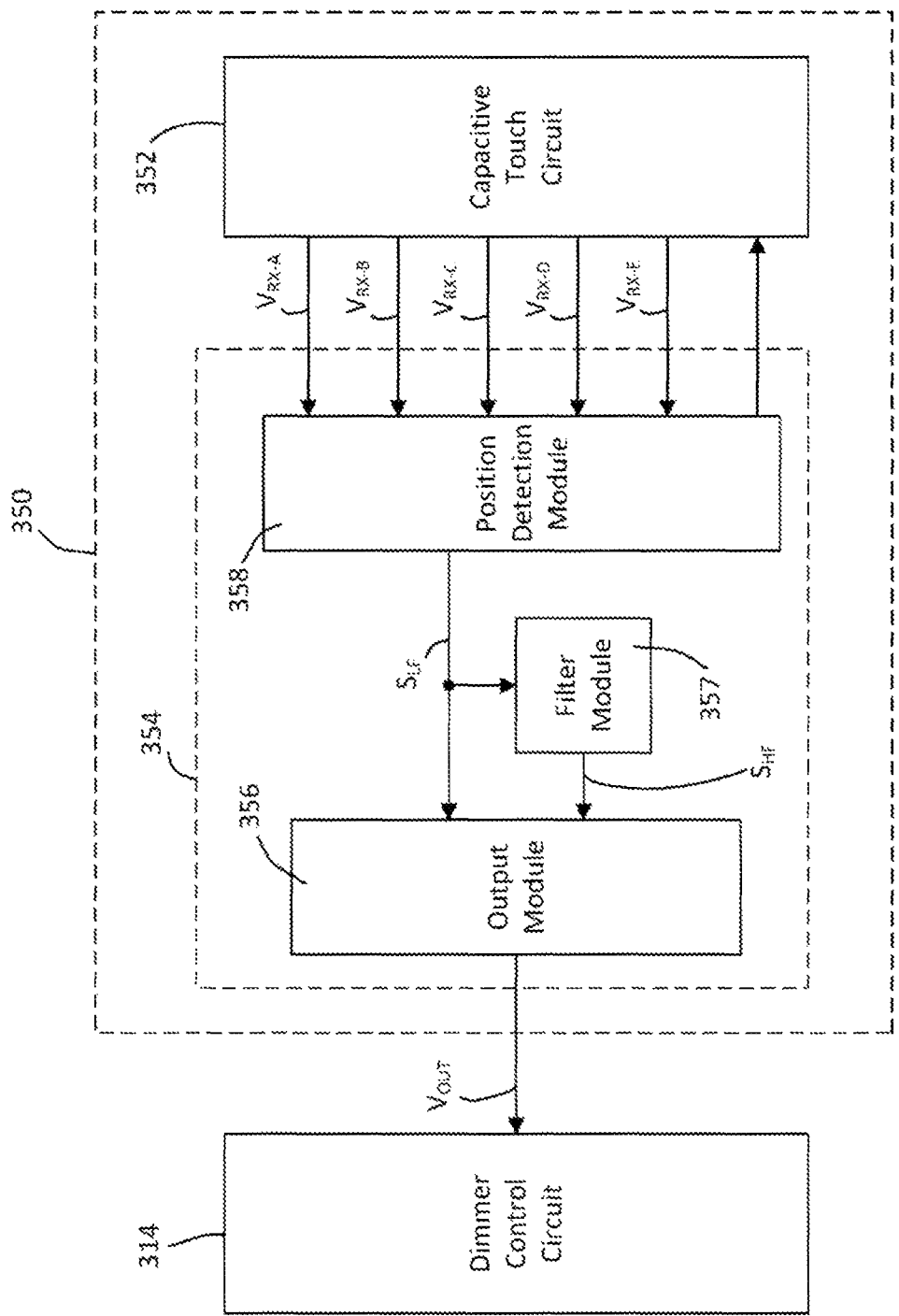
FIG. 12B shows a simplified block diagram of an example touch sensitive device that may be deployed as a touch sensitive device of the load control device illustrated in FIG. 12A.

FIG. 12B shows a simplified block diagram of an example touch sensitive device that may be deployed as the touch sensitive device 350 of the load control device 300 illustrated in FIG. 12A. The user interface control circuit 354 may include an output module 356, a filter module 357, and a position detection module 358. The position detection module 358 may receive the capacitive receive signals $V_{RX-A}$-$V_{RX-E}$ from the capacitive touch circuit 352 and generate a lightly-filtered output signal $S_{LF}$ (e.g., a digital signal). The lightly-filtered output signal $S_{LF}$ may indicate a position of a touch actuation along the capacitive touch circuit 352 (e.g., along the touch sensitive surface of the control device 300). For example, the position detection module 358 may determine the position of a touch actuation along the capacitive touch circuit 352 (e.g., along the touch sensitive surface of the control device 300) using the capacitive receive signals $V_{RX-A}$-$V_{RX-E}$, and generate a signal indicative of this position. The position detection module 358 may be configured to adjust the value of the lightly-filtered output signal $S_{LF}$ to a number $N_{VAL}$ (e.g., 255) of different values. For example, since the dimmer control circuit 314 is configured to control the intensity level of the lighting load 304 to the number $N_{INT}$ of intensity levels between the low-end intensity level $L_{LE}$ and the high-end intensity level $L_{HE}$, the number $N_{VAL}$ of the value to which the position detection module 358 controls the lightly-filtered output signal $S_{LF}$ may be equal to the number $N_{INT}$.

The position detection module 358 may generate the lightly-filtered output signal $S_{LF}$ that represents the position of a touch actuation along the touch sensitive surface in response to the capacitive receive signals $V_{RX-A}$-$V_{RX-E}$. In some examples, the position detection module 358 may apply fast filtering and/or filtering with a shorter time constant (e.g., a shorter response time to the capacitive receive signals $V_{RX-A}$-$V_{RX-E}$) to generate the lightly-filtered output signal $S_{LF}$. Alternatively, the position detection module 358 may not apply any filtering when generating the lightly-filtered output signal $S_{LF}$ in response to the capacitive receive signals $V_{RX-A}$-$V_{RX-E}$. As such, the lightly-filtered output signal $S_{LF}$ may be a lightly-filtered or unfiltered signal that indicates the position of a touch actuation along the touch sensitive surface.

To determine the position of a touch actuation along the touch sensitive surface, the position detection module 358 may be configured to determine or detect a change in the capacitances of capacitive touch pads of the capacitive touch circuit 352 (e.g., due to a user's finger actuating the front surface 214 of the actuation member 210) in response to the capacitive receive signals $V_{RX-A}$-$V_{RX-E}$. For example, the position detection module 358 may receive one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200). The position detection module 358 may step through each of the capacitive touch pads of the capacitive touch circuit 352 and process the capacitive receive signals $V_{RX-A}$-$V_{RX-E}$ to detect a change in the capacitance of the respective capacitive touch pad. For example, the position detection module 358 may periodically charge the capacitance of each of the capacitive touch pads of the capacitive touch circuit 352 and then discharge the capacitance of the respective touch pad into a measurement capacitor (not shown). The measurement capacitor may have a much larger capacitance than the capacitance of each of the capacitive touch pads of the capacitive touch circuit 352, for instance, in some example the measurement capacitor may be 1,000 times larger than the capacitance of each of the capacitive touch pads. The measurement capacitor may define a capacitance that is adjustable by the user interface control circuit 354. The position detection module 358 may be configured to compare the voltage across the capacitor to a voltage threshold $V_{TH}$ to determine the position of a touch actuation along the touch sensitive surface. In some examples, the position detection module 358 may charge and discharge the capacitance of each capacitive touch pad a predetermined number of time (e.g., 500 times) during a sensing interval (e.g., 500 μsec) before moving on the next capacitive touch pad of the capacitive touch circuit 352.

The position detection module 358 may determine a count $N_{CAP}$ that indicates a count of how many times the capacitance of the respective capacitive touch pad was charged and discharged before the voltage across the capacitor exceeds the voltage threshold $V_{TH}$ during each sensing interval. The count $N_{CAP}$ may indicate the present capacitance of the respective capacitive touch pad of the capacitive touch circuit 352. The count $N_{CAP}$ for each of the capacitive touch pads of the capacitive touch circuit 352 may represent a sample of the present capacitance of the respective touch pad during the preceding sensing interval. The position detection module 358 may be configured to process the count $N_{CAP}$ to determine the present capacitance of the respective touch pad of the capacitive touch circuit 352 using a respective baseline count $N_{BL}$ for each of the capacitive touch pads of the capacitive touch circuit 352. The baseline counts $N_{BL}$ may indicate an idle capacitance of each of the capacitive touch pads when the light bar (e.g., the light bar 220) is not being actuated. The position detection module 358 may be configured to determine the respective baseline counts $N_{BL}$ for each of the capacitive touch pads of the capacitive touch circuit 352 when the front surface of the actuation member is not being actuated. For example, the baseline count $N_{BL}$ may be a long-term average of the count $N_{CAP}$ determined by the position detection module 358 from the capacitive receive signals $V_{RX-A}$-$V_{RX-E}$.

The position detection module 358 may process the determined counts $N_{CAP}$ for each of the respective capacitive touch pads of the capacitive touch circuit 352 to detect a touch actuation of the actuation member (e.g., after stepping through each of the capacitive touch pads of the capacitive touch circuit 352 (e.g., after a round of capacitive sensing of the capacitive touch pads)). The position detection module 358 may be configured to determine a change $\Delta_{CAP}$ in the count (e.g., which may indicate the capacitance of each of the capacitive touch pad of the capacitive touch circuit 352) by determining the difference between the respective baseline count $N_{BL}$ from the present count $N_{CAP}$ of the respective capacitive touch pad, e.g., $\Delta_{CAP}=|N_{CAP}-N_{BL}|$. The position detection module 358 may be configured to determine that the touch sensitive surface (e.g., the light bar 220) is being actuated when the change $\Delta_{CAP}$ in count exceeds a capacitance-change threshold $TH_{CAP}$, which may represent a 0.5% to 1% change in the capacitance, for example.

The position detection module 358 may be configured to determine a number $N_{TOUCH-IN}$ of times (e.g., a number of consecutive rounds of capacitive sensing) that the change $\Delta_{CAP}$ in count for one of the capacitive touch pads exceeds the capacitance-change threshold $TH_{CAP}$. The position detection module 358 may place (e.g., or maintain) the capacitive touch pad in an active state when the number $N_{TOUCH-IN}$ exceeds a touch-in threshold $TH_{TOUCH-IN}$. The position detection module 358 may be configured to cause the touch sensitive device 350 to enter or stay in the active touch mode when at least one of the capacitive touch pads is in the active state. When a capacitive touch pad in in the active state, the position detection module 358 may be configured to determine a number $N_{TOUCH-OUT}$ of times (e.g., a number of consecutive rounds of capacitive sensing) that the change $\Delta_{CAP}$ in count for the capacitive touch pads does not exceed the capacitance-change threshold $TH_{CAP}$. The position detection module 358 may be configured to cause the capacitive touch pad to exit the active state (e.g., and enter the inactive state) when the number $N_{TOUCH-OUT}$ exceeds a touch-out threshold $TH_{TOUCH-OUT}$. When all of the capacitive touch pads are in the inactive state, the position detection module 358 may be configured to cause the touch sensitive device 350 to exit the active touch mode.

While in the active touch mode, the position detection module 358 may be configured to determine the position of the touch actuation along the touch sensitive surface (e.g., the light bar) in response to ratios of the changes $\Delta_{CAP}$ in the count for each of the capacitive touch pads of the capacitive touch circuit 352 (e.g., in response to the receive signals $V_{RX-A}$-$V_{RX-E}$ generated by the receiving capacitive touch pads). For example, the ratio of the change $\Delta_{CAP}$ in the count for region B to the change $\Delta_{CAP}$ in the count for region C of the receiving capacitive touch pads 242 of the control device 200 may indicate a position of a touch actuation along the light bar 220 between the regions B and C. In response to determining the position of the touch actuation along the touch sensitive surface, the position detection module 358 may generate the lightly-filtered output signal $S_{LF}$, which may indicate the position of the touch actuation along the touch sensitive surface.

In some examples, the position detection module 358 may be configured with one or more filtering techniques to, for example, reduce or prevent the generation of inadvertent touch events. An inadvertent touch event may be when the touch sensitive device 350 generates the output signal $V_{OUT}$ when there has not been an actual touch actuation of the touch sensitive surface on the front surface of the actuation member by a user. In some examples, the position detection module 358 is configured with a debouncing algorithm as the filtering technique, although other filtering techniques may be used. The debouncing algorithm may allow for the configuration of a debounce time, which defines a number of consecutive samples (e.g., counts $N_{CAP}$ during consecutive sensing intervals) for one of capacitive touch pads of the capacitive touch circuit 352 that the position detection module 358 must detect prior to the position detection module 358 generating the lightly-filtered output signal $S_{LF}$ (e.g., or prior to the touch sensitive device 350 generating the output signal $V_{OUT}$ and providing the output signal $V_{OUT}$ to the dimmer control circuit 314).

A longer debouncing time may require that the position detection module 358 detects a greater number of consecutive samples prior to generating the lightly-filtered output signal $S_{LF}$. A longer debouncing time allows for greater protection against transient noise causing inadvertent touch actuations, but also has the disadvantage of reducing the response time of the load control device 300 to actual touch actuations by a user. In other words, increasing the debouncing time may increase the amount of time the user must touch the touch sensitive surface of the actuation member before the touch sensitive device 350 generates the output signal $V_{OUT}$ and/or registers a touch actuation. For example, a user may touch the touch sensitive surface with a finger and then proceed to move the finger along the touch sensitive surface to adjust the intensity level of a lighting load. However, with a long debouncing time, the touch sensitive device 350 may not register the entirety of this movement along the touch sensitive surface if the movement occurs too fast. As such, the response from the load control device may appear "choppy" if the one of the capacitive touch pads does not register the user's touch (e.g., the load control device may register the movement as a "jump" from a one intensity level (e.g., a low intensity level) to another intensity level (e.g., a high intensity level) without registering one or more intensity levels between the starting and ending intensity levels. So, an increased debouncing time may result in a user having to move a finger along the touch sensitive surface in a slower motion if they would like to receive smooth control or adjustment of the lighting load between the intensity levels.

When using filtering techniques such as a debouncing algorithm to address the generation of inadvertent touch events, the position detection module 358 may be configured with multiple different debounce times that differ based on the state and/or mode of the control device 300. For example, the position detection module 358 may be configured with different debounce times based on whether the touch sensitive device 350 is or is not in the active touch mode. The position detection module 358 may be configured with a first debounce time (e.g., eight samples, or 80 milliseconds) when the touch sensitive device 350 is not in the active touch mode (e.g., when the touch sensitive device 350 is in an inactive touch mode), and may be configured with a second debounce time (e.g., two samples, or 20 milliseconds) when the touch sensitive device 350 is in the active touch mode. In some examples, the position detection module 358 may turn off the filtering technique when the touch sensitive device 350 in the active touch mode (e.g., such that the second debounce time is 0 milliseconds). Accordingly, through the use of more than one debounce time, the control device 300 may be more resistant to transient noise causing inadvertent touch events (e.g., when in the inactive touch mode), while also providing a quicker response time while the user is interacting with the touch sensitive surface on the actuation member (when in active touch mode). For example, through the use of a shorter debounce time while in active touch mode, the control device may more quickly provide feedback to the user through illumination of the visual indicators 360 and more quickly control the amount of power delivered to the electrical loads in the load control system.

Although described with reference to a debouncing algorithm, the position detection module 358 may incorporate any number of other filtering techniques, including multiple techniques, such as, but not limited to a count filter and/or a long term average filter. If a different filtering technique(s) is incorporated, the position detection module 358 may configure the filtering technique differently depending on whether the touch sensitive device 350 is or is not in active touch mode. For example, the position detection module 358 may configure the filtering technique to have a longer time constant (e.g., a longer response time) when the touch sensitive device 350 is not in the active touch mode than when the touch sensitive device 350 is in the active touch mode.

The position detection module 358 may generate the lightly-filtered output signal $S_{LF}$, which may be received by the output module 356 and the filter module 357 of the touch sensitive device 350. The lightly-filtered output signal $S_{LF}$ may indicate a position of a touch actuation along the capacitive touch circuit 352 (e.g., along the touch sensitive surface of the control device 300). It should also be appreciated that the position detection module 358 may apply fast filtering or no filtering at all to generate the lightly-filtered output signal $S_{LF}$ in response to the capacitive receive signals $V_{RX-A}$-$V_{RX-E}$. As such, the lightly-filtered output signal $S_{LF}$ may be a lightly-filtered signal that indicates the position of a touch actuation along the touch sensitive surface, or the lightly-filtered output signal Su may be an unfiltered signal that indicates the position of a touch actuation along the touch sensitive surface.

The filter module 357 may include a digital filter, such as a digital low-pass filter. The filter module 357 may filter the lightly-filtered output signal $S_{LF}$ using heavy filtering (e.g., slower filtering and/or filtering with a longer time constant than the filtering performed by the position detection module 358) to generate a heavily-filtered output signal $S_{HF}$. The filter module 357 may provide the heavily-filtered output signal $S_{HF}$ to the output module 356. As such, the output module 356 may receive the lightly-filtered output signal $S_{LF}$ and the heavily-filtered output signal $S_{HF}$.

The heavily-filtered output signal $S_{HF}$ may also indicate a position of a touch actuation along the capacitive touch circuit 352 (e.g., along the touch sensitive surface of the control device 300), albeit a more heavily-filtered version of the lightly-filtered output signal $S_{LF}$. For example, the lightly-filtered output signal Su may fluctuate or alternate between values more frequently than the heavily-filtered output signal $S_{HF}$, so the instantaneous values of the lightly-filtered output signal Su may be less accurate than those of the heavily-filtered output signal $S_{HF}$. However, due to the filtering performed by the filter module 357 to generate the heavily-filtered output signal $S_{HF}$, a change in the position of the touch actuation may result in a change in the lightly-filtered output signal $S_{LF}$ more quickly than in the heavily-filtered output signal $S_{HF}$. In some examples, the position detection module 358 may perform light filtering that is characterized by a shorter time constant (e.g., a fast filter (e.g., an average of 8 samples)) to generate the lightly-filtered output signal $S_{LF}$ in response to the capacitive receive signals $V_{RX-A}$-$V_{RX-E}$, while the filter module 357 may perform heavy filtering that is characterized by a longer time constant (e.g., a slow filter (e.g., an average of 32 samples)) to generate the heavily-filtered output signal $S_{HF}$. In other examples, the position detection module 358 may perform no filtering to generate the lightly-filtered output signal $S_{LF}$ in response to the capacitive receive signals $V_{RX-A}$-$V_{RX-E}$, while the filter module 357 may perform heavy filtering to generate the heavily-filtered output signal $S_{HF}$.

When controlling the amount of power delivered to electrical loads (e.g., the intensity level of lighting loads) based on touch actuations (e.g., point actuations) of the touch sensitive surface, the control device 300 may be configured to balance accuracy and resolution with responsiveness. The position detection module 358 may be configured to adjust the value of the lightly-filtered output signal $S_{LF}$ to one of the number $N_{VAL}$ (e.g., 255) of values between a top value (e.g., when a touch actuation is at the top of the light bar 220) and the bottom value (e.g., when a touch actuation is at the bottom of the light bar 220) in response to the capacitive receive signals $V_{RX-A}$-$V_{RX-E}$. As a result, the touch sensitive device 350 may define a number of touch sections along the touch sensitive surface. For instance, in some examples, the touch sensitive device 350 may define 255 touch sections across the touch sensitive surface, where each section is approximately 8 mm in length. By contrast, the average human fingertip contacts the touch sensitive surface with approximately 50 mm in length. Further, the force of the user's finger on the touch sensitive surface and/or the angle at which the user's finger contacts the touch sensitive surface may affect the contact area of the touch actuation. The contrast between the relatively small size of each touch section in comparison to the larger contact area of the user's finger may make it difficult for the touch sensitive device 350 to be both highly responsive to changes in position of touch actuations and at the same time not susceptible to minor movements of the user's finger (e.g., be accurate with a high level of resolution). The touch sensitive device 350 may use one or more filtering techniques to, for example, find a balance between accuracy/resolution and responsiveness.

The output module 356 may determine whether a plurality of consecutive touch actuations (e.g., point actuations) (e.g., as indicated by the values of the lightly-filtered output signal $S_{LF}$) over a predetermined period of time indicate whether a gross adjustment or a fine-tune adjustment of the touch actuation along the touch sensitive surface is occurring and, in response, use a light-filtering or heavy-filtering technique, respectively. For example, the output module 356 may generate the output signal $V_{OUT}$ using either the lightly-filtered output signal $S_{LF}$ or the heavily-filtered output signal $S_{HF}$ based on whether a gross or fine-tune adjustment is occurring. For example, the output module 356 may generate the output signal $V_{OUT}$ using the lightly-filtered output signal $S_{LF}$ (e.g., set the output signal $V_{OUT}$ to the lightly-filtered output signal $S_{LF}$) in response to a determination that the plurality of consecutive point actuations indicate a gross adjustment along the touch sensitive surface. And the output module 356 may generate the output signal $V_{OUT}$ using the heavily-filtered output signal $S_{HF}$ (e.g., set the output signal $V_{OUT}$ to the heavily-filtered output signal $S_{HF}$) in response to a determination that the plurality of consecutive point actuations indicate a fine-tune adjustment along the touch sensitive surface. As such, the control device 300 may be quicker to adjust an amount of power delivered to the one or more electrical loads (e.g., control the intensity level of a lighting load) in response to point actuations across a greater distance of the touch sensitive surface (e.g., using the lightly-filtered output signal $S_{LF}$), and slower to control an amount of power delivered to the one or more electrical loads (e.g., control the intensity level of a lighting load) in response to touch actuations across a smaller distance (e.g., using the heavily-filtered output signal $S_{HF}$). The control device 300 may be more sensitive to point actuations across a greater distance of the touch sensitive surface (e.g., using the lightly-filtered output signal $S_{LF}$), and less sensitive to touch actuations across a smaller distance (e.g., using the heavily-filtered output signal $S_{HF}$)

The output module 356 may be configured to determine the positions of a plurality of consecutive point actuations along the touch sensitive surface using the lightly-filtered output signal $S_{LF}$. Next, the output module 356 may be configured to determine if the positions of the plurality of consecutive point actuations fall within a predetermined range. The predetermined range may be, for example, approximately 2% of the number $N_{INT}$ (e.g., 255) of intensity levels between the low-end intensity level $L_{LE}$ and the high-end intensity level $L_{HE}$ (e.g., the predetermined range may be approximately 5 of the 255 touch sections along the touch sensitive surface). For example, the output module 356 may be configured to determine if the positions of the plurality of consecutive point actuations fall within the predetermined range by determining a number $N_{SLF}$ (e.g., 30) of the most recent values of the lightly-filtered output signal $S_{LF}$. The output module 356 may determine the number $N_{SLF}$ of the most recent values of the lightly-filtered output signal $S_{LF}$ using a sliding window (e.g., approximately the last 30 samples and/or approximately the last 250 milliseconds of the lightly-filtered output signal $S_{LF}$). The output module 356 may determine a minimum value and a maximum value for a plurality of consecutive point actuations over a predetermined period of time. For example, the output module 356 may determine a minimum value and a maximum value of the values of the lightly-filtered output signal $S_{LF}$ that are inside of the sliding window (e.g., that are within a period of time, such as the last 250 milliseconds), and then determine whether the difference between the maximum value and the minimum value is less than or equal to a signal-change threshold $TH_{SIG}$. The signal-change threshold $TH_{SIG}$ may be, for example, approximately 2% of the number $N_{VAL}$ (e.g., 255) of values between the top value and the bottom value of the lightly-filtered output signal $S_{LF}$ (e.g., the predetermined range may be approximately 5). The output module 356 may determine to use the heavily-filtered output signal $S_{HF}$ to generate the output signal $V_{OUT}$ when changes in the positions of point actuations across the capacitive touch circuit are within the predetermined range (e.g., when the difference between the maximum value and the minimum value is less than or equal to the signal-change threshold $TH_{SIG}$). And, the output module 356 may be configured to determine to use the lightly-filtered output signal $S_{LF}$ to generate the output signal $V_{OUT}$ when changes in the positions of point actuations across the capacitive touch circuit (e.g., at least one of the minimum or maximum values) fall outside of the predetermined range (e.g., when the different between the maximum value and the minimum value is greater than the signal-change threshold $TH_{SIG}$).

Alternatively, in some examples, in response to determining that a fine-tune adjustment is occurring along the touch sensitive surface, the touch sensitive device may be configured to change the filtering characteristics of the filter module 357 to alter the characteristics of the heavily-filtered output signal $S_{HF}$ based on the level of adjustment that is occurring along the touch sensitive surface (e.g., based on the degree of fine-tune or gross adjustment that is occurring), and the use the heavily-filtered output signal $S_{HF}$ to generate the output signal $V_{OUT}$. This solution may allow the user interface control circuit 352 to dynamically adjust the filtering performed on the lightly-filtered output signal $S_{LF}$ based on the degree of adjustment being performed by the user.

When the output module 356 uses the lightly-filtered output signal $S_{LF}$ to generate the output signal $V_{OUT}$, the dimmer control circuit 314 may be configured to adjust the power delivered to the electrical load (e.g., the intensity level of a lighting load) by gross or large increments. So, the dimmer control circuit 314 may be configured to adjust the power delivered to the electrical load (e.g., the intensity level of a lighting load) by gross or large increments in response to receiving the output signal $V_{OUT}$ that indicates gross or large movements of a user's finger across the touch sensitive surface (e.g., the output signal $V_{OUT}$ that is generated based on the lightly-filtered output signal $S_{LF}$). Conversely, when the output module 356 uses the heavily-filtered output signal $S_{HF}$ to generate the output signal $V_{OUT}$, the dimmer control circuit 314 may be configured to adjust the power delivered to the electrical load (e.g., the intensity level of a lighting load) by fine or small increments. As such, the dimmer control circuit 314 may be configured to adjust the power delivered to the electrical load (e.g., the intensity level of a lighting load) by fine or small increments in response to receiving the output signal $V_{OUT}$ that indicates fine or small movements of a user's finger across the touch sensitive surface (e.g., the output signal $V_{OUT}$ that is generated based on the heavily-filtered output signal $S_{HF}$).

Although described as being performed by the output module 356, the filter module 357, and/or the position detection module 358, any of the actions performed above may be performed by the user interface control circuit 354, for example, in instances where the user interface control circuit 354 does not include one or more of the output module 356, the filter module 357, or the position detection module 358. Further, it should be appreciated that in response to receiving the output signal $V_{OUT}$, the dimmer control circuit 314 may be configured to control the controllable conductive device 310 in response to the output signal $V_{OUT}$ and/or may be configured to transmit a message indicating the output signal $V_{OUT}$ to another load control device, a lighting device, and/or a system controller via the communication circuit 322.

Finally, it should be appreciated that, although described with reference to the user interface control circuit 354 of the touch sensitive device 350, the filtering techniques described herein may be performed by the dimmer control circuit 314. For example, the dimmer control circuit 314 may configure the one or more filtering techniques with different variables based on whether the dimmer control circuit 314 and/or the touch sensitive device 350 is in the active touch mode or the inactive touch mode, for example, to reduce or prevent the generation of inadvertent touch events. Further, the dimmer control circuit 314 may perform separate, inherent filtering that is separate and distinct from the filtering performed by the touch sensitive device 350.

Further, in some examples, the control device 300 may allow a user to set or adjust one or more filtering techniques using an advanced programming mode. For example, when in an advanced programming mode, the control device 300 may allow a user to adjust the filtering techniques used in active touch mode and/or inactive touch mode (e.g., switch between different types of filtering techniques, such as light and heavy filtering). Alternatively or additionally, the control device 300 may allow a user to adjust the variables used for the filtering technique when in active touch mode and/or inactive touch mode. Finally, in some examples when the control device 300 is in the advanced programming mode, the control device 300 may allow the user to adjust one or more parameter values of the touch sensitive device 350. These parameter values may include any combination of the voltage threshold $V_{TH}$, the capacitance-change threshold $TH_{CAP}$, the touch-in threshold $TH_{TOUCH-IN}$, the touch-out threshold $TH_{TOUCH-OUT}$, the signal-change threshold $TH_{SIG}$, a coarse gain of the touch sensitive device 350 (e.g., ui8CoarseGain), a fine gain of the touch sensitive device 350 (e.g., ui8FineGain), and/or an offset, such as an offset subtraction of the touch sensitive device 350 (e.g., ui16Offset).

Although the control device 300 is described as a dimmer switch, in other examples, the control device 300 may be implemented as a retrofit remote control device, such as the retrofit remote control device 112 in the lighting control system 100. In such examples, some of the components illustrated in FIG. 12A may be omitted from the control device 300. For instance, if the control device 300 is implemented as a retrofit remote control device, any combination of the hot terminal H and dimmed hot terminal DH, the controllably conductive device 310, the drive circuit 312, the zero-cross detector 316, and the air-gap switch 329 may be omitted from the control device 300. As such, when implemented as a retrofit remote control device, the control device 300 may include the dimmer control circuit 314, the memory 318, the power supply 320, the wireless communication circuit 322, the actuators 330, the touch sensitive device 350, and/or the visual indicators 360.

Figure 13:
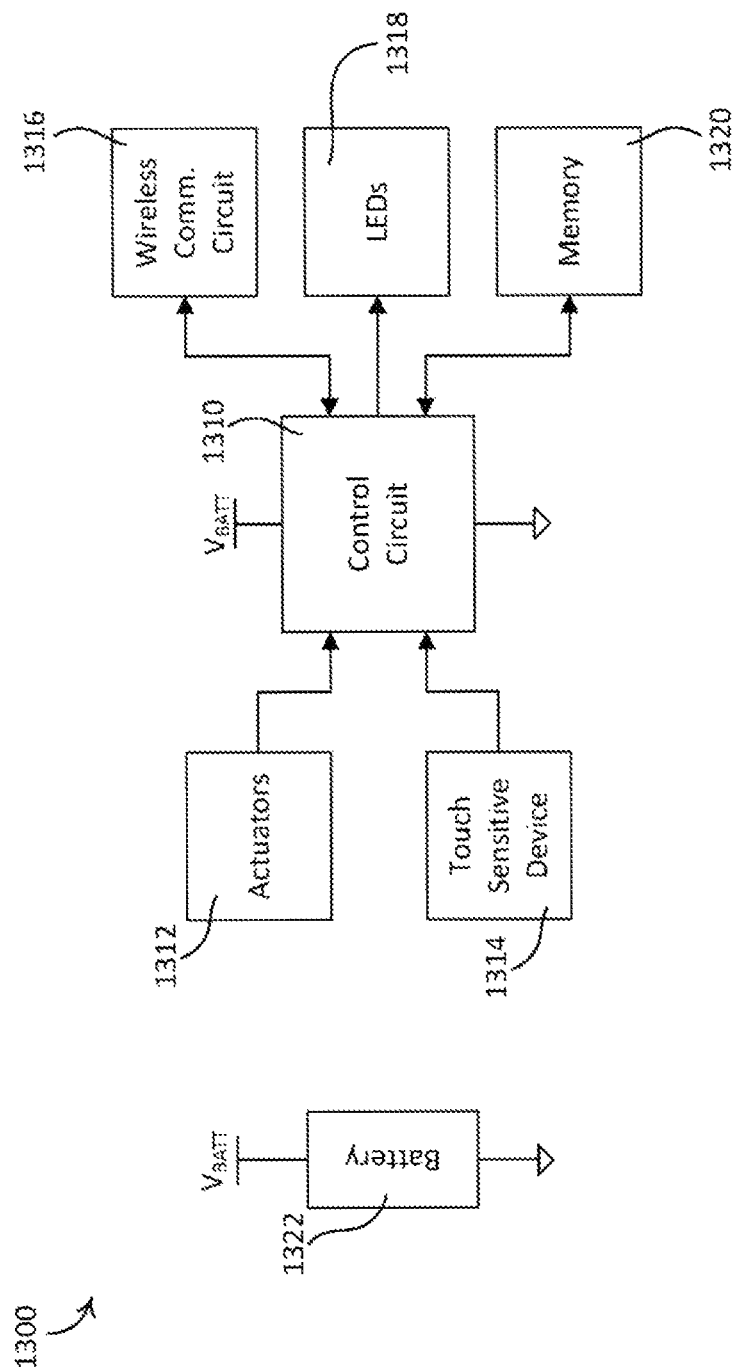
FIG. 13 is a block diagram of an example control device that may be deployed as the remote control device 1200 of FIGS. 6-11.

FIG. 13 is a block diagram of an example control device 1300 (e.g., a remote control device), which may be deployed as the remote control device 1200 of FIGS. 6-11. Further, it should be appreciate that the control device 1300 may be deployed as the remote control device 112, the wall-mounted remote control device 114, the tabletop remote control device 116, and/or the handheld remote control device 118 of the lighting control system 100 of FIG. 1. The control device 1300 may include a control circuit 1310, one or more actuators 1312 (e.g., buttons and/or switches), a touch sensitive device 1314, a wireless communication circuit 1316, one or more LEDs 1318, a memory 1320, and/or a battery 1322. The memory 1320 may be configured to store one or more operating parameters (e.g., such as a preconfigured color scene or a preset light intensity level) of the control device 1300. The battery 1322 may provide power to one or more of the components shown in FIG. 13.

The actuators 1312 (e.g., a mechanical tactile switches) that may be actuated in response to a tactile actuation of one or more respective buttons of the control device (e.g., the actuation member 1232 of the remote control device 1200).

The actuators 1312 may be configured to send respective input signals to the control circuit 1310 in response to actuations of the buttons. The touch sensitive device 1314 may be an example of the touch sensitive device 350, and as such, the touch sensitive device 1314 may perform one or more of the functions described with references to the touch sensitive device 350. For example, the touch sensitive device 1314 may comprise any combination of a user interface control circuit (e.g., such as the user interface control circuit 354), an output module (e.g., such as the output module 356), a filter module (e.g., such as the filter module 357), a position detection module (e.g., such as the position detection module 358), and/or a capacitive touch circuit (e.g., such as the capacitive touch circuit 352). Further, the control circuit 1310 may perform one or more of the functions described with reference to the dimmer control circuit 314 (e.g., with the exclusion of controlling a drive circuit or performing zero-cross detection). That is, the control device 1300 may not comprise an internal load control device, but the control circuit 1310 may be configured to transmit (e.g., wirelessly transmit) message (e.g., digital messages) for controlling one or more electrical loads in response to tactile and/or touch actuations of the actuation member.

The touch sensitive device 1314 may include a capacitive or resistive touch element arranged behind, for example, the actuation member 1232 of the remote control device 1200. The touch sensitive device 1314 may be responsive to a touch actuation of, for example, the touch sensitive surface the actuation member 1232. The touch sensitive device 1314 may be configured to detect touch actuations, such as point actuations and/or gestures (e.g., the gestures may be effectuated with or without physical contacts with the touch sensitive device 1314) and provide respective output signals (e.g., such as the output signal $V_{OUT}$) to the control circuit 1310 indicating the detection (e.g., indicating a position of the touch actuation along the touch sensitive surface of the actuation member 1232).

The control circuit 1310 may be configured to translate the input signals provided by the actuators 1312 and/or the output signals provided by the touch sensitive device 1314 into control data (e.g., digital control signals) for controlling one or more electrical loads. The control circuit 1310 may cause the control data (e.g., digital control signals) to be transmitted to the electrical loads via the wireless communication circuit 1316. For example, the wireless communication circuit 1316 may transmit a control signal including the control data to the one or more electrical loads or to a central controller of the concerned load control system. The control circuit 1310 may control the LEDs 1318 to illuminate a visual indicator (e.g., the light bar 1239 of the remote control device 1200) to provide feedback about various conditions.

It should be appreciated that the example remote control device 1200 illustrated and described herein may provide a simple retrofit solution for an existing switched control system and may ease the installation of a load control system or enhance an existing load control system installation. A load control system that integrates one or more remote control devices 1200 may provide energy savings and/or advanced control features, for example without requiring any electrical re-wiring and/or without requiring the replacement of any existing mechanical switches.

Figure 14A:
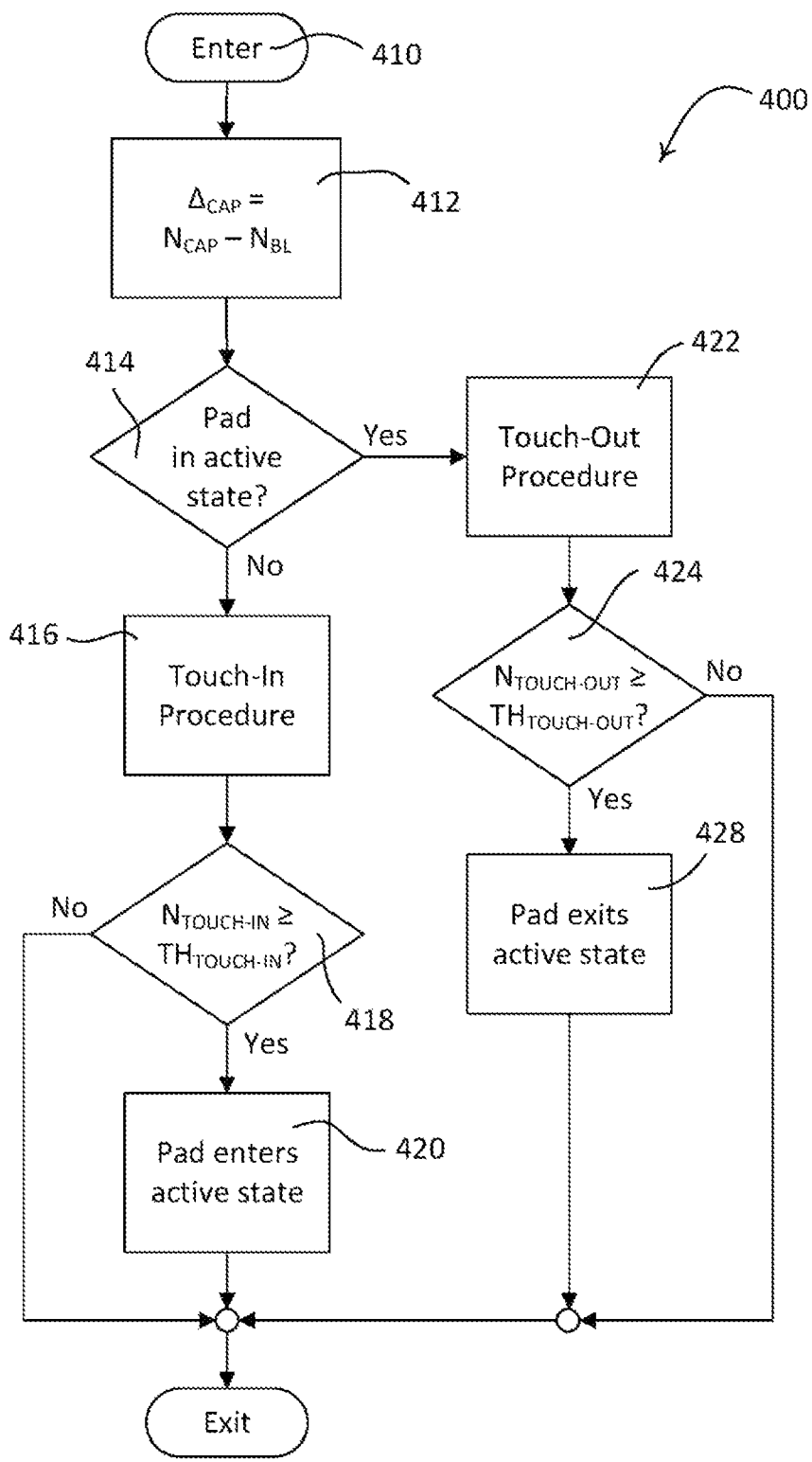
FIG. 14A is a flowchart of an example procedure 400 that may be executed by a control circuit of a control device, for example, to move a capacitive touch pad into or out of an active state.

FIG. 14A is a flowchart of an example procedure 400 that may be executed by a control circuit of a control device (e.g., the user interface control circuit 354 of the control device 300 and/or a user interface control circuit of the touch sensitive device 1314). For example, a position detection module of a control circuit (e.g., the position detection module 358 of the user interface control circuit 354) may execute the procedure 400. The control circuit may include a touch sensitive device that includes one or more of the capacitive touch pads, and the control circuit may repeat the procedure 400 for each of the capacitive touch pads (e.g., the regions A-E of the capacitive touch circuit 352). The control circuit may perform the procedure 400 to move a capacitive touch pad into or out of an active state. For example, the control circuit may execute the procedure 400 periodically (e.g., approximately every 8 milliseconds) at 410.

At 412, the control circuit may determine a change $\Delta_{CAP}$ in the count for the present capacitive touch pad of the capacitive touch circuit by determining the difference between the present count $N_{CAP}$ and the baseline count $N_{BL}$ for the present capacitive touch pad. For example, and as noted above, the control circuit may be configured to determine a number $N_{TOUCH-IN}$ of times (e.g., a number of consecutive rounds of capacitive sensing) that the change $\Delta_{CAP}$ in count for the capacitive touch pad exceeds the capacitance-change threshold $TH_{CAP}$, and the control circuit may place (e.g., or maintain) a capacitive touch pad in the active state when the number $N_{TOUCH-IN}$ exceeds a touch-in threshold $TH_{TOUCH-IN}$. Similarly, when a capacitive touch pad in in the active state, the control circuit may be configured to determine a number $N_{TOUCH-OUT}$ of times (e.g., a number of consecutive rounds of capacitive sensing) that the change $\Delta_{CAP}$ in count for the capacitive touch pads does not exceed the capacitance-change threshold $TH_{CAP}$, and cause the capacitive touch pad to exit the active state (e.g., and enter the inactive state) when the number $N_{TOUCH-OUT}$ exceeds a touch-out threshold $TH_{TOUCH-OUT}$.

At 414, the control circuit may determine whether the capacitive touch pad is in an active state. When the control circuit is determines that the present capacitive touch pad is not in the active state at 414, the control circuit may execute a touch-in procedure for the present capacitive touch pad at 416. For example, the control circuit may execute the touch-in procedure for the present capacitive touch pad to determine a number $N_{TOUCH-IN}$ of times that the change $\Delta_{CAP}$ in the count for the present capacitive touch pad has exceeded the capacitance-change threshold $TH_{CAP}$.

At 418, the control circuit may determine whether the number $N_{TOUCH-IN}$ determined at 416 for the present capacitive touch pad exceeds a touch-in threshold $TH_{TOUCH-IN}$. If the control circuit determines that the number $N_{TOUCH-IN}$ for the present capacitive touch pad is less than the touch-in threshold $TH_{TOUCH-IN}$ at 418, the capacitive touch pad may remain in the inactive state and the procedure 400 may exit. However, if the number $N_{TOUCH-IN}$ for the capacitive touch pad is greater than or equal to the touch-in threshold $TH_{TOUCH-IN}$ at 418, the control circuit may place the capacitive touch pad in an active state, and the procedure 400 may exit.

When the present capacitive touch pad is in the active state at 414, the control circuit may execute a touch-out procedure for the present capacitive touch pad at 422. For example, the control circuit may execute the touch-out procedure for the present capacitive touch pad to determine a number $N_{TOUCH-OUT}$ of times that the change $\Delta_{CAP}$ in the count for the present capacitive touch pad has not exceeded the capacitance-change threshold $TH_{CAP}$. For example, the control circuit may determine the number $N_{TOUCH-OUT}$ of times that the change $\Delta_{CAP}$ in the count is less than (e.g., not exceeding) the capacitance-change threshold $TH_{CAP}$ for the present capacitive touch pad.

At 424, the control circuit may determine whether the number $N_{TOUCH-OUT}$ determined at 422 exceeds a touch-out threshold $TH_{TOUCH-OUT}$ for the present capacitive touch pad. If the control circuit determines that the number $N_{TOUCH-OUT}$ for a present capacitive touch pad is greater than or equal to the touch-out threshold $TH_{TOUCH-OUT}$, the control circuit may remove the capacitive touch pad from the active state at 428. However, if the control circuit determines that the number $N_{TOUCH-OUT}$ for the capacitive touch pad is less than the touch-out threshold $TH_{TOUCH-OUT}$ at 424, the present capacitive touch pad may stay in the active state and the procedure 400 may exit. As noted above, the control circuit may repeat the procedure 400 for each of the capacitive touch pads of the touch sensitive device, for example, to determine and/or change the state of each of the capacitive touch pads.

Figure 14B:
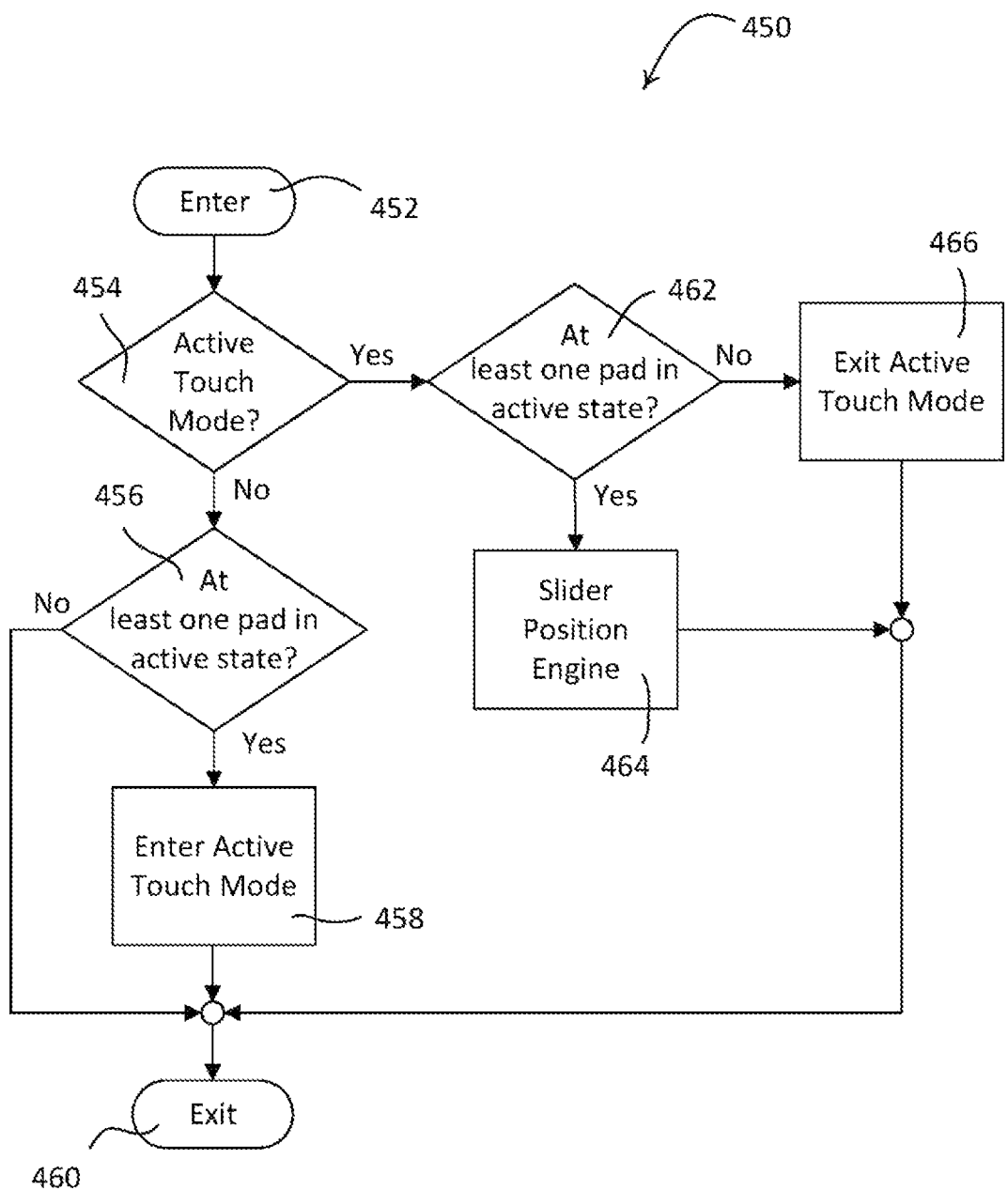
FIG. 14B is a flowchart of an example procedure 450 that may be executed by a control circuit of a control device, for example, to switch between active touch mode and inactive touch mode.

FIG. 14B is a flowchart of an example procedure 450 that may be executed by a control circuit of a control device (e.g., the user interface control circuit 354 of the control device 300 and/or a user interface control circuit of the touch sensitive device 1314), for example, in response to an actuation of a touch sensitive surface (e.g., an actuation of the touch sensitive surface of the actuation member 210 along the light bar 220, and/or an actuation of the touch sensitive surface of the actuation member 1232 along the light bar 1239). For example, a position detection module of a control circuit (e.g., the position detection module 358 of the user interface control circuit 354) may execute the procedure 400. The control circuit may perform the procedure 400 to switch between active touch mode and inactive touch mode, and to execute a slider position engine in response to an actuation of a touch sensitive surface when in active touch mode. For example, the control circuit may execute the procedure 400 periodically (e.g., approximately every 8 milliseconds) at 452.

At 454, the control circuit may determine whether it is in active touch mode or inactive touch mode. If the control circuit is not in active touch mode (e.g., is in inactive touch mode) at 454, the control circuit may determine whether at least one of the capacitive touch pads of the touch sensitive device is in the active state at 456. In some examples, the capacitive touch pads may be moved between the active and inactive state using the procedure 400. If none of the capacitive touch pads is in the active state at 456, then the procedure 450 may simply exit. Stated another way, if all of the capacitive touch pads are in the inactive state while the control circuit is in the inactive touch mode, the procedure 400 may exit. However, if the control circuit determines that at least one of the capacitive touch pads is in the active state at 456, the control circuit may enter the active touch mode at 458, and the procedure 400 may exit. For example, if the control circuit determines that the number $N_{TOUCH-IN}$ for at least one of the capacitive touch pads is greater than or equal to the touch-in threshold $TH_{TOUCH-IN}$, the control circuit may place that capacitive touch pad into the active state. And, all it takes is at least one of the capacitive touch pads to be in the active state for the control circuit to enter the active touch mode.

If the control circuit is in active touch mode at 454, the control circuit may determine whether at least one of the capacitive touch pads are in the active state at 462. If none of the capacitive touch pads is in the active state at 462, the control device may exit the active touch mode at 466, and the procedure 450 may exit. Stated another way, if all of the capacitive touch pads are in the inactive state while the control circuit is in the active touch mode, the control device may exit the active touch mode (e.g., enter the inactive touch mode) at 466, and the procedure 450 may exit.

When the control circuit determines that at least one of the capacitive touch pads is in the active state at 462, the control circuit may execute the slider position engine at 464. The control circuit may execute the slider position engine at 464 to determine and update the position of the touch actuation, for example, based on the capacitive touch pad(s). For example, the slider position engine may be part of a position detection module of a control circuit (e.g., the position detection module 358 of the user interface control circuit 354). And the slider position engine may update an unfiltered or lightly-filtered signal, such as the lightly-filtered signal $S_{LF}$, based on the updated the position of the touch actuation. After the control circuit executes the slider position engine at 464, the procedure 450 may exit.

Figure 15:
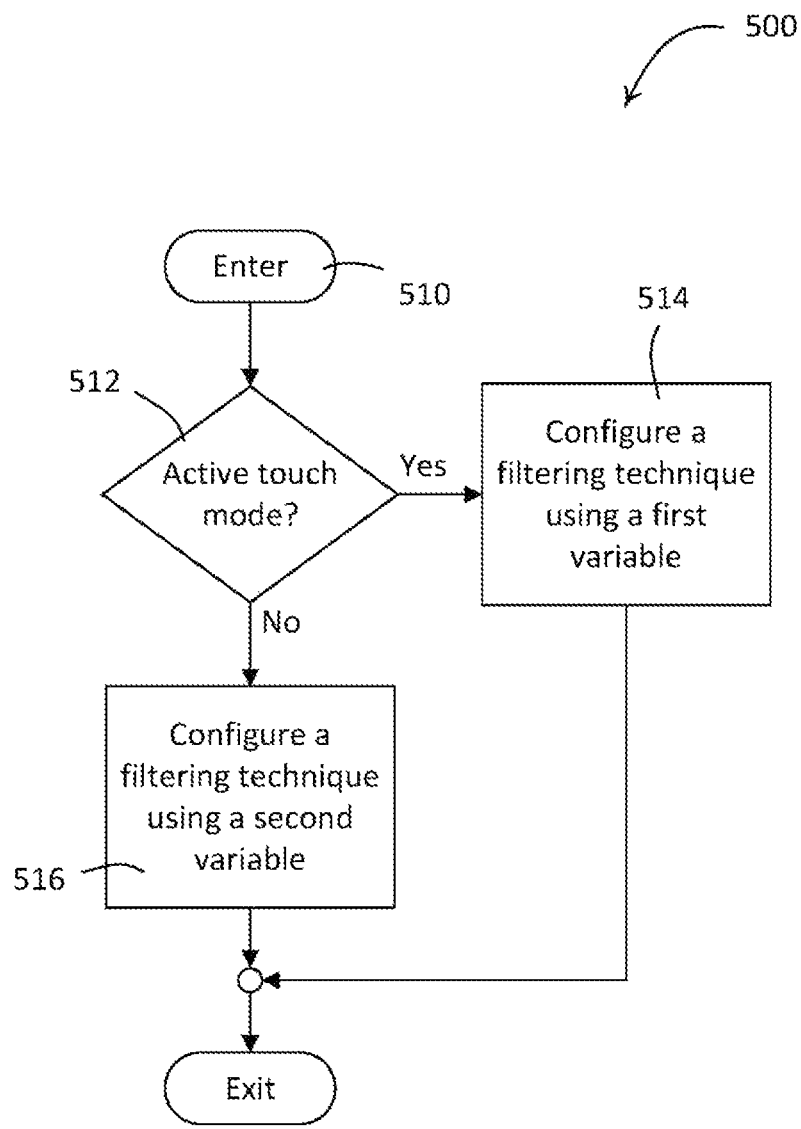
FIG. 15 is a flowchart of an example procedure that may be executed by a control circuit of the load control device to reduce or prevent the generation of inadvertent touch events.

FIG. 15 is a flowchart of an example procedure 500 that may be executed by a control circuit of the load control device (e.g., the dimmer control circuit 314 and/or the user interface control circuit 354 of the control device 300, and/or the control circuit 1310 and/or a user interface control circuit of the touch sensitive device 1314 of the remote control device 1300) to, for example, reduce or prevent the generation of inadvertent touch events. For example, a position detection module of a control circuit (e.g., the position detection module 358 of the user interface control circuit 354) may execute the procedure 500. The control circuit may be configured to perform the procedure 500 periodically (e.g., every 5 milliseconds) at 510. For example, the control circuit may perform the procedure 450 after performing the procedure 400 shown in FIG. 14B.

At 512, the control circuit may determine whether the control circuit is in the active touch mode or the inactive mode. In the active touch mode, the control circuit may be configured to detect the position of the touch actuation along the actuation member in response to respective signals (e.g., the capacitive receive signals $V_{RX-A}$-$V_{RX-E}$) received from the one or more receiving capacitive touch pads to control the electrical loads according to the determined position (e.g., by generating the output signal $V_{OUT}$). Further, when in the active touch mode, the control circuit may be configured with a filtering technique having a first variable at 514. For example, the control circuit may be configured with a debouncing algorithm having a first bounce time (e.g., two samples, or 20 milliseconds) when the control circuit is in the active touch mode. For example, when the debouncing algorithm has the first bounce time, the touch-in threshold $TH_{TOUCH-IN}$ used in the procedure 400 may be set to two. Accordingly, the control device may be configured to provide a quicker response time while the user is interacting with the actuation member (e.g., in providing feedback to the user through illumination of visual indicators and/or in controlling the electrical loads in the load control system in response to touch actuations), as compared to when operating in inactive touch mode. Further, it should be appreciated that in some examples, the control circuit may turn off the filtering technique when in the active touch mode, for example, such that the first debounce time is 0 milliseconds. Thereafter, the procedure 500 may exit.

When in the inactive touch mode, the control circuit may be configured with a filtering technique having a second variable at 516. For example, the control circuit may be configured with the debouncing algorithm having a second, different bounce time (e.g., eight samples, or 80 milliseconds) when the control circuit is in the inactive touch mode. For example, when the debouncing algorithm has the second bounce time, the touch-in threshold $TH_{TOUCH-IN}$ used in the procedure 400 may be set to eight. The second variable may cause the control device to be more resistant to inadvertent touch events as compared to the first variable used when in the active touch mode. Accordingly, the control device may be more resistant to transient noise causing inadvertent touch events while the user is not interacting with the actuation member in inactive touch mode. Thereafter, the procedure 500 may exit.

Accordingly, in some examples, when the control circuit is in inactive touch mode, all of the capacitive touch pads are out of the active state. When the number $N_{TOUCH-IN}$ for at least one capacitive touch pad (e.g., and/or at least one electrode) is greater than or equal to the touch-in threshold $TH_{TOUCH-IN}$, the capacitive touch pad may be placed into active state. When at least one capacitive touch pad (e.g., and/or at least one electrode) is in the active state, the control circuit may be placed into active touch mode. And when the control circuit is placed into active touch mode, the control circuit may be configured with a filtering technique having a first variable (e.g., such as a debouncing algorithm having a first bounce time (e.g., two samples, or 20 milliseconds), which adjusts the touch-in threshold $TH_{TOUCH-IN}$ used in the procedure 400. When the touch-in threshold $TH_{TOUCH-IN}$ is adjusted to have the first variable, the other capacitive touch pads are configured to provide a quicker response time (e.g., and reduce or eliminate any stepiness in the control of the lighting load).

Similarly, when the number $N_{TOUCH-OUT}$ for all of the capacitive touch pads (e.g., and/or all of the electrodes) is greater than or equal to the touch-out threshold $TH_{TOUCH-OUT}$, all of the capacitive touch pads may be placed in the inactive state. When all of the capacitive touch pads are in the inactive state, the control circuit may be placed into inactive touch mode. And when the control circuit is placed into inactive touch mode, the control circuit may be configured with a filtering technique having a second variable (e.g., such as a debouncing algorithm having a second bounce time (e.g., eight samples, or 80 milliseconds), which adjusts the touch-in threshold $TH_{TOUCH-IN}$ used in the procedure 400. When the touch-in $TH_{TOUCH-IN}$ is adjusted to have the second variable, all of the capacitive touch pads may be more resistant to inadvertent touch events as compared to when in the control circuit is in active touch mode.

Although described with reference to a debouncing algorithm as the filtering technique throughout the application, the control circuit may be configured to any number of filtering techniques, such as, but not limited to a count filter, a median filter, an infinite impulse response (IIR) filter, a box car filter, and/or a long term average filter. If a different filtering technique is incorporated, the control device may configure the filtering technique differently depending on whether the control device is in the active touch mode or the inactive touch mode. For example, the control circuit may configure the filtering technique to have a longer time constant when the control circuit is in the inactive touch mode than when the control circuit is in the active touch mode.

Figure 16:
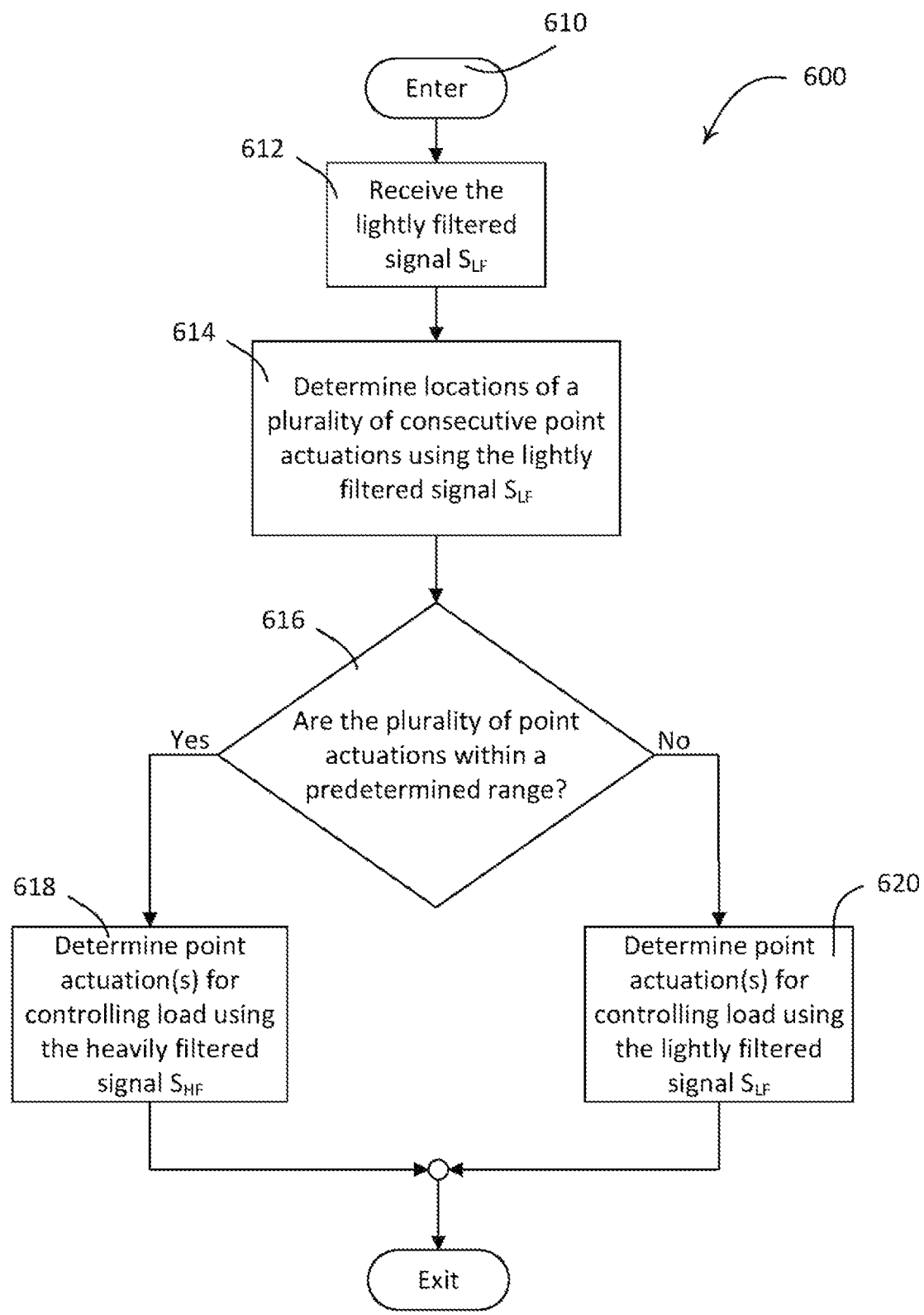
FIG. 16 is a flowchart of an example procedure that may be executed by a control circuit of the load control device.

FIG. 16 is a flowchart of an example procedure 600 that may be executed by a control circuit of the load control device (e.g., the dimmer control circuit 314 and/or the user interface control circuit 354 of the control device 300, and/or the control circuit 1310 and/or a user interface control circuit of the touch sensitive device 1314 of the remote control device 1300), for example, to react quicker in response to gross adjustments along the touch sensitive surface, and also to react in a more sensitive or responsive (e.g., and slower) manner in response to fine-tune adjustments along the touch sensitive surface. In some examples, an output module of a control circuit (e.g., the output module 356 of the user interface control circuit 354) may execute the procedure 600. The control circuit may be configured to perform the procedure 600 periodically (e.g., approximately every 8 milliseconds) at 610. At 612, the control circuit may receive an unfiltered or lightly-filtered signal, such as the lightly-filtered signal $S_{LF}$ that indicates a position of a touch actuation along a touch sensitive surface (e.g., a light bar) of a control device, such as the control device 300. As noted above, the lightly-filtered output signal $S_{LF}$ may be a lightly-filtered or unfiltered signal that indicates the position of a touch actuation along the capacitive touch circuit (e.g., along the touch sensitive surface of the control device 300).

At 614, the control circuit may determine the positions of a plurality of consecutive touch actuations (e.g., point actuations) using the lightly-filtered signal $S_{LF}$. For example, the output module may be configured to determine the positions of the plurality of consecutive point actuations by determining a number $N_{SLF}$ (e.g., 30) of the most recent values of the lightly-filtered output signal $S_{LF}$. The output module may determine the number $N_{SLF}$ of the most recent values of the lightly-filtered output signal $S_{LF}$ using a sliding window (e.g., approximately the last 30 samples and/or approximately the last 250 milliseconds of the lightly-filtered output signal $S_{LF}$).

At 616, the control circuit may determine if the plurality of point actuations fall within a predetermined range. For instance, the touch sensitive device may define a number of touch sections along the touch sensitive surface, such as 255 touch sections across the touch sensitive surface. The control circuit may receive the lightly-filtered output signal $S_{LF}$ at a defined a sampling rate (e.g., 120 samples per second). The control circuit may determine a minimum touch position and a maximum touch position for a plurality of consecutive point actuations over a predetermined period (e.g., approximately 250 milliseconds). In one example, the plurality of consecutive point actuations is 30 consecutive samples of the lightly-filtered output signal $S_{LF}$. The control circuit may then determine whether the minimum and maximum touch positions are within the predefined range of touch sections (e.g., approximately 2% of the length of the touch sensitive surface or approximately 5 of the touch sections along the touch sensitive surface). For example, the control circuit may be configured to determine if the plurality of consecutive point actuations fall within the predetermined range at 616 by determining a minimum value and a maximum value of the most recent values of the lightly-filtered output signal $S_{LF}$ (e.g., as selected at 614), and then determining whether a difference between the maximum value and the minimum value is less than or equal to a signal-change threshold $TH_{SIG}$. The signal-change threshold $TH_{SIG}$ may be, for example, approximately 2% of the number $N_{VAL}$ (e.g., 255) of values between the top value and the bottom value of the lightly-filtered output signal $S_{LF}$ (e.g., the predetermined range may be approximately 5). By determining whether the most recent values of the lightly-filtered output signal $S_{LF}$ fall inside or outside the predetermined range (e.g., the predetermined range may be defined by the signal-change threshold $TH_{SIG}$), the control circuit may determine whether the user is making a fine-tune adjustment or a gross adjustment along the touch sensitive surface based on the lightly-filtered signal $S_{LF}$, respectively.

The control circuit may then control the electrical load using either the lightly-filtered output signal $S_{LF}$ or a heavily-filtered output signal $S_{HF}$ based on whether a gross adjustment or a fine-tune adjustment is occurring. The heavily-filtered output signal $S_{HF}$ may be a more heavily-filtered version of the lightly-filtered output signal $S_{LF}$ and may indicate a position of a touch actuation along the capacitive touch circuit (e.g., along the touch sensitive surface of the control device 300). The control circuit may generate the heavily-filtered output signal $S_{HF}$ using the lightly-filtered output signal $S_{LF}$ and a filter module, such as a digital low-pass filter.

If the control circuit determines that the plurality of consecutive point actuations fall within the predetermined range at 616, then the control circuit may determine the position of the touch actuation (e.g., as indicated by the plurality of consecutive point actuations) for controlling the electrical load using the heavily-filtered signal $S_{HF}$ at 618, and the procedure 600 may exit. For example, the control circuit may generate an output signal, such as the output signal $V_{OUT}$, based on the heavily-filtered signal $S_{HF}$ (e.g., by setting the magnitude of the output signal $V_{OUT}$ to the values of the heavily-filtered signal $S_{HF}$). Further, when the control circuit uses the heavily-filtered output signal $S_{HF}$ to determine the position of a touch actuation for controlling the electrical load, the control circuit may be configured to adjust the power delivered to the electrical load (e.g., the intensity level of a lighting load) by fine or small increments. As such, the control circuit may be configured to adjust the power delivered to the electrical load (e.g., the intensity level of a lighting load) by fine or small increments in response to fine or small movements of a user's finger across the touch sensitive surface.

And, if the control circuit determines that the plurality of consecutive point actuations do not fall within the predetermined range at 616, then the control circuit may determine the position of the touch actuation (e.g., as indicated by plurality of consecutive point actuations) for controlling the electrical load using the lightly-filtered output signal $S_{LF}$ at 620, and the procedure 600 may exit. For example, the control circuit may generate an output signal, such as the output signal $V_{OUT}$, based on the lightly-filtered output signal $S_{LF}$ (e.g., by setting the magnitude of the output signal $V_{OUT}$ to the values of the lightly-filtered signal $S_{LF}$). Further, when the control circuit uses the lightly-filtered output signal $S_{LF}$ to determine the position of a touch actuation for controlling the electrical load, the control circuit may be configured to adjust the power delivered to the electrical load (e.g., the intensity level of a lighting load) by gross or large increments. So, the control device may be quicker to control an amount of power delivered to the one or more electrical loads (e.g., control the intensity level of a lighting load) in response to touch actuations across a greater distance of the touch sensitive surface (e.g., using the lightly-filtered output signal $S_{LF}$), and more sensitive (e.g., and slower) to control an amount of power delivered to the one or more electrical loads (e.g., control the intensity level of a lighting load) in response to touch actuations across a smaller distance (e.g., using the heavily-filtered output signal $S_{HF}$). And, the control circuit may be configured to adjust the power delivered to the electrical load (e.g., the intensity level of a lighting load) by gross or large increments in response to gross or large movements of a user's finger across the touch sensitive surface.

Figure 17:
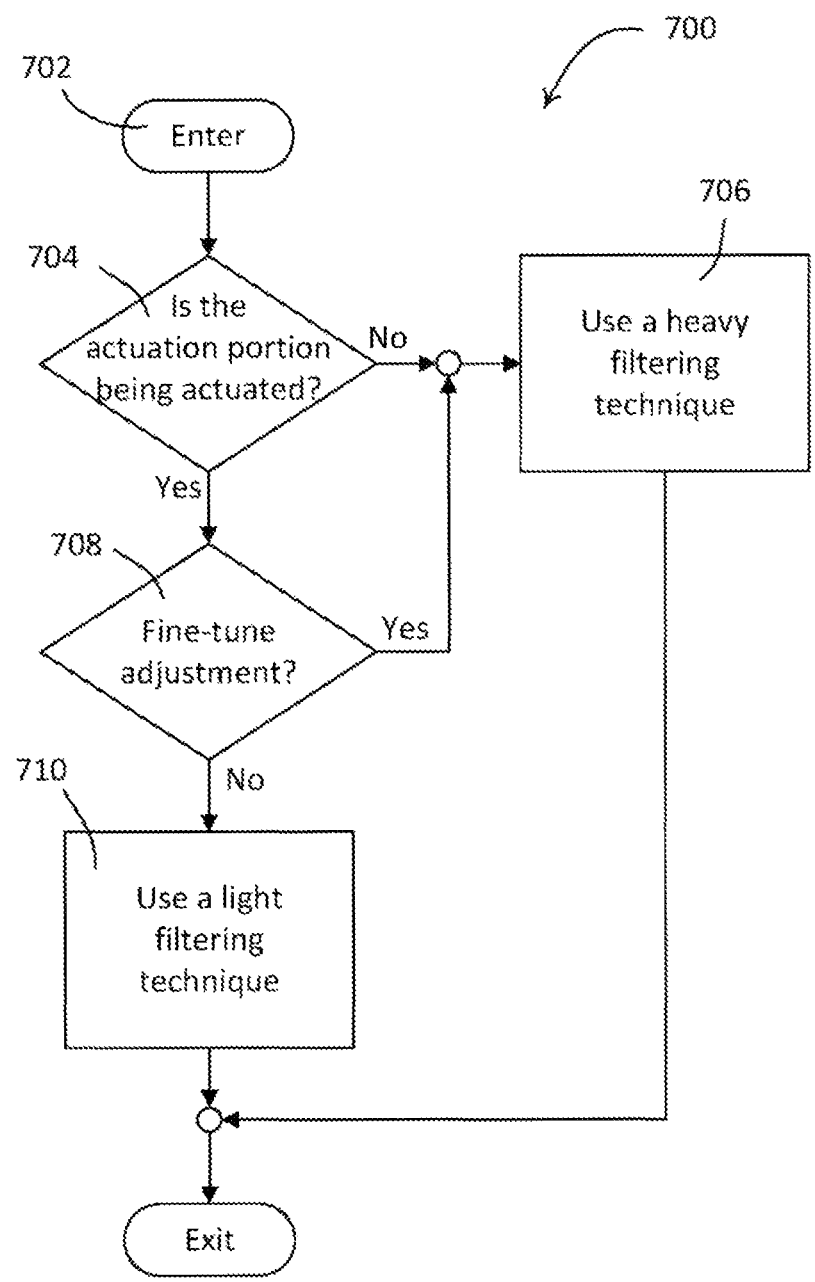
FIG. 17 is a flowchart of an example procedure that may be executed by a control circuit of the load control device.

FIG. 17 is a flowchart of an example procedure 700 that may be executed by a control circuit of the load control device (e.g., the dimmer control circuit 314 and/or the user interface control circuit 354 of the control device 300, and/or the control circuit 1310 and/or a user interface control circuit of the touch sensitive device 1314 of the remote control device 1300), for example, to avoid inadvertent touch events, react quicker to gross adjustments along the touch sensitive surface, and react slower and be more sensitive to fine-tune adjustments along the touch sensitive surface. The control circuit may be configured to perform the procedure 700 periodically (e.g., every 8 milliseconds) at 702.

At 704, the control circuit may determine whether the actuation member of the control device (e.g., a touch sensitive surface, such as the touch sensitive surface of the control device 300 or the remote control device 1300) is being actuated. In one example, the control circuit may determine that the actuation member is being actuated when the change $\Delta_{CAP}$ in count for one of the capacitive touch pads exceeds the capacitance-change threshold $TH_{CAP}$. The control circuit may determine that the actuation member is not being actuated when the change $\Delta_{CAP}$ in count for one of the capacitive touch pads does not exceed the capacitance-change threshold $TH_{CAP}$. In another example, the control circuit may determine that the actuation member is being actuated when the control circuit is in an active touch mode. The control circuit may enter the active touch mode by counting the number $N_{TOUCH-IN}$ of times (e.g., a number of consecutive rounds of capacitive sensing) that the change $\Delta_{CAP}$ in count for one of the capacitive touch pads exceeds the capacitance-change threshold $TH_{CAP}$, and entering the active touch mode when the number $N_{TOUCH-IN}$ exceeds the touch-in threshold $TH_{TOUCH-IN}$. The control circuit may exit the active touch mode by counting the number $N_{TOUCH-OUT}$ of times (e.g., a number of consecutive rounds of capacitive sensing) that the change $\Delta_{CAP}$ in count for one of the capacitive touch pads does not exceed the capacitance-change threshold $TH_{CAP}$, and exiting the active touch mode when the number $N_{TOUCH-OUT}$ exceeds the touch-out threshold $TH_{TOUCH-OUT}$.

If the control circuit determines that the actuation member is not being actuated at 704, or if the control circuit determines that the actuation member is being actuated at 704 and the touch actuation is a fine-tune adjustment at 708, then the control circuit may use a heavy filtering technique at 706. The control circuit may determine that a touch actuation is a fine-tune adjustment at 708 when, for example, a plurality of consecutive point actuations are within a predetermined range. For example, the control circuit may determine a minimum value and a maximum value of the values of the lightly-filtered output signal $S_{LF}$ that are inside of the sliding window (e.g., a period of time), and then determine whether the difference between the maximum value and the minimum value is less than or equal to a signal-change threshold $TH_{SIG}$. If the difference between the maximum value and the minimum value is less than or equal to a signal-change threshold $TH_{SIG}$, then the control circuit may determine that a plurality of consecutive point actuations are within a predetermined range. When using a heavy filtering technique, the control circuit may be less susceptible to inadvertent touch events (e.g., the control circuit may provide greater protection against transient noise causing inadvertent touch events). Alternatively or additionally, when using a heavy filtering technique, the control circuit may be more sensitive to fine-tune adjustments being made by the user. For instance, the control circuit may be slower to react to a user when they are making fine-tune adjustments to allow the user to more accurately set the electrical load to the desired power or intensity level.

When using a heavy filtering technique, the control circuit may perform any combination of filtering, for example, when determining the position of a touch actuation on the touch sensitive surface for controlling the electrical load. For example, the control circuit may use a filtering technique (e.g., a debouncing algorithm) when detecting whether the actuation member is being actuation and the position of the touch actuation (e.g., at a position detection module), and/or the control circuit may use a filtering technique (e.g., a low pass filter) to filter the output of a position detection module. In some examples, the control circuit may use a filtering algorithm (e.g., a debouncing algorithm) when determining the number of consecutive samples that are required to be detected prior to the control circuit generating a signal that indicates a position of a touch actuation on the touch sensitive surface. This may enable the control device to be more resilient to inadvertent touch events. For instance, when using a heavy filtering technique at 706, the control circuit may be configured with a longer debouncing time (e.g., eight samples, or 80 milliseconds) to allow for greater protection against transient noise causing inadvertent touch events. Alternatively or additionally, when using a heavy filtering technique at 706, the control circuit may apply a filter, such as a digital low-pass filter, to the output of a position detection module prior to determining the position of a touch actuation for controlling the electrical load. For instance, the control circuit may apply a filter to an unfiltered or lightly-filtered signal to generate a heavily-filtered output signal (e.g., the heavily-filtered output signal $S_{HF}$), and then use the heavily-filtered output signal when determining the position of a touch actuation for controlling the electrical load.

If the control circuit determines that the actuation member is being actuated at 704 and that the touch actuation is not a fine-tune adjustment at 708, then the control circuit may use a light filtering technique at 710. When using a light filtering technique, the control circuit may be more responsive to user actuations along the touch surface of the actuation member of the control device. Further, in some examples, the control device may perform little or no filtering when using the light filtering technique. However, when filtering is performed in the light filtering technique, the control circuit may use a filtering technique that is less than the heavy filtering technique. For instance, in some examples, the control circuit may use a filtering algorithm (e.g., a debouncing algorithm) that has less filtering that the heavy filtering technique when determining the number of consecutive samples that are required to be detected prior to the control circuit generating a signal that indicates a position of a touch actuation on the touch sensitive surface. This may enable the control device to respond quicker when gross adjustments are being made by the user. For instance, when using a light filtering technique at 710, the control circuit may be configured with a shorter debouncing time (e.g., two samples, or 20 milliseconds) to allow for the control circuit to react quicker to larger adjustments being made via the touch sensitive surface. After configuring with the heavy or light filtering technique, the control circuit may exit the procedure 700.

A control circuit of the control device may be configured to recalibrate the touch sensitive device at various times, such as when the control device is turned on and/or when the control device experiences one or more events, such as an environmental drift, such as a change in temperature of the touch sensitive device, an electrical fast transient (EFT) event, and/or an electrostatic discharge (ESD) event. When recalibrating, the touch sensitive device may be inactive (e.g., non-responsive to touch actuations). For example, when the touch sensitive device experiences an event that causes it to lock up, a timer may reset the control circuit (e.g., the user interface control circuit), which in turn may cause the touch sensitive device to recalibrate. As such, the recalibration of the touch sensitive device may prevent the control circuit from responding to user interactions with the user interface for a set amount of time.

Environmental drift is one type of event that can cause the touch sensitive device to recalibrate (e.g., and in turn, cause the touch sensitive device to lock up). Environmental drift may include any changes in environmental factors, such as temperature. Environmental drift may be caused by any number of factors, including the heating of a controllably conductive device (e.g., triac, FETs, etc.) of the control device, changes in ambient temperature, changes in the HVAC system where the control device is installed, the movement of people into or out of the proximity of the control device, the opening and closing of doorways, etc. Similarly, ESD and/or EFT events can inadvertently cause the touch sensitive device to recalibrate, thereby rendering the user interface inactive for a set amount of time. One example of an ESD event is when a user accidentally causes static to discharge at the control device. One example of an EFT event is when an appliance, such as one with a motor, causes high frequency voltage transients on the power line where the control device is installed. In either instance, the touch sensitive device of control device may provide The control circuit of a load control device (e.g., the dimmer control circuit 314 or the user interface control circuit 354) may be configured to perform a recalibration routine that determines one or more new parameters for the touch sensitive device, and then store those parameters in memory. Then, in response to a future event that causes the touch sensitive device to recalibrate (e.g., environmental drift, an ESD event, an EMI event, etc.), the control circuit may reconfigured to touch sensitive device using the stored parameters without having to perform the recalibration routine. For example, the control circuit may retrieve the parameter values from memory and load the parameter values into the control circuit of the touch sensitive device without having to perform the recalibration routine. As such, the control circuit may more quickly enable the touch sensitive device after an event. As described herein, the parameter values of the touch sensitive device may include any combination of conversion control parameters of the touch sensitive device. The conversion control parameters may include any combination of a coarse gain of the touch sensitive device 350 (e.g., ui8CoarseGain), a fine gain of the touch sensitive device 350 (e.g., ui8FineGain), and/or an offset, such as an offset subtraction of the touch sensitive device 350 (e.g., ui16Offset). The parameter values may include any combination pf the parameter values that the touch sensitive device can manipulate to alter the baseline count $N_{BL}$ of the touch sensitive device when the touch sensitive device is in an idle state. For instance, in some examples, the touch sensitive device may be configured to maintain the baseline count $N_{BL}$ at a particular value (e.g., 500), and the touch sensitive device may be configured to adjust any combination of the parameter values to maintain the baseline count $N_{BL}$ at the particular value.

FIG. 18A is a flowchart of an example procedure 800 that may be executed by a control circuit of the load control device (e.g., the dimmer control circuit 314, the control circuit 1310, etc.), for example, to recalibrate the parameter values of a touch sensitive device (e.g., of the user interface control circuit 354 of the touch sensitive device 350, the user interface circuit of the touch sensitive device 1314). For example, the control device may be configured to perform the procedure 800 periodically (e.g., every 8 milliseconds), when starting up, and/or in response to environmental drift, EFT events, and/or ESD events.

The control circuit may determine if the touch sensitive device needs to recalibrate at 802. The control circuit may be configured to recalibrate when the control circuit resets or is first powered up. The control circuit may be configured to recalibrate when a temperature drift causes the baseline count $N_{BL}$ (the long-term average) to drift. If the control circuit determines that a change in the baseline count $N_{BL}$ drifts past a capacitive drift threshold $\Delta_{DRIFT}$ (e.g., 10% increase or decrease), the control circuit may be configured to recalibrate. Alternatively or additionally, the control circuit may comprise an internal temperature sensor that is configured to measure the internal temperature of the load control device and send a signal to the control circuit that indicates the internal temperature of the control device. The control circuit may determine that the internal temperature of the control device has deviated by a threshold amount, and in response, decide to recalibrate the touch sensitive device.

Alternatively or additionally, the control circuit may determine that the touch sensitive device needs to recalibrate based on the expiration of a recalibration timer, or in response to the occurrence of an event, such as then the control device is powered up (e.g., after losing power or when first installed). For instance, an EFT or ESD event may cause what appears to be a negative touch across the touch sensitive device. Upon determining a negative touch event, the control circuit may be configured to recalibrate. Further, in some examples, an EFT or ESD event may cause a change in the count $\Delta_{CAP}$ to exceed an upper count threshold $TH_{CAP-UPPER}$. In response to detecting that the count $\Delta_{CAP}$ exceeds the upper count threshold $TH_{CAP-UPPER}$, the control circuit may be configured to recalibrate (e.g., or, alternative, wait a timeout period, such as two minutes).

If the touch sensitive device does not need to recalibrate, then the procedure 800 exits. However, if the control circuit determines that the touch sensitive device needs to recalibrate, then the control circuit may determine one or more parameter value(s) for the touch sensitive device using a recalibration routine at 804. The parameter values of the touch sensitive device may include any combination of conversion control parameter values, such as a coarse gain of the touch sensitive device 350 (e.g., ui8CoarseGain), a fine gain of the touch sensitive device 350 (e.g., ui8FineGain), and/or an offset, such as an offset subtraction of the touch sensitive device 350 (e.g., ui16Offset). As noted above, the parameter values may include any combination of the parameter values that the touch sensitive device is configured to change to alter the baseline count $N_{BL}$ of the touch sensitive device.

After determining the new parameter values at 804, the control circuit may load the new parameter value(s) into the registers of control circuit of the touch sensitive device (e.g., the user interface control circuit 354, the user interface control circuit of the touch sensitive device 1314, etc.) at 806. The control circuit may then store the new parameter values in memory of the control device (e.g., the memory 318, the memory 1320, etc.) at 808, before exiting the procedure 800. In some examples, it may take the control circuit up to approximately one second to complete the procedure 800. By storing the new parameter values in the memory, the control circuit may load the parameters more quickly into the control circuit of the touch sensitive device in the event that the touch sensitive circuit has to reset (e.g., or locks out) in the future. For example, if the touch sensitive device locks out due to an event, such as environmental drift, an EFT event, and/or an ESD event, the control circuit may retrieve the stored parameter values and load them into the control circuit of the touch sensitive device without having to perform the recalibration routine. Further, storing the parameter values of the touch sensitive device in memory with the procedure 800 may also enable to the control circuit to configure to the touch sensitive device more quickly, if for example, the control device loses power and has to turn back on.

FIG. 18B is a flowchart of an example procedure 820 that may be executed by a control circuit of the load control device (e.g., the dimmer control circuit 314, the control circuit 1310, etc.), for example, to retrieve the parameter values of a touch sensitive device (e.g., of the user interface control circuit 354 of the touch sensitive device 350, the user interface circuit of the touch sensitive device 1314) after the touch sensitive device resets. For example, the touch sensitive device may reset in response to a loss in power, a software glitch, EFT events, and/or ESD events. The control circuit may be configured to perform the procedure 820 in response to detecting that the touch sensitive device resets at 822.

At 824, the control circuit may retrieve the previous stored parameter values(s) of the touch sensitive device from memory (e.g., the memory 318, the memory 1320, etc.) after the touch sensitive device resets. For example, the parameter values may be those that were saved by the control circuit at 808 while performing the procedure 800. At 826, the control circuit may load the parameter values(s) into registers of user interface control circuit (e.g., the user interface control circuit 354 of the control device 300). As such, the user interface control circuit may be configured with the parameter values that were stored prior to having to reset the touch sensitive device, for example, as opposed to having to run the recalibration routine, which would take up additional time and delay the operability of the touch sensitive surface. Therefore, by storing the parameters prior to reset, and loading the stored parameters after the reset, the control circuit can prevent a recalibration and/or a lockup of the touch sensitive device.

After loading the parameter values(s) into registers of user interface control circuit at 826, the control circuit may disable recalibration of the touch sensitive device (e.g., not perform the procedure 800) at 828. At 830, the control circuit may wait for a timeout period (e.g., two minutes), prior to re-enabling the recalibration procedure (e.g., the procedure 800) at 832. In some instances, the control circuit may automatically recalibrate after the expiration of the timeout period. As such, the control circuit may allow the event that caused the touch sensitive circuit and any residual effects of that event to dissipate prior to recalibrating the touch sensitive device. This may prevent the control circuit from unnecessarily adjusting parameters of the touch sensitive device as the residual effects of the event dissipate. Further, additional adjustments of the parameters through a recalibration procedure may cause the touch sensitive device to be disabled, so through the use of the timeout period, the touch sensitive device may avoid stay enabled after a reset. Further, it should be appreciated that in some examples, the control circuit may enable recalibration after loading the parameter values at 826 without the use of the timeout period. That is, in some examples, steps 828, 830, and 832 may be omitted from the procedure 820.

Figure 19:
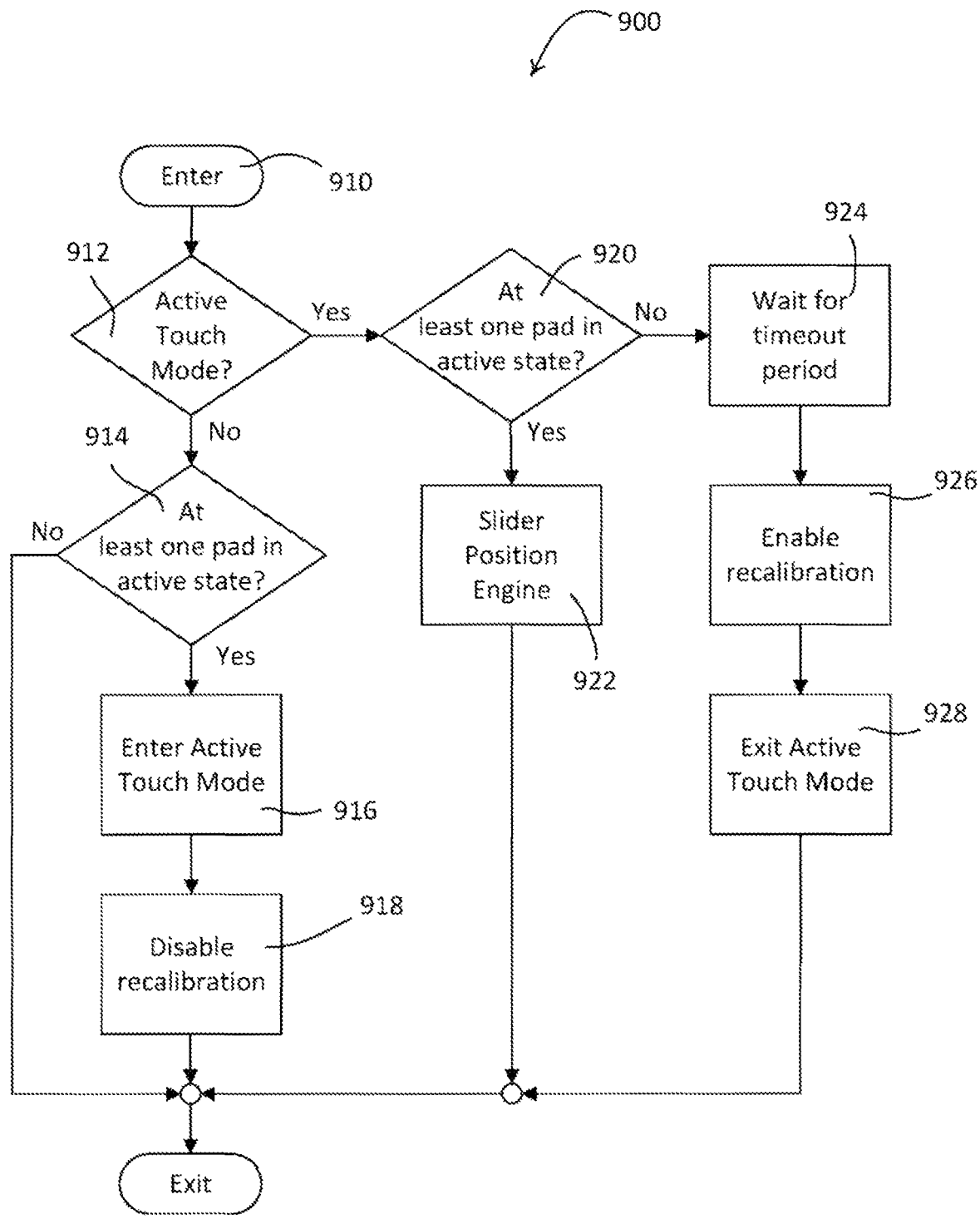
FIG. 19 is a flowchart of an example procedure that may be executed by a control circuit of the load control device, for example, to delay or disable recalibration of a touch sensitive device when switching between active and inactive touch mode.

FIG. 19 is a flowchart of an example procedure 900 that may be executed by a control circuit of the load control device (e.g., the dimmer control circuit 314 and/or the user interface control circuit 354 of the control device 300, the control circuit 310 and/or a user interface control circuit of the control device 1300, etc.), for example, to delay or disable recalibration of a touch sensitive device (e.g., the touch sensitive device 350, the touch sensitive device 1314, etc.) when switching between active and inactive touch mode. For example, a position detection module of a control circuit (e.g., the position detection module 358 of the user interface control circuit 354) may execute the procedure 900. The control device may disable recalibration when in the active touch mode, for example, to ensure there is no delay in the responsiveness of the touch sensitive device while the user is interacting with the touch sensitive device. Further, and for example, the control device may enable a timeout period when exiting active touch mode, for example, to allow for any environmental factors, such as temperature increases, and/or any ESD events, EFT events, etc. of the touch sensitive device to dissipate before enabling recalibration. The control circuit may be configured to perform the procedure 900 periodically (e.g., every 8 milliseconds) at 910.

When the control device is not operating in the active touch mode at 912, the control circuit may determine whether at least one capacitive touch pad is in an active state at 914. As an example, the control circuit may configure each of the capacitive touch pads in the active state or inactive state using the procedure 450 described herein. If the control circuit determines that none of the capacitive touch pads is in the active state at 914, the procedure 900 may exit. However, if the control circuit determines that at least one of the capacitive touch pads is in the active state at 914, the control circuit may enter the active touch mode at 916. For instance, in some examples, at least one of the capacitive touch pads will be in the active state when a user is interactive with the touch sensitive device. Upon entering active touch mode at 916, the control circuit may disable recalibration of the touch sensitive device at 918, and the procedure 900 may exit. Accordingly, the control circuit may disable recalibration of the touch sensitive device when the control device is in active touch mode, for example, to ensure that recalibration does not cause a delay in the responsiveness of the touch sensitive device while the user is interacting with the touch sensitive device.

When the control circuit is operating in the active touch mode at 912, the control circuit may determine whether at least one capacitive touch pad is in an active state at 920. As noted above, and as an example, the control circuit may configure each of the capacitive touch pads in the active state or inactive state using the procedure 450 described herein. If the control circuit determines that at least one capacitive touch pad is in an active state at 920, the control circuit may execute a slider position engine at 922, before the procedure 900 exits. Accordingly, all it takes is at least one of the capacitive touch pads to be in the active state for the control circuit to execute the slider position engine. The control circuit may execute the slider position engine at 922 to determine and update the position of a touch actuation. For example, the slider position engine may be part of a position detection module of a control circuit (e.g., the position detection module 358 of the user interface control circuit 354). And the slider position engine may update an unfiltered or lightly-filtered signal, such as the lightly-filtered signal $S_{LF}$, based on the updated the position of the touch actuation. After the control circuit executes the slider position engine at 922, the procedure 900 may exit.

If the control circuit determines that none of the capacitive touch pads is in an active state at 920, the control device may exit the active touch mode at 924. Accordingly, if all of the capacitive touch pads are in an inactive state, the control circuit may wait for a timeout period (e.g., two minutes) at 924, before enabling recalibration of the touch sensitive device at 926. The control device may enable the timeout period, for example, to allow for any environmental factors, such as temperature increases, and/or any EMI effects, EFT events, etc. of the touch sensitive device to settle before enabling recalibration. For instance, the timeout period may be configured to allow enough time for any environmental factors, such as temperature increases, and/or any EMI effects, EFT events, etc. to dissipate because running the recalibration routine to determine whether any of the parameters of the touch sensitive device should be adjusted. The control device may enter the inactive touch mode at 928, and the procedure 900 may exit. Further, it should be noted that in some examples the timeout period may be omitted from the procedure 900, such that the procedure 900 enables recalibration immediately upon the determination that none of the capacitive touch pads is in an active state at 920 without the use of the timeout period.

Figure 20:
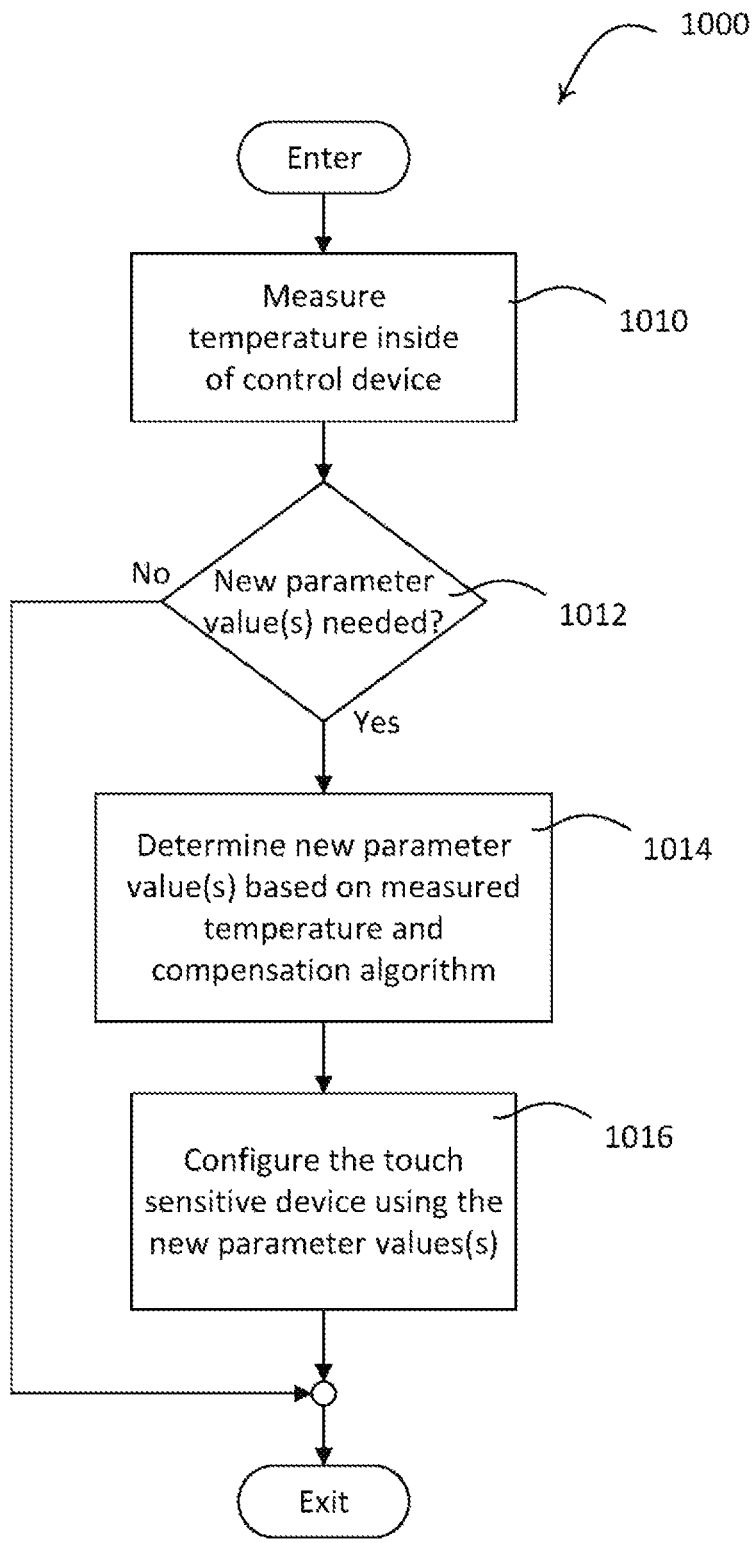
FIG. 20 is a flowchart of an example procedure that may be executed by a control circuit of the load control device, for example, to set parameter values of a touch sensitive device in response changes in temperature when recalibration is disabled.

FIG. 20 is a flowchart of an example procedure 1000 that may be executed by a control circuit of the load control device (e.g., the user interface control circuit 354 of the control device 300, a user interface control circuit of the control device 1300, etc.), for example, to set (e.g., adjust) parameter values of a touch sensitive device (e.g., the touch sensitive device 350, the touch sensitive device 1314, etc.) in response changes in temperature when recalibration is disabled, such as during active touch mode. For example, an increase in the temperature of the load control device may cause one or more parameter values of the touch sensitive device to change (e.g., drift). The parameter values may include any combination of conversion control parameter values, such as a coarse gain of the touch sensitive device 350 (e.g., ui8CoarseGain), a fine gain of the touch sensitive device 350 (e.g., ui8FineGain), and/or an offset, such as an offset subtraction of the touch sensitive device 350 (e.g., ui16Offset). As noted above, the parameter values may include any combination pf the parameter values that the touch sensitive device is configured to change to alter the baseline count $N_{BL}$ of the touch sensitive device. Since the recalibration routine may be disabled at times, such as when in active touch mode, the control circuit may maintain consistent responsiveness of the touch sensitive device by adjusting the parameter values using the procedure 1000 to compensate for any change to operation of the touch sensitive device that occurs while in active touch mode due to temperature drift. The control circuit may be configured to perform the procedure 1000 when the temperature exceeds a particular drift threshold, in response to an ESD and/or EFT event, and/or periodically.

At 1010, the control circuit may measure the temperature inside of the load control device. For example, the control device may comprise a temperature sensor that is configured to measure the internal temperature of the load control device and send a signal to the control circuit that indicates the internal temperature of the control device. The temperature sensor may be part of the control circuit, or reside external to the control circuit but be part of the control device. In some examples, the control circuit may determine the temperature changed inside the load control device based on a change of another parameter. At 1012, the control circuit may determine whether new parameter values are needed. For example, the control circuit may determine whether a temperature change of the device exceeds a drift threshold (e.g., thirteen degrees Celsius), and if so, determine that new parameter values are needed. For instance, in some examples, the baseline count $N_{BL}$ of the touch sensitive device may change at about a rate of 1% for every change in temperature of one degree Celsius. If the control circuit determines that new parameter values are not needed, then the procedure 1000 may exit. However, if the control circuit determines that new parameter values are needed, then the procedure may continue to 1014.

At 1014, the control circuit may determine new parameter values for one or more parameters of the touch sensitive device based on the change in temperature, and for example, a compensation algorithm. In some examples, the compensation algorithm could define a linear relationship between one or more of the parameters values and the change in temperature of the control device. Further, in some examples, the control circuit may apply a compensation factor to the parameter values, where the compensation factor is determined based on or part of the compensation algorithm. In some examples, the control circuit changes the parameter value(s) (e.g., fine gain and offset subtraction) by one count for every 2° C. change of the control device (e.g., every 2% change in the baseline count $N_{BL}$).

Finally, at 1016, the control circuit may configure the touch sensitive device (e.g., a user interface circuit of the touch sensitive device) using the new parameter values to, for example, compensate for the change in internal temperature. For example, the control circuit may load the new parameters values into the registers of the control circuit to configure the touch sensitive device with updated parameter values that compensate for the change in the internal temperature of the control device, and exit the procedure 1000. As such, the control circuit may use the procedure 1000 to adjust the parameter values (e.g., adjust the parameter values that were previously stored in memory) based on the change in the internal temperature of the control device, for example, during instances when the recalibration procedure is disabled, such as when the control device is in active touch mode and the temperature of the device exceeds a threshold.

Further, in some examples, the control circuit may detect an occurrence of a multi-touch event and ignore it. In some examples, a multi-touch event occurs when two or more of the user's fingers contact the touch sensitive surface (e.g., the light bar) of the control device. For example, one characteristic signature of a multi-touch event is that a large number of the capacitive touch pads (e.g., such as at least four of the capacitive touch pads and/or at least four electrodes) appear to be touched simultaneously. The magnitude on each capacitive touch pad may not necessary be the same but the control circuit registered a touch event on each of the capacitive touch pads (e.g., based on the $\Delta_{CAP}$ for each capacitive touch pad). If the touch event were due to a proper touch actuation along the touch sensitive surface, then the control circuit would only register a touch event from a subset (e.g., two) of the capacitive touch pads. If the control circuit determines that an indication of the capacitance of more than the subset of capacitive touch pads (e.g., four or more capacitive touch pads) exceeds a threshold, then the control circuit may ignore the event, as it most likely indicates a multi-touch event. As noted herein, indication of the capacitance of a capacitive touch pad may be, for example, the receive signal $V_{RX-A}$-$V_{RX-E}$ and/or the change $\Delta_{CAP}$ in the count of the capacitive touch pad.

For example, in some scenarios the control device may be in contact (e.g., electrical and/or mechanical contact) with a floating (ungrounded) metal faceplate that is installed over the control device. In such scenarios, the metal faceplate may generate a response in the touch sensitive device that can cause an inadvertent touch event. This may be especially problematic in multi-gang installations that include a metal faceplate. Accordingly, the control circuit may execute an algorithm that detects when the control device is in contact with a floating metal faceplate, and ignore this reading. For example, one characteristic signature of a floating metal faceplate touch is that most (e.g., all) of the capacitive touch pads appear, to the control circuit, to be touched simultaneously. The magnitude on each of the capacitive touch pads may not necessary be the same but they all have a signal above a threshold. As noted above, if the touch event were due to an actual touch actuation along the touch sensitive surface of the control device, then only a subset of the capacitive touch pads (e.g., one to three capacitive touch pads) would register a touch. Accordingly, if the control circuit determines that an indication of the capacitance of more than a subset of capacitive touch pads (e.g., four or more capacitive touch pads) exceeds a threshold, then the control circuit may ignore this reading because it most likely indicates a floating metal touch.

Figure 21:
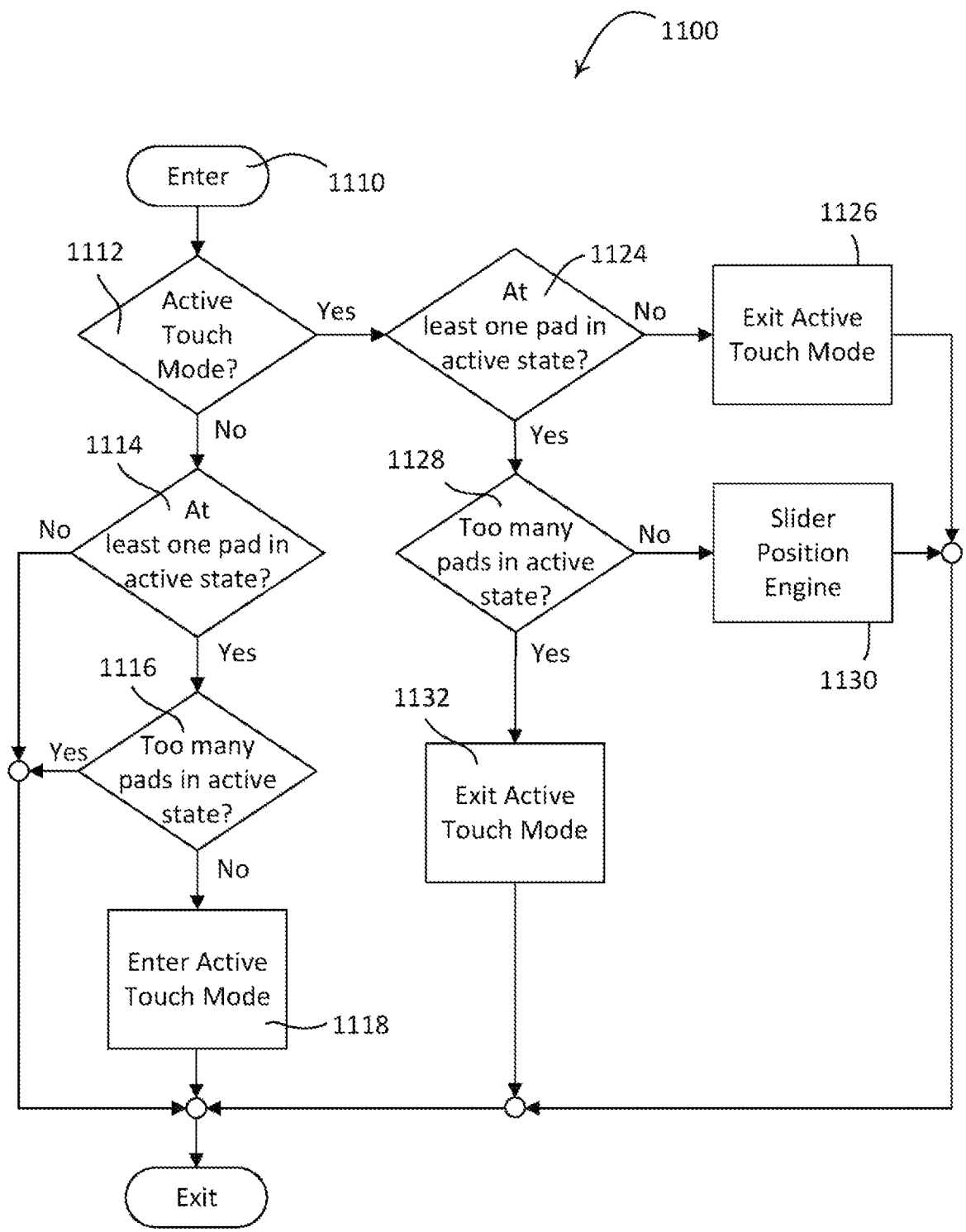
FIG. 21 is a flowchart of an example procedure that may be executed by a control circuit of the load control device to avoid multi-touch events.

FIG. 21 is a flowchart of an example procedure 1100 that may be executed by a control circuit of the load control device (e.g., the dimmer control circuit 314 and/or the user interface control circuit 354 of the control device 300, the control circuit 1310 and/or a user interface control circuit of the touch sensitive device 1314 of the control device 1300, etc.), for example, to avoid multi-touch events. For example, a position detection module of a control circuit (e.g., the position detection module 358 of the user interface control circuit 354) may execute the procedure 1100. Multi-touch events may be caused by a variety of factors and circumstances, such as user errors and floating metal faceplates. For example, a multi-touch event may be characterized by a user touching the user interface of the control device with two or more fingers at multiple locations, which may confuse a slider algorithm of the control circuit and/or may cause the control circuit to generate unexpected results, and/or may be caused by a floating metal faceplate. The control circuit may be configured to perform the procedure 1100 periodically (e.g., every 8 milliseconds) at 1110.

When the control device is not operating in the active touch mode at 1112, the control circuit may determine whether at least one capacitive touch pad is in an active state at 1114. As an example, the control circuit may configure each of the capacitive touch pads in the active state or inactive state using the procedure 450 described herein. If the control circuit determines that none of the capacitive touch pads is in the active state at 1114, the procedure 1100 may exit. However, if the control circuit determines that at least one of the capacitive touch pads is in the active state at 1114, the control circuit may determine whether there are too many capacitive touch pads in the active state at 1116. For example, the control circuit may determine whether there is a multi-touch event at 1116.

In one example, the control circuit may include a total of five capacitive touch pads, and the control circuit may determine that too many of the capacitive touch pads are in the active state when four or all of the five capacitive touch pads are in the active state. If the control circuit determines that there are too many capacitive touch pads in the active state at 1116, the control circuit may ignore the touch event and exit the procedure 1100. Accordingly, the control circuit may detect a multi-touch event and ignore it. In some examples, if the touch event were due to a proper touch actuation of the touch sensitive surface, then the control circuit would only receive an indication of the capacitance that is above a threshold from a subset (e.g., one to three) of the capacitive touch pads. If the control circuit determines that an indication of the capacitance of more than the subset of capacitive touch pads (e.g., four or more capacitive touch pads) exceeds a threshold, then the control circuit may ignore the event, as it most likely indicates a multi-touch event. Finally, if the control circuit determines that there are too many capacitive touch pads in the active state at 1116, the control circuit may stay in inactive touch mode (e.g., place all of the capacitive touch pads into the inactive state), and the procedure 1100 may exit.

Further, in some examples, the control circuit may store the occurrence of the multi-touch event in memory, and, send a notification to an external device (e.g., a mobile device and/or system controller) that indicates the occurrence of the multi-touch events, such as when the number of multi-touch events exceeds a threshold (e.g., to indicate that a floating metal faceplate may be causing issues with the touch sensitive surface). Alternatively or additionally, the control circuit may blink one or more indicator lights on the control device to indicate the multi-touch event.

If the control circuit determine that there are not too many capacitive touch pads in the active state at 1116, the control circuit may enter the active touch mode at 1118, and the procedure 1100 may exit. As such, in some examples, if the control circuit determines that anywhere between one and three of the capacitive touch pads are in the active state at 1116, the control circuit may enter the active touch mode at 1118, and the procedure 1100 may exit. Accordingly, when the control circuit determines that there is a touch event that is not a multi-touch event, the control circuit may enter the active touch mode.

When the control circuit is operating in the active touch mode at 1112, the control circuit may determine whether at least one capacitive touch pad is in an active state at 1124. As noted above, and as an example, the control circuit may configure each of the capacitive touch pads in the active state or inactive state using the procedure 450 described herein. If the control circuit determines that none of the capacitive touch pads is in an active state at 1124, the control device may exit the active touch mode at 1126, and the procedure 1100 may exit. Accordingly, if all of the capacitive touch pads are in an inactive state, the control device may enter the inactive touch mode at 1126.

If the control circuit determines that at least one capacitive touch pad is in an active state at 1124, the control circuit may determine whether there are too many capacitive touch pads in the active state at 1128 (e.g., similar as done at 1116). For example, the control circuit may determine whether there is a multi-touch event at 1128. If the control circuit determine that there are not too many capacitive touch pads in the active state at 1128, the control circuit may execute a slider position engine at 1130, before the procedure 1100 exits. The control circuit may execute the slider position engine at 1130 to determine and update the position of a touch actuation. For example, the slider position engine may be part of a position detection module of a control circuit (e.g., the position detection module 358 of the user interface control circuit 354). And the slider position engine may update an unfiltered or lightly-filtered signal, such as the lightly-filtered signal $S_{LF}$, based on the updated the position of the touch actuation. After the control circuit executes the slider position engine at 1130, the procedure 1100 may exit.

If the control circuit determines that there are too many capacitive touch pads in the active state at 1128, the control circuit may ignore the touch event and exit active touch mode at 1132. In some examples, if the touch event were due to a proper touch actuation of the touch sensitive surface, then the control circuit would only receive an indication of the capacitance that is above a threshold from a subset (e.g., one to three) of the capacitive touch pads. If the control circuit determines that an indication of the capacitance of more than the subset of capacitive touch pads (e.g., four or more capacitive touch pads) exceeds a threshold, then the control circuit may ignore the event, as it most likely indicates a multi-touch event. At 1132, the control circuit may exit the active touch mode (e.g., place all of the capacitive touch pads into the inactive state), and the procedure 1100 may exit.

Figure 22:
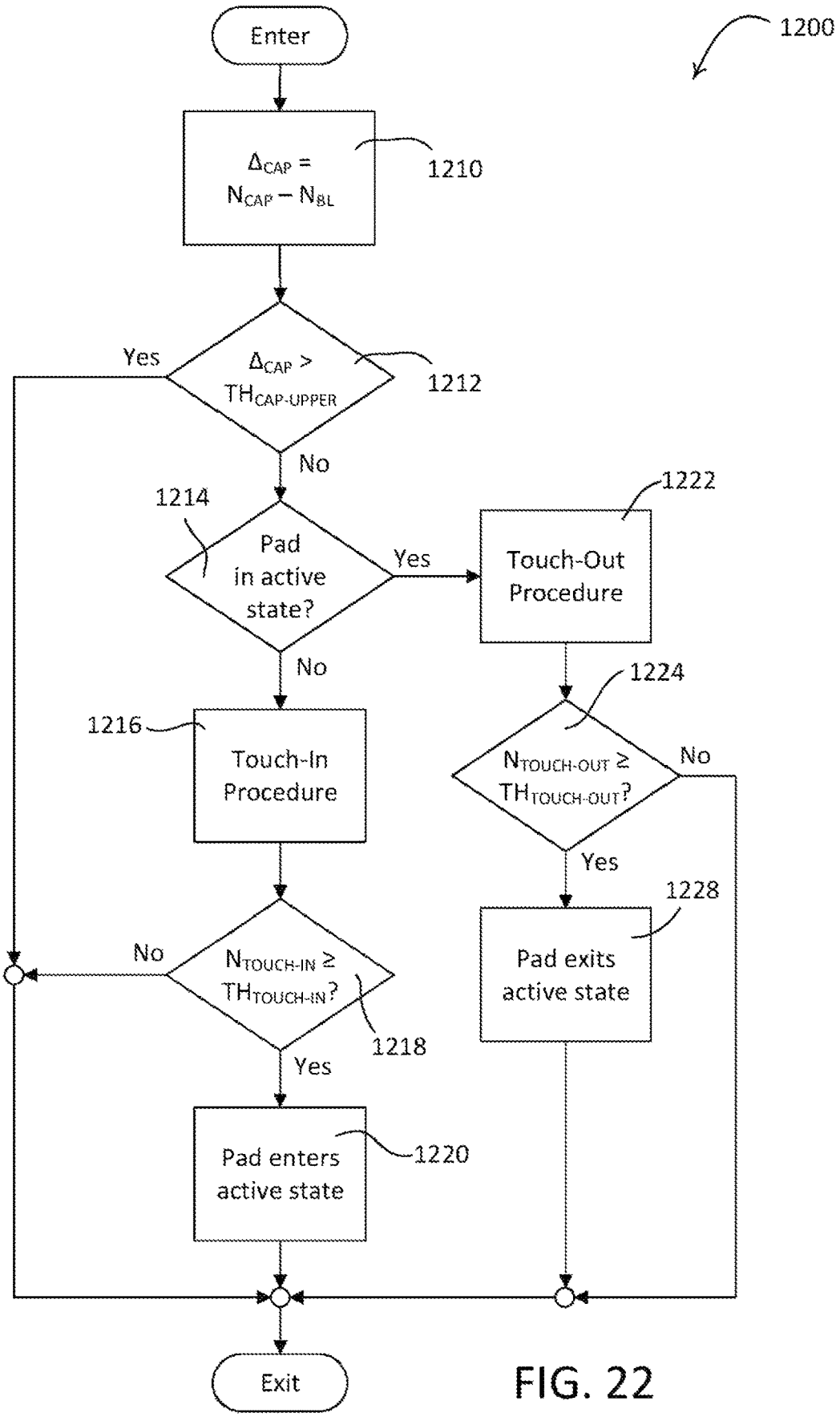
FIG. 22 is a flowchart of an example procedure that may be executed by a control circuit of the load control device to ignore noisy events.

FIG. 22 is a flowchart of an example procedure 1200 that may be executed by a control circuit of the load control device (e.g., the user interface control circuit 354 of the control device 300, a user interface control circuit of the touch sensitive device 1314 of the control device 1300, etc.), for example, to ignore noise events (e.g., transient high-voltage events), such as those caused by motors (e.g., fan motors), the controls for the motor, elevators, etc., that cause one or more capacitive touch pads to register a change in capacitance that exceeds a threshold. For instance, in some examples, the procedure 1200 is executed by a position detection module of the user interface control circuit (e.g., the position detection module 358 of the user interface control circuit 350). The control circuit may be configured to perform the procedure 1200 periodically (e.g., every 8 milliseconds), and for each of the capacitive touch pads of the touch sensitive device.

At 1210, the control circuit may determine a change $\Delta_{CAP}$ in the count for the present capacitive touch pad of the capacitive touch circuit by determining the difference between the present count $N_{CAP}$ and the baseline count $N_{BL}$ for the present capacitive touch pad. At 1212, the control circuit may determine whether the change $\Delta_{CAP}$ exceeds a high-voltage capacitance-change threshold $TH_{CAP-HV}$. The high-voltage capacitance-change threshold $TH_{CAP-HV}$ may be set high enough such that any normal touch actuation by a user does not cause the change $\Delta_{CAP}$ to exceed the threshold. However, the high-voltage capacitance-change threshold $TH_{CAP-HV}$ may be configured such that noise events, such as those caused by fan motors, do cause one or more capacitive touch pads to register a change in capacitance that exceeds the high-voltage capacitance-change threshold $TH_{CAP-HV}$. In one example, the baseline number $N_{BL}$ may be approximately 500, the change $\Delta_{CAP}$ due to standard touch actuation may be approximately 75-150, the change $\Delta_{CAP}$ due to a user placing then entire palm on the device may be approximately 700, and the high-voltage capacitance-change threshold $TH_{CAP-HV}$ may be set to 1400. As such, the change $\Delta_{CAP}$ should not exceed the high-voltage capacitance-change threshold $TH_{CAP-HV}$ through any user touch actuation, and may only be exceeded by noise events, such as EFT noise events.

If the control circuit determines that the change $\Delta_{CAP}$ exceeds the high-voltage capacitance-change threshold $TH_{CAP-HV}$ at 1212, the control circuit may ignore the input and the procedure 1200 may exit. For example, if the control circuit determines that the change $\Delta_{CAP}$ exceeds the high-voltage capacitance-change threshold $TH_{CAP-HV}$, the touch sensitive device may not provide the output signal $V_{OUT}$ to the dimmer control circuit. Further, in some examples, the control circuit may disable recalibration of the touch sensitive device (e.g., for a timeout period, such as 2 minutes) to allow for the noisy event to dissipate.

If, however, the control circuit determines that the change $\Delta_{CAP}$ does not exceed the high-voltage capacitance-change threshold $TH_{CAP-HV}$ at 1212, the control circuit may determine whether the capacitive touch pad is in an active state at 1214. When the control circuit is determines that the present capacitive touch pad is not in the active state at 1214, the control circuit may execute a touch-in procedure for the present capacitive touch pad at 1216. For example, the control circuit may execute the touch-in procedure for the present capacitive touch pad to determine a number $N_{TOUCH-IN}$ of times that the change $\Delta_{CAP}$ in the count for the present capacitive touch pad has exceeded the capacitance-change threshold $TH_{CAP}$. Further, in some examples, while performing the touch-in procedure, the control circuit may continue to compare the change $\Delta_{CAP}$ to the high-voltage capacitance-change threshold $TH_{CAP-HV}$, and exit the procedure 1100 if the change $\Delta_{CAP}$ exceeds an high-voltage capacitance-change threshold $TH_{CAP-HV}$.

At 1218, the control circuit may determine whether the number $N_{TOUCH-IN}$ determined at 1216 for the present capacitive touch pad exceeds a touch-in threshold $TH_{TOUCH-IN}$. If the control circuit determines that the number $N_{TOUCH-IN}$ for the present capacitive touch pad is less than the touch-in threshold $TH_{TOUCH-IN}$ at 1218, the capacitive touch pad may remain in the inactive state and the procedure 1200 may exit. However, if the number $N_{TOUCH-IN}$ for the capacitive touch pad is greater than or equal to the touch-in threshold $TH_{TOUCH-IN}$ at 1218, the control circuit may place the capacitive touch pad in an active state, and the procedure 1200 may exit.

When the present capacitive touch pad is in the active state at 1214, the control circuit may execute a touch-out procedure for the present capacitive touch pad at 1222. For example, the control circuit may execute the touch-out procedure for the present capacitive touch pad to determine a number $N_{TOUCH-OUT}$ of times that the change $\Delta_{CAP}$ in the count for the present capacitive touch pad has not exceeded the capacitance-change threshold $TH_{CAP}$. For example, the control circuit may determine the number $N_{TOUCH-OUT}$ of times that the change $\Delta_{CAP}$ in the count is less than (e.g., not exceeding) the capacitance-change threshold $TH_{CAP}$ for the present capacitive touch pad. Further, in some examples, while performing the touch-out procedure, the control circuit may continue to compare the change $\Delta_{CAP}$ to the high-voltage capacitance-change threshold $TH_{CAP-HV}$, and exit the procedure 1100 if the change $\Delta_{CAP}$ exceeds the high-voltage capacitance-change threshold $TH_{CAP-HV}$.

At 1224, the control circuit may determine whether the number $N_{TOUCH-OUT}$ determined at 1222 exceeds a touch-out threshold $TH_{TOUCH-OUT}$ for the present capacitive touch pad. If the control circuit determines that the number $N_{TOUCH-OUT}$ for a present capacitive touch pad is greater than or equal to the touch-out threshold $TH_{TOUCH-OUT}$, the control circuit may remove the capacitive touch pad from the active state at 1228. However, if the control circuit determines that the number $N_{TOUCH-OUT}$ for the capacitive touch pad is less than the touch-out threshold $TH_{TOUCH-OUT}$ at 1224, the present capacitive touch pad may stay in the active state and the procedure 1200 may exit. As noted above, the control circuit may repeat the procedure 1200 for each of the capacitive touch pads of the touch sensitive device, for example, to determine and/or change the state of each of the capacitive touch pads.

It should be appreciated that any combination of the dimmer control circuit and/or the user interface control circuit may perform the procedure 500, the procedure 600, the procedure 700, the procedure 800, the procedure 900, the procedure 1000, the procedure 1100, and/or the procedure 1200. Further, although described with reference to the control circuit of the touch sensitive device, in some examples, the control circuit of the control device (e.g., the control circuit 314, the control circuit 1310, etc.) may perform the procedure 400 and/or 450. Finally, it should be appreciated that many of the procedures described herein can be performed in combination with one another.

The invention claimed is:

1. A control device configured to control an electrical load, the control device comprising:
   an actuation member having a front surface that comprises a touch sensitive surface along at least a portion of the front surface;
   a plurality of capacitive touch pads located adjacent to the touch sensitive surface; and
   a control circuit configured to:
   detect a touch actuation on the touch sensitive surface;
      determine a position of the touch actuation on the touch sensitive surface; and
   control the electrical load in response to the detection of the touch actuation and the determination of the position of the touch actuation;
   wherein the control circuit is configured to operate in an inactive touch mode and an active touch mode;
      wherein, when the control circuit is in the inactive touch mode, the control circuit is configured to detect the touch actuation when the touch actuation has at least a first duration and switch from the inactive touch mode to the active touch mode in response to detecting that the touch actuation has the first duration; and
   wherein, when the control circuit is in the active touch mode, the control circuit is configured to detect the touch actuation when the touch actuation has at least a second duration, wherein the second duration is shorter than the first duration.

2. The control device of claim 1, wherein, when the control circuit is in the inactive touch mode, the control circuit is configured to determine that the touch of the second duration and less than the first duration is not a touch actuation that the control circuit uses to control the electrical load.

3. The control device of claim 1, wherein the control circuit is configured to operate in the active touch mode in response to at least one of the plurality of capacitive touch pads being in an active state, and the control circuit is configured to operate in the inactive touch mode in response to all of the plurality of capacitive touch pads being in an inactive state.

4. The control device of claim 3, wherein the control circuit is configured to place a capacitive touch pad of the plurality of capacitive touch pads is in the active state when an indication of a capacitance of the capacitive touch pad exceeds a threshold; and
   wherein the control circuit is configured to place the capacitive touch pad to in the inactive state when the indication of the capacitance of the capacitive touch pad does not exceed the threshold.

5. The control device of claim 1, wherein the control circuit is configured to change from the inactive touch mode to the active touch mode based on a reception of a signal from a capacitive touch pad of the plurality of capacitive touch pads that indicates a change in the capacitance of the capacitive touch pad.

6. The control device of claim 1, wherein the control circuit is configured to be less responsive to inadvertent touch events caused by transient noise when operating in the inactive touch mode as compared to when operating in the active touch mode.

7. The control device of claim 1, wherein the control circuit is configured to:

use a filtering technique with a first variable for the touch sensitive device for detecting the touch actuation when the control circuit is in the inactive touch mode;
detect the touch actuation when the touch actuation has at least the first duration when the control circuit is using the filtering technique with the first variable;
use the filtering technique with a second variable for the touch sensitive device for detecting the touch actuation when the control circuit is in the active touch mode; and
detect the touch actuation when the touch actuation has at least the second duration when the control circuit is using the filtering technique with the second variable.

8. The control device of claim 7, wherein the control circuit is configured to determine a change in the position of the touch actuation along the touch sensitive surface when using the using the filtering technique with the second variable in the active touch mode.

9. The control device of claim 8, wherein the control circuit is configured to provide a quicker response time to control an amount of power delivered to the electrical load in response to the change in the position of the touch actuation when using the filtering technique with the second variable as compared to when using the filtering technique with the first variable.

10. The control device of claim 8, wherein the control circuit is configured to:
determine that the change in position of the touch actuation along the touch sensitive surface exceeds a threshold when operating in the active mode;
generate an output signal using a heavy filtering technique when the change in positions of touch actuations does not exceed the threshold, the output signal indicating a position of the touch actuation along the touch sensitive surface; and
generate the output signal using a light filtering technique when the change in positions of touch actuations exceeds the threshold.

11. The control device of claim 7, wherein the filtering technique is a debouncing algorithm, the first variable is a first debounce time and the second variable is a second debounce time, and wherein the second debounce time is longer than the first debounce time.

12. The control device of claim 1, wherein the control circuit is configured to use a debouncing algorithm with a first debounce time when in the inactive mode to detect the touch actuation when the touch actuation has at least the first duration, and use the debouncing algorithm with a second debounce time when in the active mode to detect the touch actuation when the touch actuation has the second duration, wherein the second debounce time is shorter than the first debounce time.

13. The control device of claim 1, wherein the control circuit is configured to use a filtering technique with a first time variable when in the inactive mode to detect the touch actuation when the touch actuation has at least the first duration, and use the filtering technique with a second time variable when in the active mode to detect the touch actuation when the touch actuation has the second duration, wherein the second time variable is shorter than the first time variable.

14. The control device of claim 1, further comprising:
a first terminal configured to be coupled to an alternating-current (AC) power source;
a second terminal configured to be coupled to the one or more electrical loads, wherein the one or more electrical loads comprise one or more lighting loads;
a controllably conductive device coupled in series electrical connection between the AC power source and the one or more lighting loads;
a plurality of visual indicators configured to illuminate a light bar to provide feedback indicating the status of the one or more lighting loads; and
a wireless communication circuit configured to transmit and receive radio-frequency (RF) control signals, wherein the control signal comprises control data generated by the control circuit to control the one or more lighting loads.

15. A control device configured to control an electrical load, the control device comprising:
an actuation member having a front surface that includes a touch sensitive surface along at least a portion of the front surface;
a plurality of capacitive touch pads located opposite the front surface of the actuation member and adjacent to the touch sensitive surface; and
a control circuit configured to:
determine that a touch detected by the touch sensitive device is a touch actuation and determine a position of the touch actuation on the touch sensitive surface; and
control the electrical load in response to the touch actuation and the position of the touch actuation;
wherein the control circuit is configured to operate in an inactive touch mode and an active touch mode;
wherein, when the control circuit is in the inactive touch mode, the control circuit is configured to detect the touch actuation when the touch actuation has at least a first duration and switch from the inactive touch mode to the active touch mode in response to detecting that the touch actuation has the first duration; and
wherein, when the control circuit is in the inactive touch mode, the control circuit is configured to determine that the touch of the first duration is not a touch actuation that the control circuit uses to control the electrical load.

16. The control device of claim 15, wherein the control circuit is configured to operate in the active touch mode in response to at least one of the plurality of capacitive touch pads being in an active state, and the control circuit is configured to operate in the inactive touch mode in response to all of the plurality of capacitive touch pads being in an inactive state;
wherein the control circuit is configured to place a capacitive touch pad of the plurality of capacitive touch pads is in the active state when an indication of a capacitance of the capacitive touch pad exceeds a threshold; and
wherein the control circuit is configured to place the capacitive touch pad to in the inactive state when the indication of the capacitance of the capacitive touch pad does not exceed the threshold.

17. The control device of claim 15, wherein the control circuit is configured to change from the inactive touch mode to the active touch mode based on a reception of a signal from a capacitive touch pad of the plurality of capacitive touch pads that indicates a change in the capacitance of the capacitive touch pad.

18. The control device of claim 15, wherein the control circuit is configured to be less responsive to inadvertent touch events caused by transient noise when operating in the inactive touch mode as compared to when operating in the active touch mode.

19. The control device of claim 15, wherein, when the control circuit is in the inactive touch mode, the control circuit is configured to determine that the touch of a second duration is the touch actuation, switch from the inactive touch mode to the active touch mode in response to determining the touch actuation, and control the electrical load based on the touch actuation, wherein the second duration is greater than the first duration.

20. The control device of claim 15, wherein, when the control circuit is in the active touch mode, the control circuit is configured to control an amount of power delivered to the electrical load in response to the touch actuation of the first duration; and wherein, when the control circuit is in the inactive touch mode, the control circuit is configured to not control an amount of power delivered to the electrical load in response to a touch of the first duration.

21. The control device of claim 15, wherein the control circuit is configured to:

use a filtering technique with a first variable for the touch sensitive device for detecting the touch actuation when the control circuit is in the inactive touch mode;

detect the touch actuation when the touch actuation has at least the first duration when the control circuit is using the filtering technique with the first variable;

use the filtering technique with a second variable for the touch sensitive device for detecting the touch actuation when the control circuit is in the active touch mode; and detect the touch actuation when the touch actuation has at least a second duration when the control circuit is using the filtering technique with the second variable, wherein the second duration is greater than the first duration.

22. The control device of claim 21, wherein the control circuit is configured to determine a change in the position of the touch actuation along the touch sensitive surface when using the using the filtering technique with the second variable in the active touch mode.

23. The control device of claim 22, wherein the control circuit is configured to provide a quicker response time to control an amount of power delivered to the electrical load in response to the change in the position of the touch actuation when using the filtering technique with the second variable as compared to when using the filtering technique with the first variable.

24. The control device of claim 22, wherein the control circuit is configured to:

determine that the change in position of the touch actuation along the touch sensitive surface exceeds a threshold when operating in the active mode;

generate an output signal using a heavy filtering technique when the change in positions of touch actuations does not exceed the threshold, the output signal indicating a position of the touch actuation along the touch sensitive surface; and generate the output signal using a light filtering technique when the change in positions of touch actuations exceeds the threshold.

25. The control device of claim 21, wherein the filtering technique is a debouncing algorithm, the first variable is a first debounce time and the second variable is a second debounce time, and wherein the second debounce time is longer than the first debounce time.

26. The control device of claim 15, further comprising:

a first terminal configured to be coupled to an alternating-current (AC) power source;

a second terminal configured to be coupled to the one or more electrical loads, wherein the one or more electrical loads comprise one or more lighting loads;

a controllably conductive device coupled in series electrical connection between the AC power source and the one or more lighting loads;

a plurality of visual indicators configured to illuminate a light bar to provide feedback indicating the status of the one or more lighting loads; and a wireless communication circuit configured to transmit and receive radio-frequency (RF) control signals, wherein the control signal comprises control data generated by the control circuit to control the one or more lighting loads.

\* \* \* \* \*